US006605542B2

United States Patent
Seta et al.

(10) Patent No.: US 6,605,542 B2
(45) Date of Patent: *Aug. 12, 2003

(54) MANUFACTURING METHOD OF SEMICONDUCTOR DEVICES BY USING DRY ETCHING TECHNOLOGY

(75) Inventors: Shoji Seta, Yokohama (JP); Makoto Sekine, Yokohama (JP); Naofumi Nakamura, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/995,839

(22) Filed: Nov. 29, 2001

(65) Prior Publication Data

US 2002/0059899 A1 May 23, 2002

Related U.S. Application Data

(63) Continuation of application No. 09/522,175, filed on Mar. 9, 2000, now Pat. No. 6,352,931.

(30) Foreign Application Priority Data

Mar. 12, 1999 (JP) .......................................... 11-066293

(51) Int. Cl.$^7$ .......................................... H01L 21/391
(52) U.S. Cl. ...................... 438/700; 438/706; 438/725; 438/778; 438/780
(58) Field of Search ................................. 438/623, 631, 438/700, 706, 712, 725, 778, 779, 780

(56) References Cited

U.S. PATENT DOCUMENTS

| 5,898,806 | A | | 4/1999 | Nishimoto .................... 385/49 |
|---|---|---|---|---|
| 5,962,581 | A | | 10/1999 | Hayase et al. ............... 524/588 |
| 5,985,513 | A | | 11/1999 | Kani et al. ................... 430/270 |
| 5,989,998 | A | | 11/1999 | Sugahara et al. ........... 438/743 |
| 6,025,117 | A | | 2/2000 | Nakano et al. ................ 216/99 |
| 6,037,278 | A | * | 3/2000 | Koyanagi et al. ............ 438/787 |
| 6,054,379 | A | * | 4/2000 | Yau et al. .................... 438/623 |
| 6,218,299 | B1 | * | 4/2001 | Akahori et al. ............. 438/682 |
| 6,352,931 | B1 | * | 3/2002 | Seta et al. ................... 438/700 |

FOREIGN PATENT DOCUMENTS

| JP | 7-94477 | 4/1995 |
|---|---|---|
| JP | 9-172009 | 6/1997 |
| JP | 9-232428 | 9/1997 |

* cited by examiner

Primary Examiner—Benjamin L. Utech
Assistant Examiner—Duy-vu Deo
(74) Attorney, Agent, or Firm—Finnegan, Henderson, Farabow, Garrett & Dunner, L.L.P.

(57) ABSTRACT

There is provided a method of forming an interlayer insulating film having a dual-damascene structure, a contact hole and a deep trench mask using an organic silicon film. The shape of polysilane or the like is processed so that polysilane is used as an interlayer insulating film having a dual-damascene structure to control the shape and depth and prevent borderless etching which must be solved when a trench is formed. Polysilane and an insulating film are formed into a laminated structure so as to be integrated with each other after a dry etching step has been completed to easily form a contact hole having a high aspect ratio. The surface of polysilane is selectively formed into an insulating film so as to be used as a mask for use in a dry etching step. Polysilane for use as an anti-reflective film or an etching mask is changed to an oxide film or a nitride film so that films are easily removed. Hence it follows that a device region and a device isolation region of a densely integrated circuit can be smoothed, a self-aligned contact hole and metallization trench can be formed with a satisfactory manufacturing yield and the pattern of a gate electrode can be formed.

21 Claims, 20 Drawing Sheets

(N₂ ASHING)

(O₂ ASHING)

MANUFACTURING METHOD OF SEMICONDUCTOR DEVICES BY USING DRY ETCHING TECHNOLOGY

This is a continuation of application Ser. No. 09/522,175, filed Mar. 9, 2000 now U.S. Pat. No. 6,352,931, which is incorporated herein by reference.

BACKGROUND OF THE INVENTION

The present invention relates to a manufacturing method of semiconductor devices by using a dry etching technology. More particularly, the present invention relates to a method of forming an interlayer insulating film of a dual trench metallization using an organic silicon film such as polysilane, a method of forming a contact hole and a trench, a method of forming a deep trench and a method of removing an anti-reflection film.

When a process for manufacturing semiconductor devices each having a multilayered metallization is performed, a step is frequently employed whereby the pattern of a contact hole or the like is formed on a multilayered insulating film constituted by, for example, a silicon oxide film, silicon nitride film and the like, such that a resist serves as a mask.

Hitherto, when a selective etching step of the silicon oxide film and the silicon nitride film is performed by using dry etching technology such as reactive ion etching (RIE), the selective ratio (the ratio of etching speeds) between the resist and the silicon nitride film can be raised. The selective etching can easily be performed. Since the etching selective ratio between the resist and the silicon nitride film cannot be raised, selective etching of the silicon nitride film using the resist as a mask cannot easily be performed.

In recent years, the integration of miniature trench capacitors at a high density has been required to manufacture large scale semiconductor memory devices. Therefore, formation of trenches each having a great depth compared to the size of the opening portion (hereinafter called a "high aspect ratio") on a semiconductor substrate by using the anisotropic dry etching is one of the important techniques.

When the trenches each having a high aspect ratio are formed on a semiconductor substrate, opening portions each having a high aspect ratio must be formed in an insulating film mask by using anisotropic dry etching. Hitherto, a resist mask has been employed to form the opening portions in the insulating film mask. To form opening portions each having a high aspect ratio, gas plasma excited by high power and high frequency radiation must be applied to the resist for a long time.

This leads to a fact that the opening portions in the resist are unevenly deformed. Therefore, a multiplicity of trenches each having a smooth inner surface and exhibiting satisfactory accuracy cannot easily be formed with a high yield in the semiconductor substrate.

As microfabrication technology progresses, the thickness of the resist must be reduced to raise the resolution of lithography. Since so-called film thinning occurs when the dry etching is performed, the trenches cannot easily be formed.

A common method of manufacturing semiconductor devices incorporates a smoothing process having the steps of forming isolation trenches for isolating devices from one another by using a silicon nitride film, the pattern of which has been formed on a semiconductor substrate as an etching mask, forming a thick silicon oxide film for isolating the devices from each other such that the isolation trenches are buried, and polishing the surface such that the silicon nitride film serves as a stopper (a suppression layer) so that the isolation trenches are buried with the oxide film and the device region is smoothed.

Where a multiplicity of silicon nitride film stoppers present in portions of high density device regions, the process for smoothing the device region using polishing of the surface enables satisfactory smoothing of the surface such that the isolation trenches are filled with the silicon oxide film. In the portions of low density device regions, the number of silicon nitride film stoppers is insufficiently small. Thus, the silicon oxide film is excessively polished in the smoothing process. As a result, there arises a problem in that smoothing and formation of the device regions cannot be performed uniformly over the overall surface of the wafer.

Therefore, a countermeasure is taken whereby a polysilicon film is deposited on the overall surface, and then a smoothing process is performed and the polysilicon film, as the etching mask, is left in the low density portion. The smoothing step, however, sometimes encounters a crack in the silicon oxide film in the low density portion. When the silicon nitride film stoppers on the device region and the polysilicon mask are removed, there arises a problem in that the silicon substrate is scooped out excessively.

Hitherto, a gate electrode has been formed by a method comprising the steps of forming a silicon nitride film on a metallic film for forming the gate electrode, forming a resist in a gate electrode formation region on the silicon nitride film, using the resist as a mask to form a nitride film, and using the silicon nitride film having a pattern formed after the resist mask has been separated to machine the metallic film as the gate electrode.

If the surface of the wafer has an uneven portion, the projecting portions of the surface of the wafer are excessively etched when the pattern of the silicon nitride film is formed. As a result, the metallic film formed below the pattern is undesirably etched, causing a problem to arise in that a gate electrode formation cannot be satisfactorily performed.

When an etching process is performed to form a self-aligned contact (hereinafter abbreviated as a "SAC"), an opening of a contact hole is created in an interlayer insulating film for burying the space between the gate electrode. At this time, an edge line along which the upper surface and the side surface of the gate electrode intersect is exposed in the lower portion of the opening of the contact hole.

Undesirable etching of the gate electrode must be prevented during the etching process for opening the contact hole in the interlayer insulating film constituted by the silicon oxide film. Therefore, the gate electrode is usually coated with a silicon nitride film (an etching stopper) which has a high etching selective ratio with respect to the silicon oxide film. Although a satisfactory high etching selective ratio of the silicon nitride film with respect to the oxide film can be obtained in a flat portion, the etching selective ratio is lowered to about ⅓ or less of the flat portion in the edge line portion.

Therefore, the edge line portion of the gate electrode is undesirably etched when the contact hole is opened in the SAC formation step. Thus, the gate metal is exposed to the outside, causing a short-circuit fault to occur when the metallization metal is buried in the contact hole. As a result, it is known that the SAC cannot easily be formed in the process for manufacturing $E^2$ PROM in which the gate electrode has a high aspect ratio (the ratio of the length of the gate and the height of the gate).

Since microfabrication technology has proceeded in recent years, etching of the interlayer insulating film at a high aspect ratio is frequently required. It is known that when dry etching of the silicon oxide film at a high aspect ratio is performed under the condition where a high etching selective ratio with respect to the silicon nitride film is permitted, residues such as fluorocarbon are left in the opening portion during the progress of the etching operation. Thus, etching is interrupted.

As a technology for forming a multilayered metallization, double-trench metallization (called a "dual-damascene structure" in this industrial field) is employed frequently. When fabrication of the interlayer insulating film having the dual-damascene structure is performed, miniaturized dry etching process technology is required which is a combination of trench formation for burying two layered metallizations and contact hole formation for connecting the two layered metallizations to each other.

Hitherto, it is very difficult to control the depth of the trenches in the surface of the wafer when the trenches are formed in the interlayer insulating film. To realize the control, a method has been employed with which a silicon nitride film is inserted into the interlayer insulating film constituted by the silicon oxide film, so that the silicon nitride film is used as the stopper for the dry etching. When the dual-damascene structure having a complicated shape is formed, the stopper constituted by the silicon nitride film is required to control the depth of the trench metallization of the upper layer after the contact hole has been formed.

In the foregoing case, the silicon nitride film, which has a dielectric constant higher than that of the silicon oxide film, is contained adjacent to the metallization. Therefore, the wiring capacitance is enlarged excessively, causing the operation speed of the semiconductor device to be reduced. When the trenches are formed, partial etching of the interlayer insulating film constituted by the silicon oxide film occurs. Thus, ions are concentrated in the bottom corners of each trench, causing a shape called "trenching" to be formed in the corners of each trench. Therefore, the wiring metal cannot be easily buried in the trench.

Hitherto, an LSI of a type having a mixed structure so that a DRAM (Dynamic Random Access Memory) and a logic are mounted on one chip is structured such that the alignment margin (a fringe) in the logic portion is about ¼ of the opening portion of the alignment margin in the DRAM, owing to the difference in the design rule between the DRAM section and the logic section.

In an example case in which a contact hole is formed in an interlayer insulating film having the dual-damascene structure, the following step is employed: a dry etching condition where a high selectivity with respect to the etching stopper constituted by the silicon nitride film on the lower trench metallization is used to form the contact hole in the interlayer insulating film constituted by the silicon oxide film. Then, the silicon nitride film is removed, and then the wiring metal is buried in the contact hole and trenches of the upper metallization.

In the logic section, having a small alignment margin, a portion of the opening of the contact hole is sometimes deviated to the outside of the stopper constituted by the silicon nitride film which covers the lower trench metallization. Therefore, the interlayer insulating film constituted by the silicon oxide film which buries the side surface of the lower trench metallization easily encounters borderless etching that is cut during the step of forming the contact hole. Therefore, there arises a problem in that a fault in burring and a short-circuit fault of the wiring metal occur.

Hitherto, polysilane anti-reflective film is formed below the resist in the lithography step. When the resist is removed by performing $O_2$ ashing after the pattern has been formed, a phenomenon undesirably occurs in that polysilane is oxidized. Thus, oxidized polysilane cannot easily be removed.

BRIEF SUMMARY OF THE INVENTION

As described above, the conventional manufacturing method of semiconductor devices by using dry etching technology suffers from problems that etching at a high aspect ratio cannot easily be performed, smoothing of the overall surface of the wafer cannot easily be performed when the device region has some deviation in density of devices, the surface roughness causes defective fabrication when a miniaturized gate electrode is formed and short-circuit fault easily occurs in the edge line portion of the gate electrode when the SAC hole is formed.

Moreover, there arises a problem in that etching is interrupted owing to residues produced in the dry etching step when etching of an interlayer insulating film at a high aspect ratio is performed. Another problem arises in that a necessity for stacking a silicon nitride film to serve as an etching stopper to make the depths of the formed trenches uniform and to prevent borderless etching reduces the operation speed of the semiconductor device. In addition, trenching occurring when the trenches are formed causes a fault in burying of the wiring metal. Since the alignment margin in the logic section is too small, borderless etching easily occurs when a mixed memory logic LSI is manufactured. Another problem arises in that polysilane used to form the reflection preventing film for the resist cannot easily be removed. Thus, the conventional manufacturing method of semiconductor devices by using dry etching technology suffers from a multiplicity of problems.

To overcome the above-mentioned problems, an object of the present invention is to provide a method of forming a multilayered insulating film by using an organic polysilicon film made of, for example, polysilane, a removing method and a method of forming an etching mask.

The manufacturing method of semiconductor devices by using dry etching technology uses an organic silicon film made of, for example, polysilane, which is able to easily form a smooth surface by a coating process and which can easily be dry-etched and smoothed. The organic silicon film is laminated with an insulating film such as a silicon oxide film or a silicon nitride film, a metallic film for use in metallization or the like. Alternatively, the organic silicon film is formed on a semiconductor substrate such that the organic silicon film forms a portion of the foregoing element. While using the obtained structure as a suppression layer or the like for improving the processing shape of the insulating film portion, the organic silicon film is microfabricated. Thus, a portion comprising an interlayer insulating film having a complicated dual-damascene structure is formed. Then, for example, oxygen is introduced into the organic silicon film so as to change the organic silicon film into an insulating film constituted by an organic silicon film oxide film and the like. Thus, a required constituting element of a semiconductor device is provided.

For example, some of the organic silicon film, which has the silicon and silicon bonds as the main chain thereof, has anti-reflective property. The organic silicon film cannot be used, as it is, as an insulating film of a semiconductor device. When a step of introducing oxygen or the like is performed, such organic silicon film can be employed as the insulating film of the semiconductor device.

As described above, according to the present invention, control of the shape and the depth of the metallization trench, formation of a contact hole having a high aspect ratio, prevention of borderless etching and improvement of problems occurring in a smoothing step, which have been difficult for the conventional dry etching step, can be performed. Moreover, a new method of removing polysilane employed as an anti-reflective film is provided.

Specifically, a manufacturing method of semiconductor devices by using dry etching technology according to the present invention comprising the steps of: forming a organic silicon film on a semiconductor substrate, dry-etching the organic silicon film to form a portion that must be formed by the insulating film of the semiconductor device by using the organic silicon film, and changing the organic silicon film into an insulating film so that the portion of the semiconductor device constituted by the insulating film is formed.

It is preferable that the organic silicon film has silicon and silicon bonding as a main chain thereof It is preferable that the method of manufacturing semiconductor devices has a structure that at least any one of oxygen, nitrogen, hydrogen and carbon elements is introduced into the organic silicon film following dry etching of the organic silicon film so that the organic silicon film is changed to any one of organic silicon oxide film, an inorganic silicon oxide film, a silicon oxide film and a silicon nitride film.

It is preferable that the step of introducing at least any one of oxygen, nitrogen, hydrogen and carbon elements into the organic silicon film is performed by using any one of a RIE method, an ashing method and an ion implanting method using ions of the elements or a mixture of the elements.

It is preferable that the step of introducing at least any one of oxygen, nitrogen, hydrogen and carbon elements into the organic silicon film is performed by performing heat treatment in a gas atmosphere composed of the element or a mixture of the elements.

It is preferable that the portion constituted by the insulating film of the semiconductor device is formed by at least any one of an interlayer insulating film between the surface of the semiconductor substrate and a lower metallization layer of a dual-damascene structure, an insulating film for burying the space between wiring metals formed in each metallization layer of the dual-damascene structure and an interlayer insulating film between upper and lower metallization layers of the dual-damascene structure.

It is preferable that the organic silicon film is laminated on the insulating film and the dry etching of the organic silicon film is performed such that the insulating film is employed as a suppression layer of the dry etching.

It is preferable that the portion constituted by the insulating film of the semiconductor device is formed by an interlayer insulating film including a contact hole of the dual-damascene structure formed on the semiconductor substrate and a trench in each of the upper and lower metallization layers of the dual-damascene structure.

It is preferable that the step of forming the contact hole incorporates the steps of: coating the overall upper surface of the lower metallization layer with the organic silicon film; providing the contact hole which reaches the upper surface of the wiring metal in the lower metallization layer for the organic silicon film by selectively dry-etching the organic silicon film; and changing the organic silicon film in which the contact hole has been formed into any one of an organic silicon oxide film, an inorganic silicon oxide film, a silicon oxide film, and a silicon nitride film.

It is preferable that the lower metallization layer is constituted by a trench metallization buried in the insulating film of the semiconductor substrate, and the upper surface of the insulating film suppresses borderless etching when the contact hole is formed.

It is preferable that the step of forming the trench includes the steps of: coating the overall upper surface of the insulating film on the semiconductor substrate with the organic silicon film; removing the portion of the organic silicon film in which the trench has been formed by selectively dry-etching the organic silicon film; and changing the organic silicon film subjected to the removal step into an insulating film constituted by any one of an organic silicon oxide film, an inorganic silicon oxide film, a silicon oxide film and a silicon nitride film.

It is preferable that the step of forming the interlayer insulating film includes the steps of: forming the contact hole in the insulating film on the semiconductor substrate; coating the overall surface of the insulating film with the organic silicon film such that the contact hole is buried; removing a portion of the upper metallization layer including an opening portion of the contact hole in which the trench has been formed and the organic silicon film in the contact hole by selectively dry-etching the organic silicon film; and changing the organic silicon film subjected to the removal step into an insulating film constituted by any one of an organic silicon oxide film, an inorganic silicon oxide film, a silicon oxide film and a silicon nitride film.

It is preferable that the manufacturing method of semiconductor devices has a structure that the step of removing the organic silicon film is performed such that the upper surface of the insulating film on the semiconductor substrate controls the dry etching so that the organic silicon film is selectively etched.

It is preferable that the step of forming the interlayer insulating film includes a step of coating the overall upper surface of a first insulating film on the semiconductor substrate on which the lower metallization layer has been formed with the organic silicon film, a first selective dry etching step of forming a contact hole which reaches the upper surface of the metallization of the lower metallization layer, a step of changing the organic silicon film having the contact hole into a second insulating film constituted by any one of an organic silicon oxide film, an inorganic silicon oxide film, a silicon oxide film and a silicon nitride film, a step of coating the overall upper surface of the second insulating film with the organic silicon film, a second selective dry etching step of forming a trench in the upper metallization layer connected to the contact hole formed on the second insulating film by removing the organic silicon film in the portion of the upper metallization layer including the opening portion of the contact hole on which the trench has been formed and the inside portion of the contact hole, and a step of changing the organic silicon film having the trench in the upper metallization layer into a third insulating film constituted by any one of an organic silicon oxide film, an inorganic silicon oxide film, a silicon oxide film and a silicon nitride film.

It is preferable that the manufacturing method of semiconductor devices has a structure that the first insulating film suppresses borderless etching occurring in the periphery of the lower metallization layer in the first dry etching step, and the second insulating film controls the second selective dry etching step of forming the trench in the upper metallization layer.

It is preferable that the step of forming the interlayer insulating film includes the steps of: forming any one of a first organic silicon oxide film, an inorganic silicon oxide film and a silicon oxide film on the insulating film on the semiconductor substrate on which the lower metallization layer has been formed; forming a stopper for dry etching constituted by an organic silicon film on any one of the first organic silicon oxide film, the inorganic silicon oxide film or the silicon oxide film; providing an opening portion for forming the contact hole which reaches the lower metallization layer for the stopper; forming any one of a second organic silicon oxide film, an inorganic silicon oxide film or a silicon oxide film such that the stopper having the opening portion is buried; forming an etching mask for forming a trench of the metallization layer to correspond to the opening portion; and continuously and selectively dry-etching any one of the first and second organic silicon oxide film, the incorporate silicon oxide film or the silicon oxide film by using the etching mask and the stopper having the opening portion.

It is preferable that a step is included in which the stopper for dry etching constituted by the organic silicon film is subjected to the step of continuously and selectively dry-etching the first and second organic silicon oxide film, the inorganic silicon oxide film or the silicon oxide film and changed into an organic silicon oxide film so as to be integrated as a portion of the interlayer insulating film.

The manufacturing method of semiconductor devices by using dry etching technology according to the present invention comprises the steps of: forming an organic silicon film having bondings of silicon and silicon as the main chains thereof on a semiconductor substrate and selectively introducing any one of oxygen, nitrogen, hydrogen and carbon elements into at least the surface of the organic silicon film; forming a portion of the semiconductor device constituted by insulating material by performing selective dry etching such that the surface of the organic silicon film is used as a mask; and introducing at least any one of oxygen, nitrogen, hydrogen and carbon elements into the organic silicon film after the organic silicon film has been dry-etched to integrate both of the surface of the organic silicon film and the inside portion of the organic silicon film as any one of an organic silicon oxide film, an inorganic silicon oxide film, a silicon oxide film and a silicon nitride film.

It is preferable that the manufacturing method of semiconductor devices is structured to perform selective dry etching such that the surface of the organic silicon film is used as a mask to process the edge in the periphery of the opening portion of the mask to be rounded.

The manufacturing method of semiconductor devices by using dry etching technology according to the present invention comprises the steps of: forming an organic silicon film having bondings of silicon and silicon as the main chains thereof on a semiconductor substrate and selectively introducing any one of oxygen, nitrogen, hydrogen and carbon elements into at least the surface of the organic silicon film; forming a portion of the semiconductor device constituted by insulating material by performing selective dry etching such that the surface of the organic silicon film is used as a mask; introducing at least any one of oxygen, nitrogen, hydrogen and carbon elements into the organic silicon film after the organic silicon film has been dry-etched to make the surface of the organic silicon film and the inside portion of the organic silicon film to be constituted by different type films which are an organic silicon oxide film, an inorganic silicon oxide film, a silicon oxide film and a silicon nitride film; and removing the mask by performing selective etching of the surface of the organic silicon film and the inside portion of the organic silicon film.

The manufacturing method of semiconductor devices by using dry etching technology according to the present invention comprises the steps of: using an organic silicon film to form an anti-reflective film for use in a photolithography step on the upper surface of the insulating film on a semiconductor substrate, introducing any one of oxygen, nitrogen, hydrogen and carbon elements into the organic silicon film after the photolithography step has been completed to constitute the anti-reflective film by any one of an organic silicon oxide film, an inorganic silicon oxide film, a silicon oxide film and a silicon nitride film; and integrating the anti-reflective film with the insulating film.

The manufacturing method of semiconductor devices by using dry etching technology according to the present invention comprises the steps of: using an organic silicon film to form an anti-reflective film for use in a photolithography step on the upper surface of the insulating film on a semiconductor substrate; introducing any one of oxygen, nitrogen, hydrogen and carbon elements into the organic silicon film after the photolithography step has been completed to constitute the anti-reflective film by any one of an organic silicon oxide film, an inorganic silicon oxide film, a silicon oxide film and a silicon nitride film; and removing the anti-reflective film by etching by using selective etching of the anti-reflective film and the insulating film subjected to the process.

A manufacturing method of semiconductor devices by using dry etching technology according to the present invention comprises the steps of: forming a thermal oxide film on a semiconductor substrate; forming a silicon oxide film on the organic silicon film by coating the thermal oxide film with an organic silicon film; forming an opening portion which reaches the surface of the semiconductor substrate on a multilayered film constituted by the silicon oxide film and the organic silicon film; changing the organic silicon film to a silicon nitride film by introducing nitrogen into the organic silicon film subjected to the step; and forming a trench on the semiconductor substrate by using a multilayered film constituted by the silicon oxide film and the silicon nitride film as a mask.

A manufacturing method of semiconductor devices by using dry etching technology according to the present invention comprises the steps of: coating a semiconductor substrate with an organic silicon film to form the pattern of the organic silicon film by using a resist as a mask such that a device region on the semiconductor substrate is covered; and forming an isolation trench in the semiconductor substrate by using the organic silicon film, the pattern of which has been formed, and the resist as masks and changing the organic silicon film to a silicon nitride film by introducing nitrogen into the organic silicon film.

It is preferable that the manufacturing method of semiconductor devices comprises the steps of: furthermore coating the overall upper surface of the semiconductor substrate, on which the isolation trench has been formed, with the organic silicon film such that the isolation trench is buried; smoothing the surface of the organic silicon film by using the semiconductor as a suppression layer; and changing the organic silicon film into any one of a silicon oxide film, an organic silicon oxide film and an inorganic silicon oxide film by introducing oxygen into the organic silicon film with which the isolation trench is buried.

A manufacturing method of semiconductor devices by using dry etching technology according to the present invention comprises the steps of: forming a gate insulating film on a semiconductor substrate and forming at least one metallic film on the gate insulating film; forming the pattern of the organic silicon film in a region of the semiconductor substrate which has been covered with the mask and in which the gate electrode has been formed such that a resist is used as a mask; forming the pattern of a gate electrode constituted by the metallic film in the region in which the gate electrode has been formed such that the organic silicon film, the pattern of which has been formed, and the resist are used as masks; and changing the organic silicon film, the pattern of which has been formed, into a nitride film by introducing nitrogen into the organic silicon film.

A manufacturing method of semiconductor devices by using dry etching technology according to the present invention comprises the steps of: forming a gate insulating film on a semiconductor substrate, forming at least one metallic film on the gate electrode insulating film and forming the pattern of a gate electrode constituted by the metallic film on a region of the semiconductor substrate which is covered with the metallic film and in which a gate electrode will be formed; covering the gate electrode with a silicon nitride film and depositing a first insulating film on the overall upper surface of the semiconductor substrate such that the gate electrode is buried; smoothing the surface of the first insulating film and coating the surface of the smoothed first insulating film with an organic silicon film; forming a contact hole which reaches the first insulating film in the organic silicon film by selectively removing the organic silicon film that covers adjacent to the gate electrode where either of a source or a drain will be formed and a portion of the gate electrode adjacent to the source or the drain by performing dry etching using a resist as a mask; a step of exposing the silicon nitride film to the bottom portion of the contact hole by dry-etching the first insulating film by using the resist and the organic silicon film as masks; in a self-aligning manner, exposing the surface of either of region on the surface of the semiconductor substrate in which the source will be formed or a region in which the drain will be formed; and integrating the organic silicon film with the first insulating film and using the contact hole to connect metallizations by changing the organic silicon film into a second insulating film constituted by any one of an organic silicon oxide film, an inorganic silicon oxide film, a silicon oxide film and a silicon nitride film.

A manufacturing method of semiconductor devices by using dry etching technology according to the present invention comprises the steps of: forming a gate insulating film on a semiconductor substrate, forming at least one metallic film on the gate insulating film and forming the pattern of a gate electrode constituted by the metallic film in a region of the semiconductor substrate that is covered with the metallic film and in which the gate electrode will be formed; furthermore covering the first silicon oxide film by covering the gate electrode with a silicon nitride film and depositing the gate electrode on the silicon nitride film; forming a contact hole which reaches the first silicon oxide film in the organic silicon film by coating the overall upper surface of the semiconductor substrate with the organic silicon film and by selectively removing the organic silicon film that covers a region adjacent to the gate electrode in which a source or a drain will be formed and a portion of the gate electrode adjacent to the portion in which the source or the drain will be formed by performing dry etching which uses a resist as a mask; removing the first silicon oxide film exposed to the bottom surface of the contact hole by introducing oxygen into the organic silicon film to change the organic silicon film into a second silicon oxide film and by performing dry etching such that the second silicon oxide film is used as a mask; and in a self-alignment manner, exposing the surface of the region that has been formed on the semiconductor substrate and in which the source or the drain will be formed and using the contact hole for connecting metallizations by further removing the silicon nitride film and gate insulating film exposed owing to removal of the first silicon oxide film.

A dry etching method according to the present invention comprises: a step of forming an organic silicon film having main chains thereof constituted by bondings of silicon and silicon on a semiconductor substrate and forming a portion of the semiconductor device constituted by insulating material dry-etching at least the organic silicon film; and a step of changing a portion of the organic silicon film into an insulating film constituted by any one of an organic silicon oxide film, an inorganic silicon oxide film, a silicon oxide film and a silicon nitride film by processing the processed organic silicon film by executing at least heat treatment which is performed in $O_2$, $N_2$ or $H_2$ gas, heat treatment which is performed in $O_2$, $N_2$ or $H_2$ plasma, or implantation of $O_2$, $N_2$ or $H^2$ ions and heat treatment.

Additional objects and advantages of the invention will be set forth in the description that follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1A:
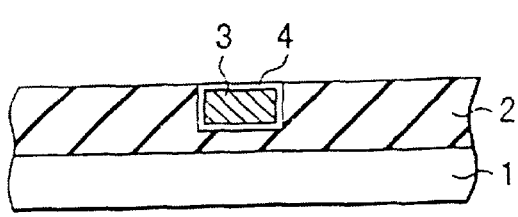
FIGS. 1A to 1F are cross sectional views showing steps of a manufacturing method of semiconductor devices according to a first embodiment.

Referring to the drawings, embodiments of the present invention will now be described. Referring to FIGS. 1A to 1F and FIGS. 2A to 2C, a first embodiment of the present invention will now be described. FIGS. 1A to 1F are diagrams showing the structure of an interlayer insulating film having a contact hole that is required to constitute a dual-damascene structure. FIGS. 2A to 2C are diagrams showing a method of forming the dual-damascene structure by performing dry etching and problems experienced with the method.

The interlayer insulating film for forming the dual-damascene structure is subjected to first trench formation for forming a first trench metallization, second trench formation for forming a second trench metallization and formation of a contact hole for connecting the first and second trench portions to each other.

Figure 2A:
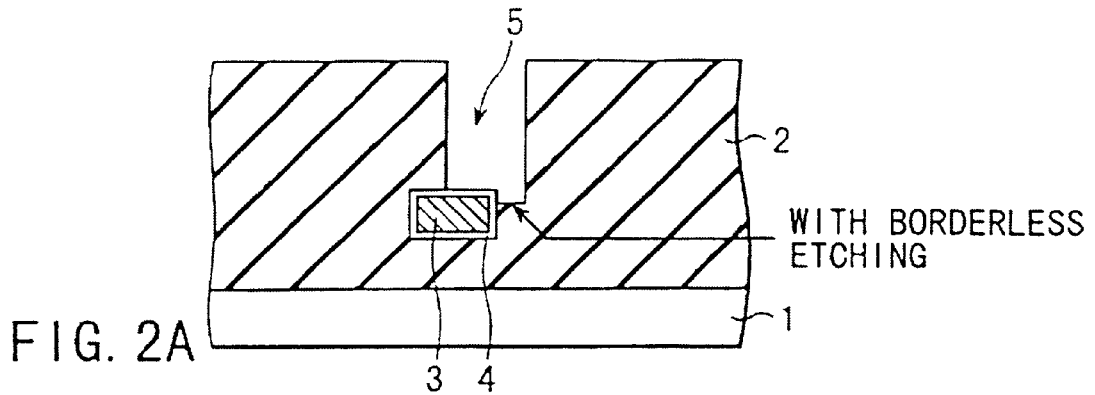
FIGS. 2A to 2C are cross sectional views showing steps for describing effects of a manufacturing method of semiconductor devices according to a first embodiment.
Figure 2B:
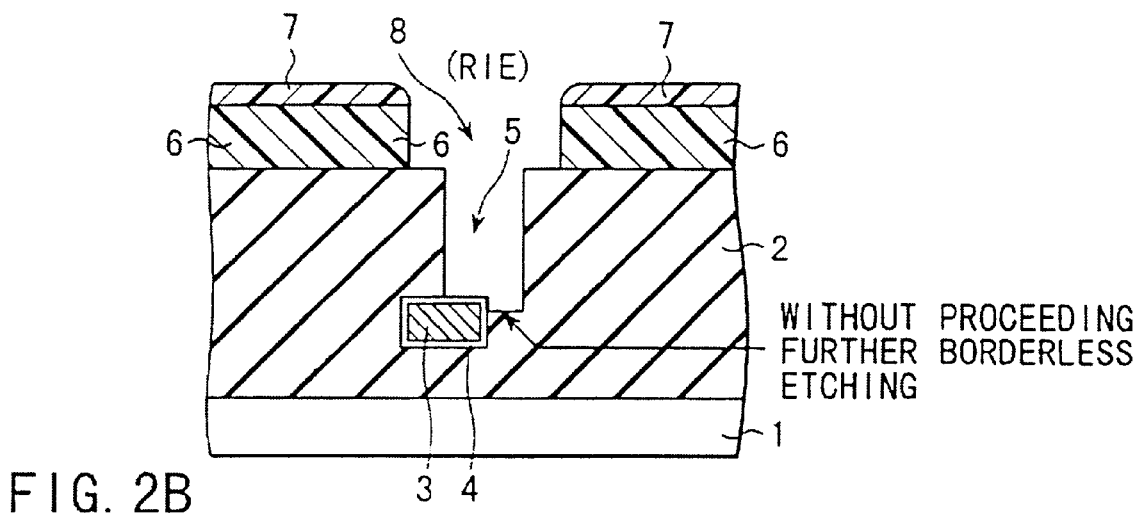
Figure 2C:
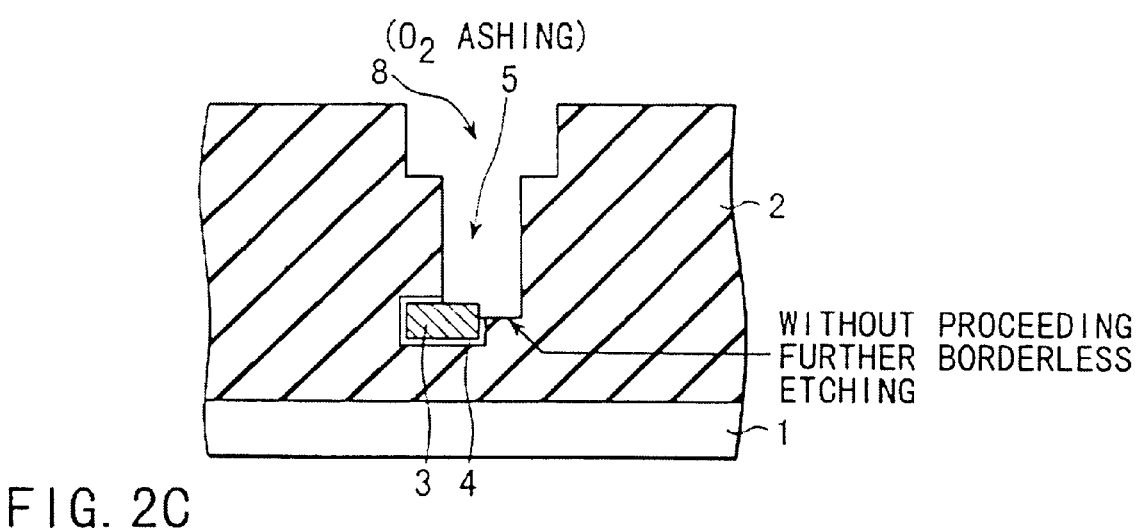

As shown in FIG. 1A, an insulating film 2 is formed on a silicon substrate 1. To bury the first trench formed in the insulating film 2, a wiring metal 3 having the periphery coated with a silicon nitride film 4 is formed. The material of the insulating film 2 is usually a silicon oxide film. The surface of the insulating film 2 is smoothed by CMP by using the silicon nitride film 4 as a stopper (a suppression layer for use in a polishing step). Since the step of forming the trench metallization in the first layer shown in FIG. 1A is not directly related to the first embodiment, the step is omitted from description.

Figure 1D:
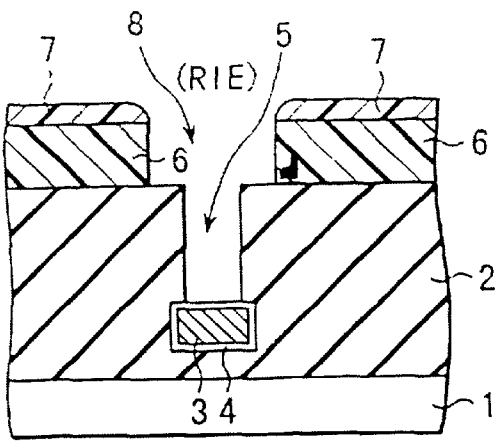
Figure 1B:
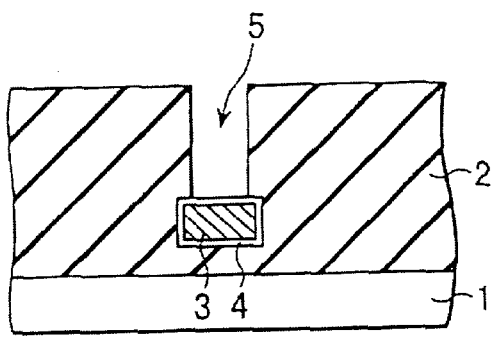

Then, an insulating film made of the same material as that of the smoothed insulating film 2 is stacked on the insulating film 2, as shown in FIG. 1B. Then, anisotropic etching is performed by RIE so that a contact hole 5 is formed. At this time, the silicon nitride film 4 serves as an etching stopper (a suppression layer against etching).

Figure 1E:
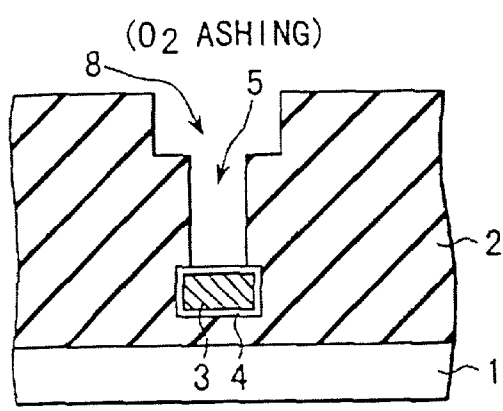
Figure 1C:
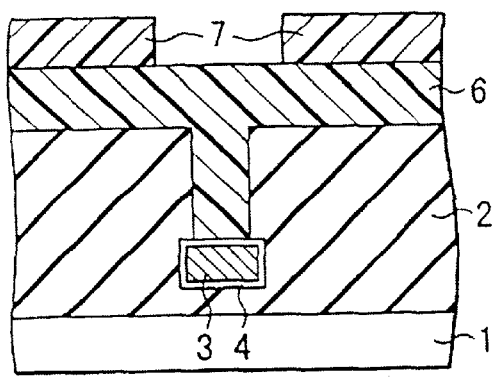

Then, as shown in FIG. 1C, the overall surface is coated with polysilane 6. The thickness of the polysilane 6 is made to be the same as the second trench. Since the polysilane 6 flows, the inside portion of the contact hole 5 is buried with the polysilane 6. Moreover, the surface of the polysilane 6 is sufficiently smoothed in a coating step so that the depth of the second trench is uniformed over the surface of the wafer.

Then, a resist 7 is applied to form the second trench in the polysilane 6. To form the second trench, an opening portion is formed. The resist 7 is used as a mask, the polysilane 6 is anisotropically etched by RIE under condition that the polysilane 6 has a high etching selective ratio with respect to the insulating film 2. Thus, as shown in FIG. 1D, the second trench 8 can be formed by using the insulating film 2 and the silicon nitride film 4 as etching stoppers, the formation being enabled without any exertion of an influence on the shape of the contact hole 5.

The RIE etching conditions were such that the pressure in a chamber was 75 mTor, the high frequency power was 300 W, and flux ratio of mixed gas $Cl_2/O_2$ was 75 sccm/10 sccm. Under the foregoing conditions, a high etching selective ratio of about 100 was realized between the insulating film 2 constituted by a silicon oxide film ($SiO_2$) and the polysilane 6.

The polysilane 6 can easily and precisely be anisotropically etched by the RIE. Moreover, an etching selective ratio of about 50 can be realized with respect to the silicon nitride film 4. Therefore, the polysilane 6 which buries the inside portion of the contact hole 5 can completely be removed such that the silicon nitride film 4 is left.

Then, an $O_2$ ashing step is performed to remove the resist 7. At this time, the trench of the silicon substrate 1 is heated to about 250° C. so that oxygen is introduced into the polysilane 6 via thermal diffusion. Therefore, the polysilane 6 is changed to a silicon oxide film so as to be a portion of the insulating film 2. The silicon oxide film changed from the polysilane 6 has a crystal structure near $SiO_2$ if the degree of oxidation is intense. Also from a viewpoint of electrical properties, the silicon oxide film can be considered as an insulating film constituted by $SiO_2$.

Thus, the polysilane 6 is formed into a portion of the insulating film 2, as shown in FIG. 1E. Thus, the interlayer insulating film 2 having the dual-damascene structure incorporating the contact hole 5 and the second trench 8 can precisely be formed.

Figure 1F:
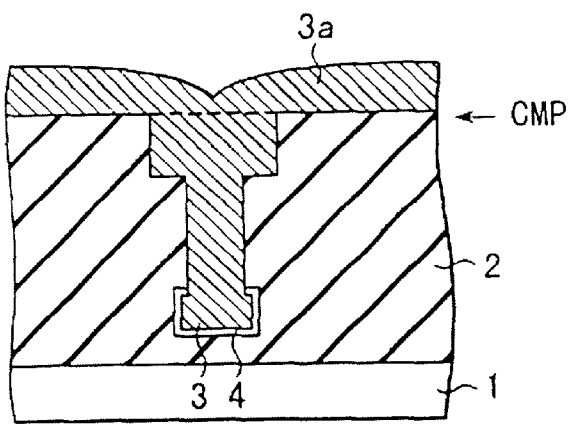

Then, as shown in FIG. 1F, the silicon nitride film 4 covering the upper portion of the wiring metal 3 is removed by the RIE etching conditions with respect to a silicon nitride film. The material of the wiring metal is deposited to bury the contact hole 5 and the second trench 8. The material of the wiring metal may be Al—Cu or Cu. Then, the insulating film 2 is used as a stopper to remove an excess metallization portion 3a by CMP. Thus, an excellent dual-damascene structure having a shape that is controlled precisely can be formed.

Referring to FIGS. 2A to 2C, other important advantages of the method of forming the interlayer insulating film having the dual-damascene structure will now be described. Referring to FIG. 2A, a situation in which misalignment of the etching mask takes place when the contact hole 5 of the insulating film 2 is formed will now be described.

If etching stoppers are unevenly distributed in the plane when the surface of the insulating film made of $SiO_2$ and the like is smoothed by CMP, the overall surface of the wafer cannot uniformly be smoothed.

Therefore, the step of forming the contact hole 5, when allowed to proceed to a state shown in FIG. 2A, encounters a fact that the thickness of the insulating film 2 in a state before the contact hole is formed varies.

To form the contact hole 5, which is able to reliably reach the silicon nitride film 4 that covers the wiring metal 3, in the insulating film thickness variation, excessive anisotropic RIE must be performed to realize a thickness larger than a predetermined thickness by 20% to 30%.

If the etching mask encounters misalignment, the silicon nitride film 4 cannot serve as the etching stopper in the misaligned portion. Therefore, excessive etching occurs as shown in FIG. 2A, causing a fault in wiring. The above-mentioned excessive etching occurring in the bottom of the contact hole is called "borderless etching".

Hitherto, the interlayer insulating film having the dual-damascene structure has been performed such that the thickness of the insulating film 2 is the thickness shown in FIG. 1E. Moreover, the contact hole 5 is formed by anisotropic RIE until the silicon nitride film 4 is exposed to the outside. Then, the second trench 8 is formed by anisotropic RIE.

Therefore, the thickness of the insulating film 2, when the contact hole 5 is formed, is enlarged excessively. Thus, the anisotropic RIE which must be carried out excessively is performed. Since anisotropic RIE is further performed when the second trench 8 is formed, the borderless etching is subjected to two times the anisotropic RIE operations. As a result, the occurrence of borderless etching is a critical problem that must be solved when the step of forming the interlayer insulating film having the dual-damascene structure is performed.

In the first embodiment, the second trench 8 is formed by using the polysilane 6. Therefore, the thickness of the insulating film 2 when the contact hole 5 is formed is small. Hence it follows that borderless etching of the insulating film 2 shown in FIG. 2A can be prevented. Since the insulating film 2 is formed by using the polysilane that can easily be fabricated and a high etching selective ratio is realized with respect to the insulating film 2, there is no apprehension that borderless etching continues during anisotropic RIE for removing the polysilane in the contact hole 5, as shown in FIG. 2B.

Then, as shown in FIG. 2C, $O_2$ ashing is performed to remove the resist 7 and oxidation of the polysilane 6 are simultaneously performed. Then, the wiring metal is buried and smoothing is performed so that dual-damascene structure free of excessive borderless etching is formed.

The organic silicon having the main chains that are the bondings of silicon and silicon cannot be employed as the material of the interlayer insulating film as it is. If $O_2$ is introduced into the material by using a method such as $O_2$ ashing, the organic silicon such as polysilane is changed to an insulating material near $SiO_2$ from electrical and mechanical viewpoints. Therefore, the changed material can be used to form a required interlayer insulating film.

The first embodiment is effective as a method of manufacturing a mixed memory logic LSI incorporating a DRAM section and a logic section as mounted on one chip. Since the alignment margin in the logic section is smaller than that in the memory section as described above, borderless etching easily occurs in the logic section. When the structure according to the first embodiment is employed, the mixed memory logic LSI can be manufactured with a high manufacturing yield.

Figure 3A:
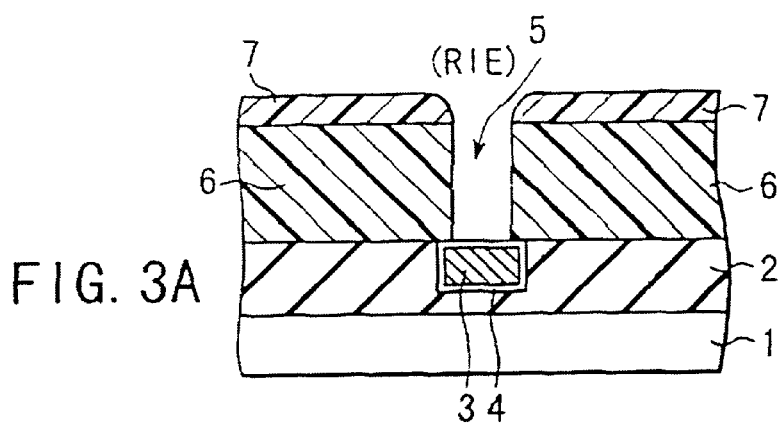
FIGS. 3A and 3B are cross sectional views showing steps of a manufacturing method of semiconductor devices according to a second embodiment.
Figure 3B:
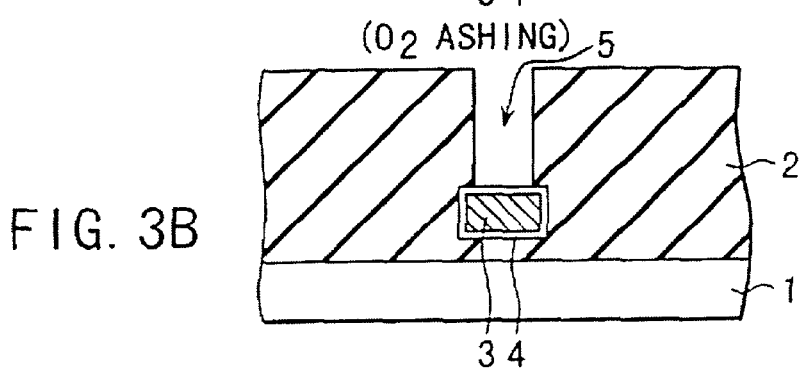

Referring to FIGS. 3A, 3B, 4A and 4B, a second embodiment of the present invention will now be described. As shown in FIG. 3A, a trench metallization in the first layer is formed in the insulating film 2. The silicon nitride film 4 is used as a stopper to perform a smoothing step, and the overall surface is coated with the polysilane 6. The resist 7 and anisotropic RIE are employed to form the contact hole 5 in the polysilane 6. Then, the resist 7 is removed by performing $O_2$ ashing. Simultaneously, the polysilane 6 is changed to the insulating film 2 constituted by the silicon oxide film. Thus, the shape of the insulating film 2 shown in FIG. 1B according to the first embodiment is formed. The foregoing insulating film 2 is used to perform the steps following the step shown in FIG. 1.

Figure 4A:
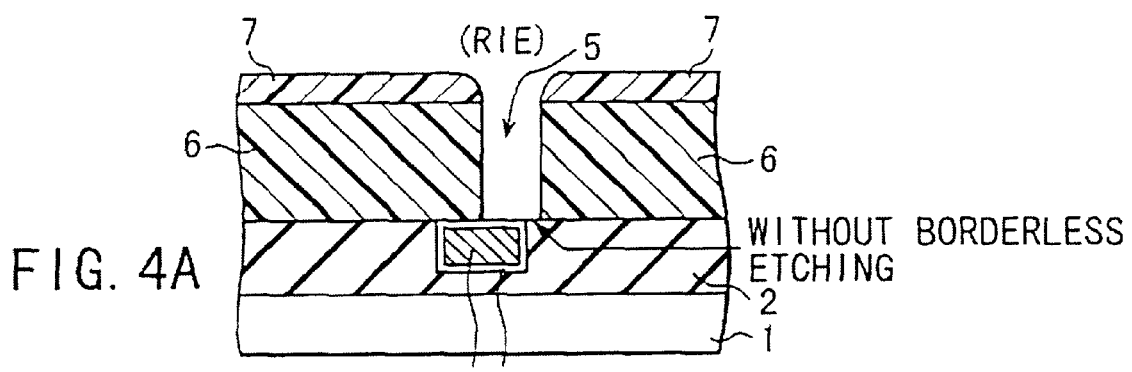
FIGS. 4A and 4B are cross sectional views showing steps for describing effects of the manufacturing method of semiconductor devices according to a second embodiment.
Figure 4B:
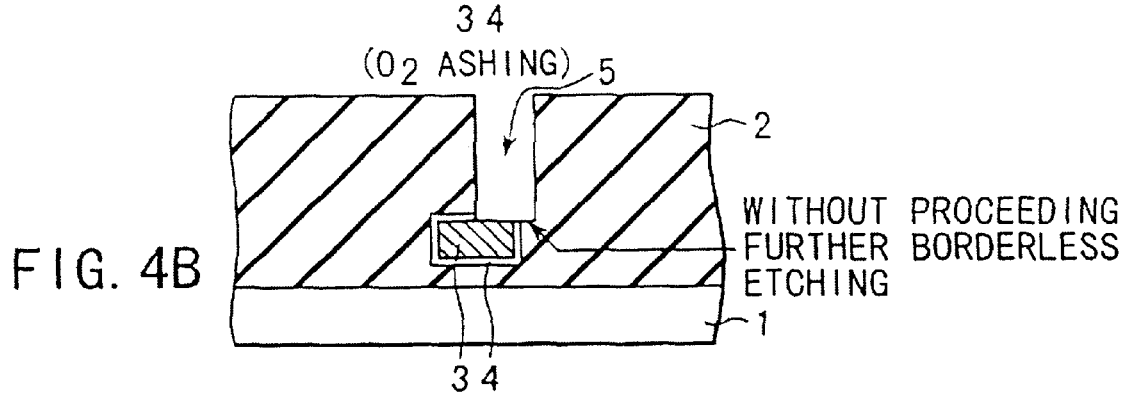

A situation is shown in FIGS. 4A and 4B in which misalignment has occurred when the resist mask 7 for the contact hole 5 is formed by the method according to the second embodiment. In the second embodiment, the contact hole 5 is formed in the polysilane 6 if the misalignment shown in FIG. 4A occurs. Therefore, a satisfactorily high etching selective ratio can be realized with respect to the insulating film 2. Thus, the insulating film 2 serves as the etching stopper so that the controllability of the anisotropic RIE is improved. As a result, borderless etching can be prevented.

Then, as shown in FIG. 4B, the $O_2$ ashing step is performed to remove the resist 7. Simultaneously, the polysilane 6 is changed to the silicon oxide film to make the silicon oxide film to be a portion of the insulating film 2. Then, the silicon nitride film 4 covering the upper portion of the silicon nitride film 4 is removed. As a result, the steps for forming the dual-damascene structure following the step shown in FIG. 2C according to the first embodiment can be employed.

FIG. 4B shows a characteristic that any borderless etching as shown in FIG. 2C does not occur. Although the area of connection between the wiring metal for burying the contact hole 5 and the wiring metal 3 in the first layer is reduced, the defective wiring due to borderless etching can significantly be prevented.

When the structure according to the second embodiment is employed, the deterioration in the manufacturing yield of the logic section of the mixed memory logic LSI owing to the borderless etching can be significantly suppressed.

Although the second embodiment has been described as a method of forming the contact hole 5 having the dual-damascene structure, the present invention is not limited to the foregoing description. The structure may be applied to formation of a contact hole having a usual multilayered metallization.

Referring to FIGS. 5A to 5D, a third embodiment of the present invention will now be described. The third embodiment is different from the second embodiment in the insulating film 2 shown in FIG. 3A is constituted by polysilane 6.

Figure 5A:
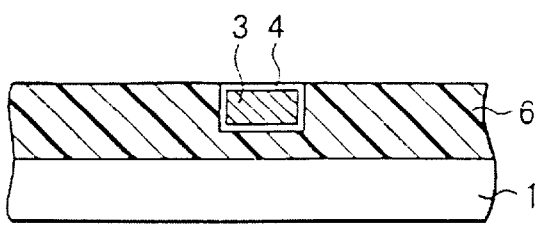
FIGS. 5A to 5D are cross sectional views showing steps of a manufacturing method of semiconductor devices according to a third embodiment.

As shown in FIG. 5A, the silicon substrate 1 is coated with the polysilane 6. Since the silicon substrate 1 has been subjected to a wafer process, a variety of elements of the semiconductor device have been mounted. Therefore, the surface of the silicon substrate 1 usually has complicated step differences.

Since the polysilane 6 flows, the step differences are buried by coating. Moreover, any surface polishing is not required because the overall surface of the wafer has satisfactory flatness to permit execution of the dry etching process.

Then, the resist (not shown) is used as a mask to perform the anisotropic RIE to form the first trench in the polysilane 6. As described above, the polysilane can easily be subjected to anisotropic RIE and the surface of the polysilane is flat. Therefore, any etching stopper is not required to form the first groove having uniform depths, and from a viewpoint of practical use can be formed by only controlling the conditions of the RIE process.

The step of covering the wiring metal 3, the step of burying the silicon nitride film 4 and the step of removing excess wiring metal and silicon nitride film left on the polysilane 6 are combined so that the first trench metallization shown in FIG. 5A is formed.

As shown in FIG. 5A, the polysilane 6 is changed to the silicon oxide film in the step of removing the resist (not shown) for use to form the first trench by $O_2$ ashing. To describe the difference from the second embodiment, the silicon oxide film is illustrated as the polysilane 6.

Figure 5B:
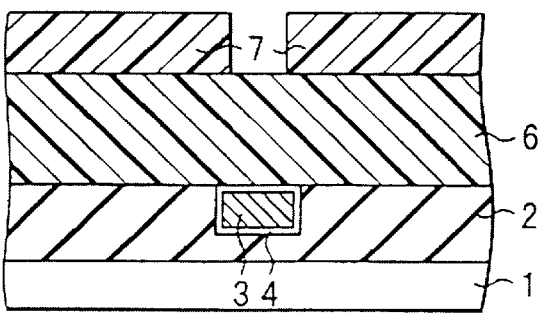

Then, as shown in FIG. 5B, the wiring metal 3 covered with the insulating film 2 constituted by the silicon oxide film and the silicon nitride film 4 is coated with the polysilane 6. Then, the pattern of the resist 7 is formed to align the opening position of the contact hole.

Figure 5C:
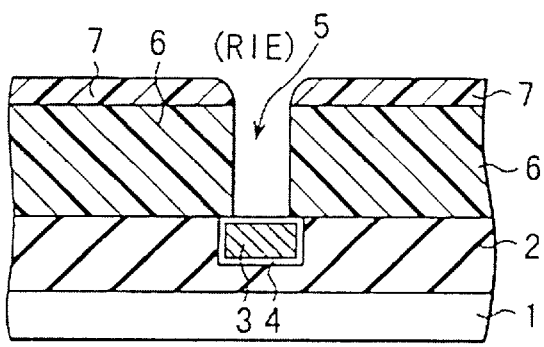
Figure 5D:
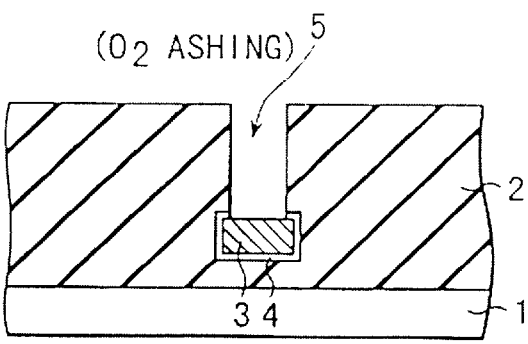

Then, as shown in FIG. 5C, the resist 7 is used as a mask to form the contact hole 5, which reaches the silicon nitride film 4, in the polysilane 6. The resist 7 is removed by $O_2$ ashing. Simultaneously, the polysilane 6 is changed to the insulating film 2 constituted by the silicon oxide film. Moreover, the silicon nitride film 4 on the wiring metal 3 is removed. Thus, as shown in FIG. 5D, all of the structures of the insulating film 2 shown in FIG. 3B according to the second embodiment can be formed by using polysilane 6 as the material.

Since the polysilane 6 changed to the insulating film 2 has material properties similar to those of the integrated insulating film 2, the manufacturing process following the process shown in FIG. 1C according to the first embodiment can be employed.

The merit of the third embodiment obtainable from formation of the first trench metallization shown in FIG. 5A with polysilane is that a flat surface constituted by the polysilane can be obtained if the surface of the silicon substrate 1 has step differences. The conventional method with which the insulating film 2 is deposited cannot prevent formation of a stepped portion also on the surface of the insulating film 2. Therefore, the first trench having a uniform width and depth cannot be formed.

When the insulating film 2 is deposited thick and the surface is smoothed by performing CMP, the shape of the first trench can be improved. However, the problem of uneven density of the stoppers for use in the polishing step remains to be solved. Therefore, the overall surface of the wafer cannot easily be smoothed in ordinary cases. When the polysilane 6 is applied, the foregoing problem can considerably be easily prevented. As a matter of course, the third embodiment attains a similar result of preventing borderless etching to that obtainable from the second embodiment.

A fourth embodiment of the present invention will now be described with reference to FIGS. 6A to 6I. Hitherto, formation of a contact hole having a high aspect ratio or formation of a trench encounters film thinning of the resist that is used as the mask for the anisotropic RIE step. As a result, there arises a problem where the thickness of the residual film of the resist to serve as the mask is excessively reduced.

To prevent the foregoing problem, a method may be employed which has the steps of: forming a reversed pattern of the opening portion of the contact hole, changing the surface of the polysilane existing in the outer portion of the exposed opening portion to the insulating film constituted by the silicon oxide film by performing $O_2$ RIE or implantation of $O_2$ ions, and opening the polysilane by using the insulating film as a mask. Thus, a satisfactory contact hole and the trench can be formed.

Figure 6A:
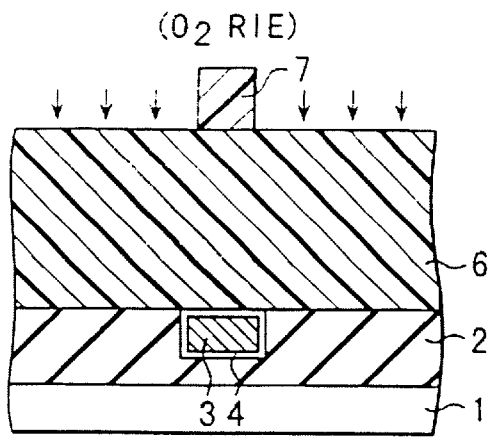
FIG. 6A to 6I are cross sectional views showing steps of a manufacturing method of semiconductor devices according to a fourth embodiment.

That is, as shown in FIG. 6A, the surface of the first trench metallization constituted by the insulating film 2 on the silicon substrate 1 and the wiring metal 3 covered with the silicon nitride film 4 is coated with the polysilane 6. Then, the pattern of the resist 7 is formed to cover the portion in which the contact hole will be formed.

Figure 6B:
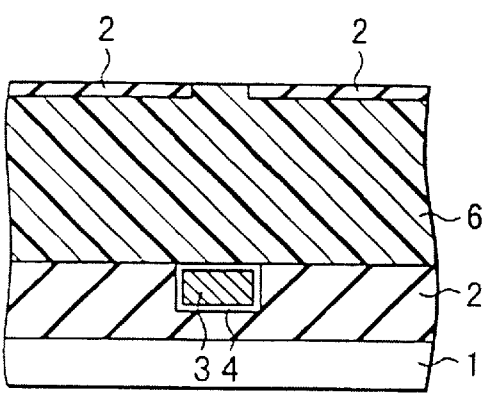

Then, the resist 7 is used as a mask to introduce $O_2$ ions into the surface of the polysilane 6 by using an $O_2$ RIE machine as indicated with an arrow shown in FIG. 6A. Then, $O_2$ ashing is performed to remove the resist 7. Thus, as shown in FIG. 6B, the insulating film 2 constituted by the silicon oxide film is formed on the surface of the polysilane 6. The ashing of the resist 7 is performed minimally to prevent change of the surface of the polysilane 6 covered with the lower portion of the resist 7 to the silicon oxide film.

Figure 6C:
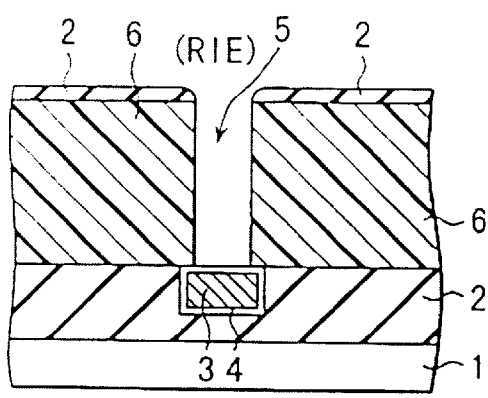

Since the etching selective ratio of the polysilane 6 with respect to the insulating film 2 can be raised as described above, the resist 7 is removed and the anisotropic RIE step is performed by using the insulating film 2 as a mask as shown in FIG. 6C. Thus, the contact hole 5 can be formed in the polysilane 6 by using the silicon nitride film 4 as the etching stopper.

Then, treatment similar to the $O_2$ ashing step is performed in the same chamber in which RIE has been performed so that $O_2$ ions are introduced from the inner surface of the contact hole 5 opened in the polysilane 6. As a result, the overall body of the polysilane 6 can be changed to the insulating film constituted by the silicon oxide film.

Figure 6D:
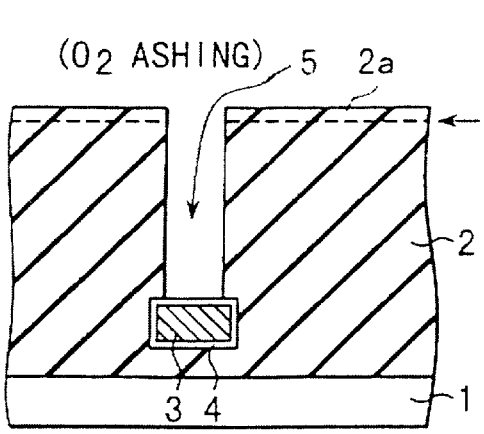

Thus, as shown in FIG. 6D, both of the insulating film 2 for use to form the first trench and the insulating film for performing formation of the contact hole 5 and used as the etching mask can be formed as the integrated insulating film 2 constituted by the silicon oxide film.

At this time, the edge of the periphery of the opening portion of the insulating film 2a used as the mask is rounded by anisotropic RIE. When rounding excessively occurs and raises a problem in the structure, removal of the insulating film 2a is required by CMP, as shown in FIG. 6D.

Note that attention must be focused on a fact that the rounded portion of the edge adjacent to the opening portion has an effect of smoothing the burying step when the wiring metal is buried in the contact hole and when the contact hole of the insulating film 2 shown in FIG. 6D has a high aspect ratio.

Figure 6G:
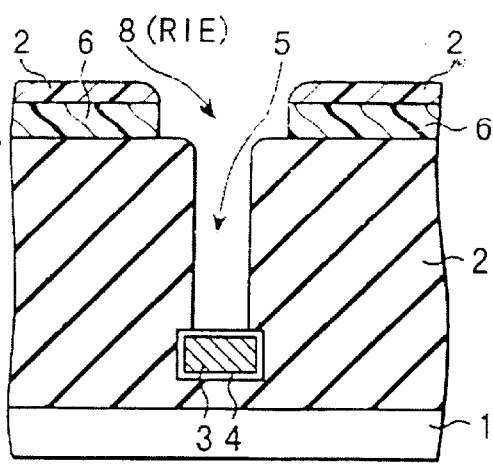
Figure 6E:
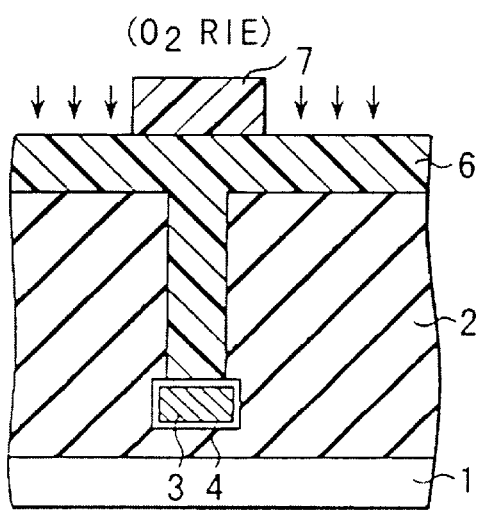

Then, as shown in FIG. 6E, the overall surface is coated with the polysilane 6 such that the contact hole is buried.

Then, reversed patterning is performed to cover the opening portion of the second trench by using the resist 7. The resist 7 is used as a mask to introduce oxygen into the surface of the polysilane 6 by using the $O_2$ RIE machine.

Figure 6H:
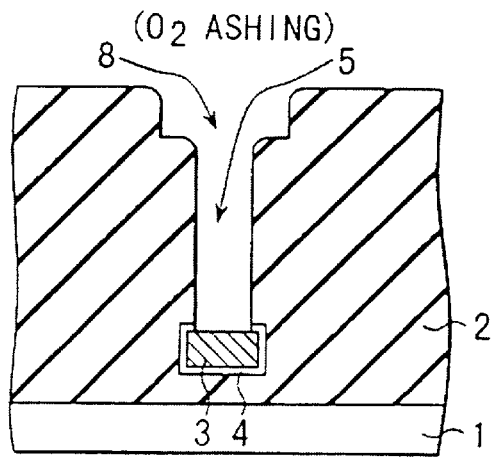
Figure 6F:
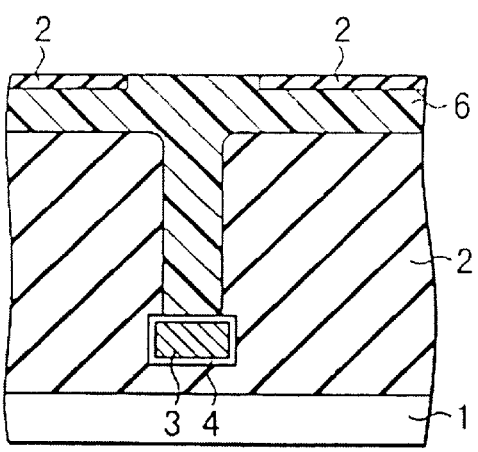

Then, the steps shown in FIGS. 6B and 6C are repeated as shown in FIGS. 6F and 6G so that a treatment similar to the $O_2$ ashing is continuously performed in the same chamber. The insulating film 2 completely constituted by the silicon oxide film and having the dual-damascene structure can be formed on the silicon substrate 1, as shown in FIG. 6H.

Figure 6I:
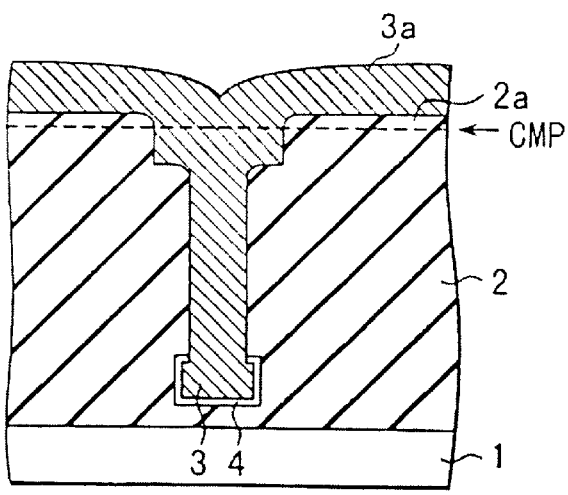

Then, as shown in FIG. 6I, the silicon nitride film 4 on the upper portion of the wiring metal 3 is removed, and the wiring metal is deposited to bury the contact hole 5 and the second trench 8. The wiring metal may be Al—Cu or Cu. Then, the wiring metal removal portion 3a that has excessively been deposited is removed by CMP by using the insulating film 2 as a stopper. Thus, an excellent dual-damascene structure having a shape that is precisely controlled can be formed.

When the anisotropic RIE results in an excessive rounded edge adjacent to the opening portion of the insulating film that was used as the etching mask and a problem in terms of the structure arises, the CMP step is furthermore performed to remove the insulating film removal portion 2a by polishing.

When the second trench 8 shown in FIG. 6H has a high aspect ratio, attention must be focused on the fact that the insulating film removal portion 2a generated adjacent to the opening portion has the effect of smoothing the burying step when the wiring metal is buried in the second trench 8, as shown in FIG. 6I.

Figure 7A:
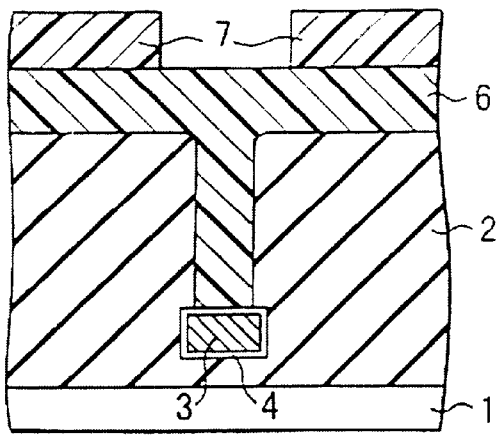
FIGS. 7A to 7C are cross sectional views showing steps of a manufacturing method of semiconductor devices according to a fifth embodiment.
Figure 7B:
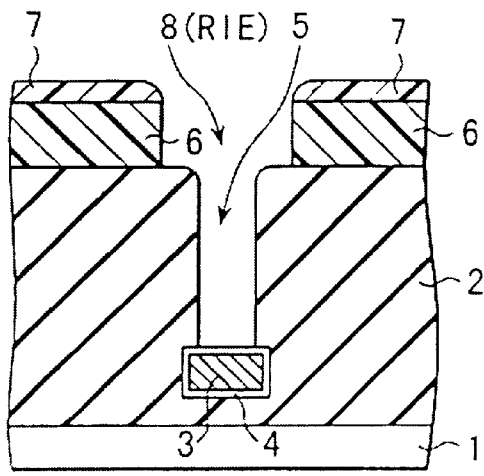
Figure 7C:
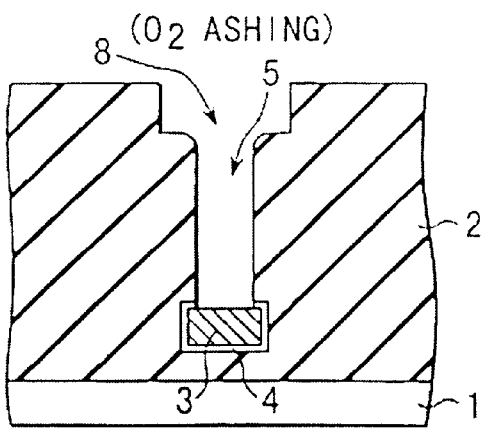

Referring to FIGS. 7A to 7C, a fifth embodiment of the present invention will now be described. Referring to FIG. 7A, the step until the overall surface is coated with the polysilane 6 such that the contact hole is buried is similar to that according to the fourth embodiment shown in FIG. 6E.

In the fourth embodiment, the resist 7 is formed by performing reversed patterning such that the opening portion of the second trench 8 of the polysilane 6 is covered. The fifth embodiment is structured such that the overall surface is coated with the polysilane 6. Then, the resist 7 is used to open the formation position of the second trench 8 by performing a usual patterning.

Since the insulating film 2 can be formed by using the polysilane 6 which can easily be fabricated, the film thinning of the resist mask can be reduced during the anisotropic RIE step. Therefore, as shown in FIG. 7B, the resist 7 can be used as the etching mask to perform the formation of the second trench 8 and remove the polysilane with which the contact hole 5 is filled.

As shown in FIG. 7C, the polysilane 6 is changed to the insulating film 2 constituted by the silicon oxide film simultaneously with the step of removing the resist 7 by $O_2$ ashing. Thus, the interlayer insulating film 2 having the dual-damascene structure on the silicon substrate 1 can be formed into the insulating film constituted by an integrated silicon oxide film.

Since the anisotropic RIE enables the rounded portion generated at the edge adjacent to the opening portion of the resist 7 to be removed together with the resist 7, the foregoing method has merit when the rounded portion is undesirable as the processed shape. When the step of burying the material of the metallization shown in FIG. 1F is added to be performed successively, a dual-damascene structure can be formed.

In the first to fifth embodiments, the RIE using the $O_2$ plasma or implantation of $O_2$ ions is employed to form the insulating film constituted by the silicon oxide film. The method is not limited to the foregoing methods.

Alternatively, any one of the following methods may be employed: thermal oxidation which is performed in an $O_2$ atmosphere, ashing which uses O3 plasma, irradiation with ultraviolet rays and dipping opening portions into section in which sulfuric acid and hydrogen peroxide are mixed. Also the method enables polysilane to be changed to the insulating film constituted by the silicon oxide film.

The organic silicon film such as polysilane, can be changed to an insulating film in various stages owing to the degree of oxidation which include: an organic silicon oxide film in which carbon is left in the oxide film, an inorganic silicon oxide film from which carbon has been removed that has a crystal structure having irregularity as compared with $SiO_2$ and which contains OH groups, and a silicon oxide film subjected to further heat treatment to have the crystal structure similar to that of $SiO_2$.

For example, the trench metallization in the first layer and the contact hole are formed by using organic silicon oxide film. Then, organic silicon is applied to form the second trench and ashing is performed in a gas composed of only $O_2$. In this case, carbon may be left in organic silicon by controlling the temperature. Alternatively, heat treatment may be performed in an atmosphere of mixed gas of $O_2$ and $CO_2$ to change the organic silicon constituting the second trench to an organic silicon oxide film having a dielectric constant similar to that of the organic silicon oxide film.

When organic silicon film such as polysilane is subjected to heat treatment that is performed in a mixed gas atmosphere Of $O_2$ and $CO_2$, or when the organic silicon is subjected to RIE using CO, or when implantation of CO ions is performed, the organic silicon oxide film having a dielectric constant similar to that of the organic silicon oxide film can be formed.

When organic silicon film such as polysilane is subjected to ashing using a gas containing only $H_2$ or a mixed gas of $H_2$ and $O_2$ when RIE, implantation of ions, or heat treatment is performed, the inorganic silicon oxide film can be formed.

When the organic silicon such as polysilane is subjected heat treatment in a mixed gas atmosphere of $N_2$ and $O_2$ or when ashing, RIE, or implantation of ions is performed by using the foregoing gas, the silicon oxide nitride film or a silicon nitride film can be formed.

The silicon oxide film, the silicon oxide nitride film and silicon nitride film may be employed to a dry etching process of the contact hole and the trench according to the present invention.

Figure 8A:
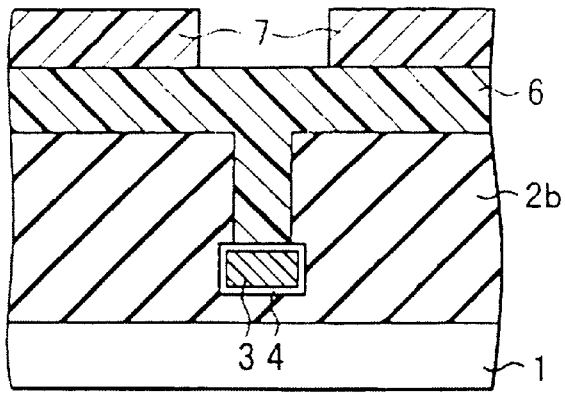
FIGS. 8A to 8C are cross sectional views showing steps of a manufacturing method of semiconductor devices according to a sixth embodiment.
Figure 8B:
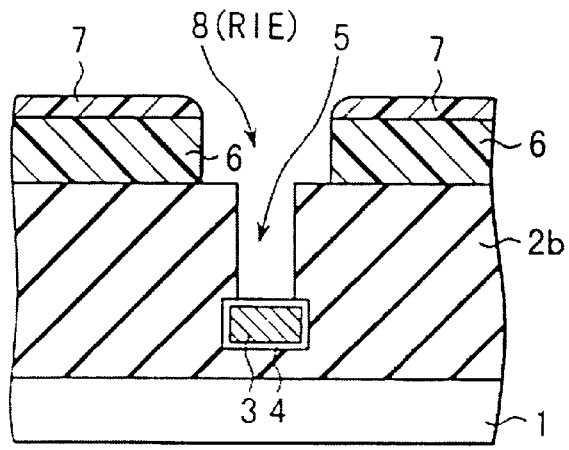
Figure 8C:
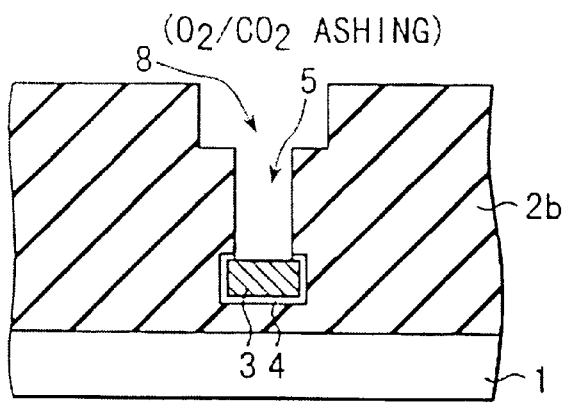

Referring to FIGS. 8A to 8C, a sixth embodiment of the present invention will now be described. As shown in FIG. 8A, the sixth embodiment is structured such that formation of the interlayer insulating film having the dual-damascene structure is performed by using an organic silicon oxide film 2b until the step of formation of the trench metallization in the first layer and the contact hole. Since the organic silicon oxide film 2b is formed by a method similar to that at the third embodiment described with reference to FIGS. 5A to 5D, a detailed description of the method is omitted.

As shown in FIG. 8A, the surface of the organic silicon oxide film 2b is coated with the polysilane 6 to bury the contact hole. The resist 7 is used to open the portion in which the second trench will be formed. Then, as shown in FIG. 8B, the resist 7 is used as the etching mask to perform anisotropic RIE so as to form the second trench 8 in the polysilane 6. Then, the polysilane 6 with which the contact hole 5 is filled is removed until the silicon nitride film 4 is exposed to the outside.

Then, as shown in FIG. 8, ashing is performed by using a mixed gas of $O_2$ and $CO_2$ to remove the resist 7. Simultaneously, change is caused to occur such that the polysilane 6 has a dielectric constant that is the same as the organic silicon oxide film 2b so as to be a portion of the organic silicon oxide film 2b. Thus, an interlayer insulating film having the dual-damascene structure, the overall body of which is made of the organic silicon oxide film, can be formed.

Figure 9A:
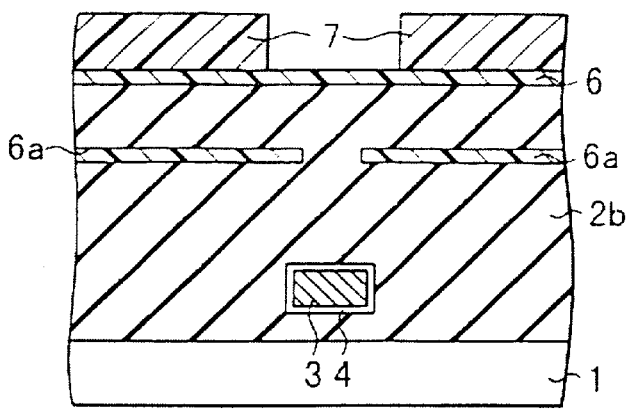
FIGS. 9A to 9C are cross sectional views showing steps of a manufacturing method of semiconductor devices according to a seventh embodiment.
Figure 9B:
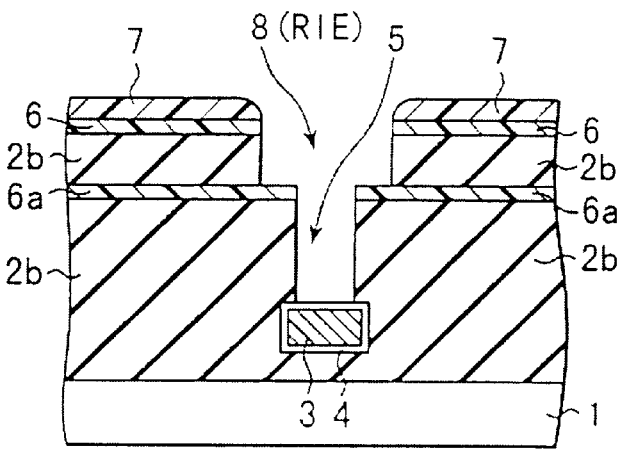
Figure 9C:
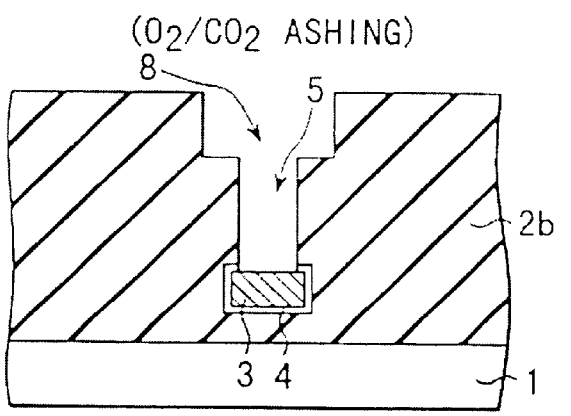

Referring to FIGS. 9A to 9C, a seventh embodiment of the present invention will now be described. In the seventh embodiment, the overall body of the interlayer insulating film having the dual-damascene structure is formed by using the organic silicon oxide film 2b such that the polysilane 6a serving as the etching stopper for forming the second trench is buried.

As shown in FIG. 9A, an opening portion is previously formed in the etching stopper constituted by the polysilane 6a so as to also be used as the etching mask for forming the contact hole. Moreover, the surface of the organic silicon oxide film 2b is coated with the polysilane 6 as the anti-reflective film. The resist 7 is used to form the opening portion in the region in which the second trench will be formed.

Then, as shown in FIG. 9B, RIE is performed to remove the anti-reflective film constituted by the polysilane 6. Then, the RIE conditions for the organic silicon oxide film 2b are employed to perform anisotropic etching to reach the silicon nitride film 4. Thus, only one RIE operation enables the contact hole 5 and the second trench 8 to be formed.

At this time, the anisotropic etching is performed under the RIE conditions that the flow ratio of mixed gas $C_4F_8/CO/AR/O_2$ is 10/50/200/8 sccm, the pressure is 40 mTorr, the high frequency electric power of 1400 W is applied. Thus, the etching selective ratio of the polysilane 6 with respect to the organic silicon oxide film can be made to be 10 or higher. Therefore, the polysilane 6 can be used as the etching mask for the contact hole 5 and the etching stopper when the second trench 8 is formed.

Then, as shown in FIG. 9C, the silicon nitride film 4 covering the upper portion of the wiring metal 3 is removed, and then a mixed gas of $O_2$ and $CO_2$ is used to perform ashing so that the resist 7 is removed. Simultaneously, the polysilane 6 and polysilane 6a are changed to have the same dielectric constant as that of the organic silicon oxide film 2b as the portion of the organic silicon oxide film 2b. Thus, the interlayer insulating film having the dual-damascene structure, the overall body of which is made of the integrated organic silicon oxide film, can be formed.

In the seventh embodiment, the organic silicon oxide film 2b must be formed to bury the polysilane 6a. That is, oxidation of the polysilane 6a during the process for forming the organic silicon oxide film 2b must be prevented. To prevent oxidation of the polysilane 6a, for example, a method may be employed where an intermediate process is performed such that the surface of the polysilane 6a is covered with a thin plasma $SiO_2$ film, and a barrier against introduction of $O_2$ is formed.

The thin $SiO_2$ film is removed from the surface of the polysilane 6a in the step show in FIG. 9B. Therefore, change of the polysilane 6a to a portion of the organic silicon oxide film in the step shown in FIG. 9C is not obstructed.

In the seventh embodiment, the material of the interlayer insulating film is organic silicon oxide film. Note that the material is not limited to the organic silicon oxide film. When the inorganic silicon oxide film or silicon oxide film is employed as the material of the interlayer insulating film, the polysilane 6a is similarly employed as the etching stopper and the etching mask.

At this time, polysilane is employed as the anti-reflective film 6. Note that the material is not limited to polysilane. For example, an organic anti-reflective film may be employed. When the organic anti-reflective film is employed, the anti-reflective film can also be removed when the resist 7 is removed by ashing.

Figure 10A:
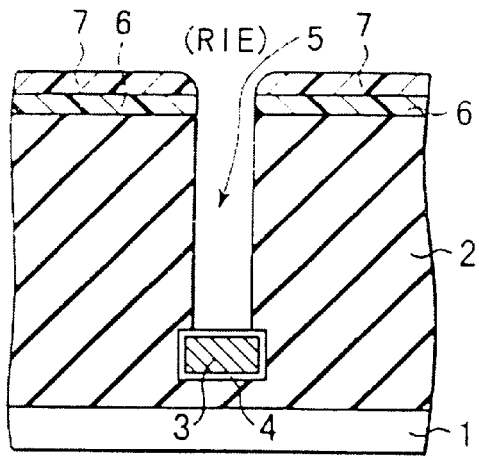
FIGS. 10A to 10C are cross sectional views showing steps of a manufacturing method of semiconductor devices according to an eighth embodiment.
Figure 10B:
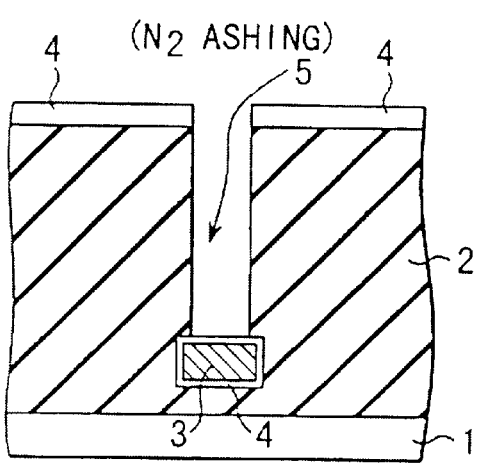
Figure 10C:
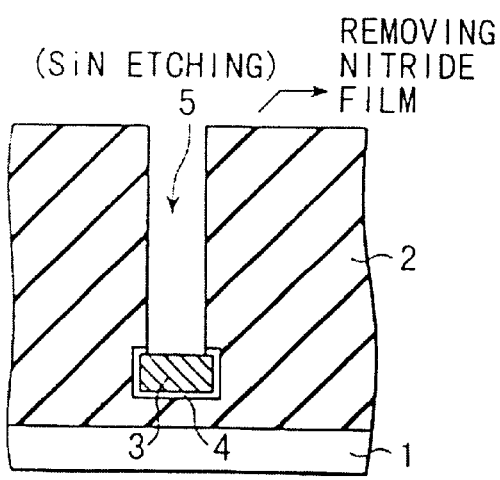

Referring to FIGS. 10A to 10C, an eighth embodiment of the present invention will now be described. In the eighth embodiment, the polysilane is changed to the silicon nitride film so as to be used as a mask when a contact hole having a high aspect ratio is formed.

As shown in FIG. 10A, the trench metallization in the first layer is formed by using the insulating film 2. Then, the insulating film 2 is again deposited on the first trench metallization to bury the first trench metallization with the thick insulating film 2 so that the surface is smoothed. Then, the polysilane 6 is applied, and then the pattern of the resist 7 for forming the opening portion of the contact hole having the high aspect ratio is formed. The polysilane 6 is an anti-reflective film in an exposing step in the lithography process for opening the resist 7.

Then, the resist 7 is used as the etching mask when the contact hole 5 is formed in the insulating film 2 by anisotropic RIE. Thus, the silicon nitride film 4 covering the wiring metal 3 is exposed to the outside. At this time, the silicon nitride film 4 serves as a stopper for use in the anisotropic RIE step.

Then, as shown in FIG. 10B, the resist 7 is removed by $N_2$ ashing. Simultaneously, the anti-reflective film constituted by the polysilane 6 is changed to the silicon nitride film 4. The silicon nitride film 4 and the silicon nitride film 4 covering the wiring metal 3 are removed by hot phosphoric acid etching or by CDE (Chemical Dry Etching). Thus, as shown in FIG. 10C, the contact hole 5 having a high aspect ratio reaches the wiring metal 3 and the first layer can be formed.

The eight embodiment is characterized in that the anti-reflective film constituted by the polysilane 6, which is left on the surface and which cannot therefore easily be removed by the $O_2$ ashing for removing the resist 7, is changed to the silicon nitride film simultaneously with removal of the resist 7 by performing $N_2$ ashing. Thus, the removal can easily be performed by wet etching or the CDE.

Figure 11A:
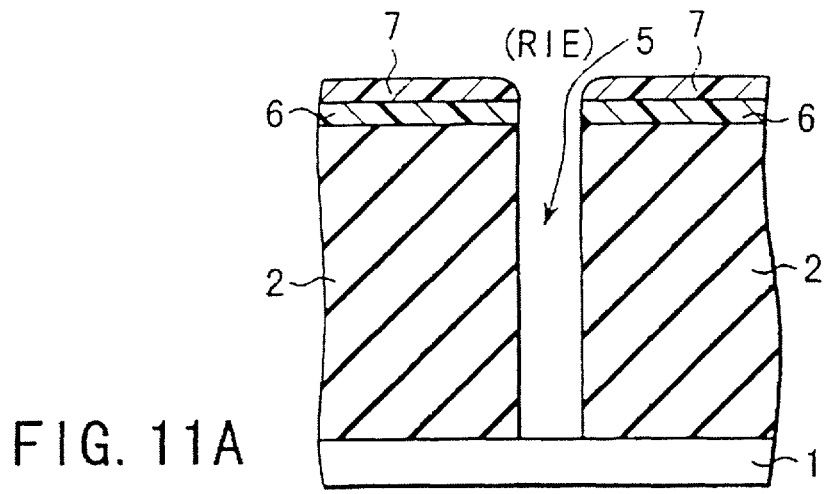
FIGS. 11A to 11C are cross sectional views showing steps of a manufacturing method of semiconductor devices according to a ninth embodiment.
Figure 11B:
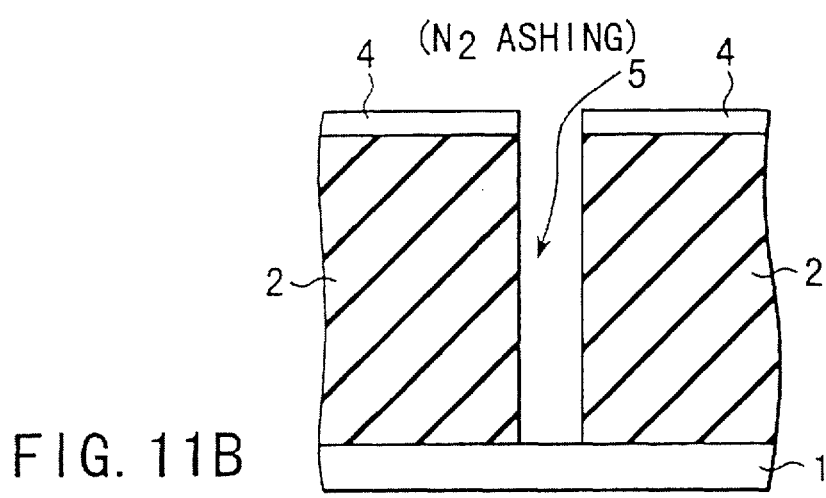
Figure 11C:
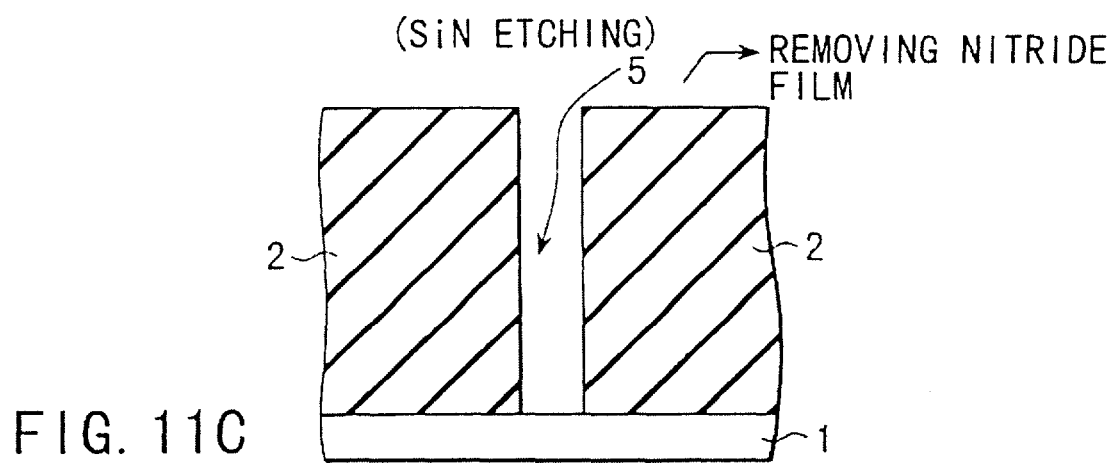

Referring to FIGS. 11A to 11C, a ninth embodiment of the present invention will now be described. The ninth embodiment is a modification of the eighth embodiment, in which a contact hole having a high aspect ratio is formed to directly reach the silicon substrate 1.

As shown in FIG. 11A, a thick insulating film 2 is directly formed on the silicon substrate 1. Then, an anti-reflective film constituted by the polysilane 6 is applied. Then, the pattern of a resist 7 having an opening portion of the contact hole is formed on the anti-reflective film.

The resist 7 is used as the etching mask to perform anisotropic RIE to form the contact hole 5 that reaches the surface of the silicon substrate 1. Then, as shown in FIG. 11B, $N_2$ ashing is performed to remove the resist 7. Simultaneously, the anti-reflective film constituted by the polysilane 6 is changed to the silicon nitride film 4.

The anti-reflective film changed to the silicon nitride film 4 is removed by a hot phosphoric acid treatment. Thus, the contact hole having a high aspect ratio which reaches the surface of the silicon substrate shown in FIG. 11C can be formed.

Figure 12A:
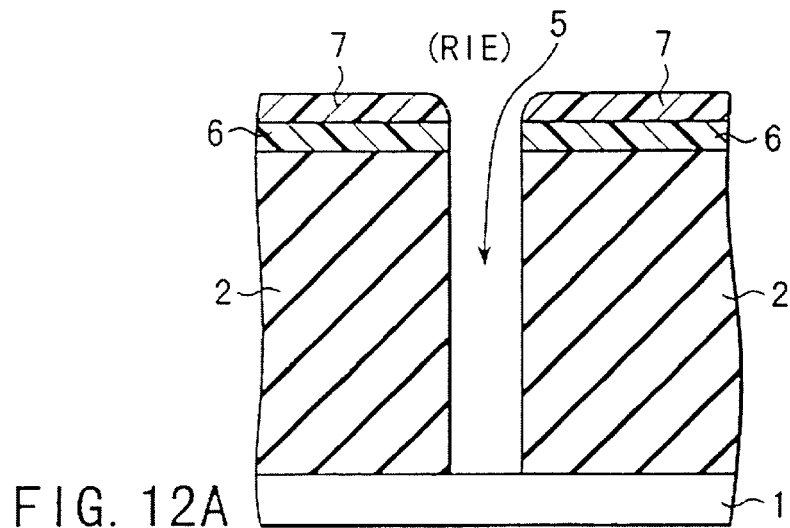
FIGS. 12A and 12B are cross sectional views showing steps of a manufacturing method of semiconductor devices according to a tenth embodiment.
Figure 12B:
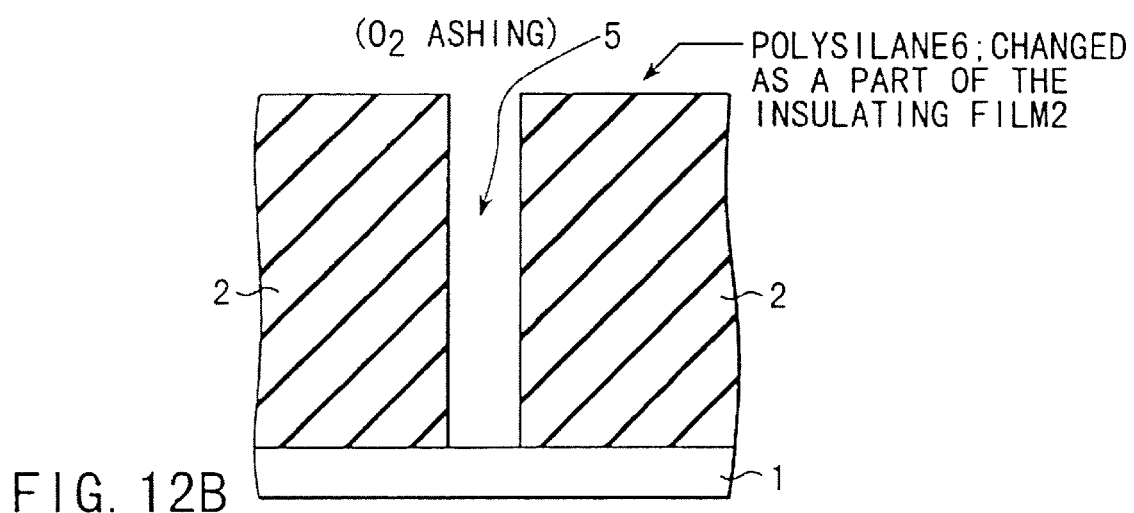

Referring to FIGS. 12A and 12B, a tenth embodiment of the present invention will now be described. The tenth embodiment is different from the eighth embodiment in that the anti-reflective film constituted by the polysilane 6 is made to be a portion of the insulating film 2 after the contact hole 5 has been formed.

As shown in FIG. 12A, a thick insulating film 2 is directly formed on the silicon substrate 1. Then, the anti-reflective film constituted by the polysilane 6 is applied. Then, the pattern of the resist 7 having an opening portion of the contact hole is formed on the anti-reflective film.

The resist 7 is used as the etching mask to perform anisotropic RIE to open the contact hole 5 that reaches the surface of the silicon substrate 1. Then, as shown in FIG. 12B, $O_2$ ashing is performed to remove the resist 7. Simultaneously, the polysilane 6 is changed to the silicon oxide film. Thus, the anti-reflective film can be formed to be a portion of the insulating film 2.

In the tenth embodiment, the insulating film 2 that is first formed on the silicon substrate 1 is the insulating film obtained by oxidizing the polysilane. Thus, the contact hole which reaches the silicon substrate 1 as shown in FIG. 12B can be formed as the insulating film constituted by an integrated silicon oxide film including the anti-reflective film.

When a silicon nitride film changed from the polysilane is employed as the insulating film 2 which is formed on the silicon substrate 1 and the resist 7 is removed by $N_2$ ashing, the polysilane 6 employed as the anti-reflective film is changed to the silicon nitride film. Therefore, the contact hole can be formed as the insulating film constituted by the integrated silicon nitride film including the anti-reflective film.

Although the tenth embodiment has been described about formation of the contact hole that reaches the silicon substrate 1, the contact hole for the trench metallization in the first layer can be formed by a similar process.

Figure 13A:
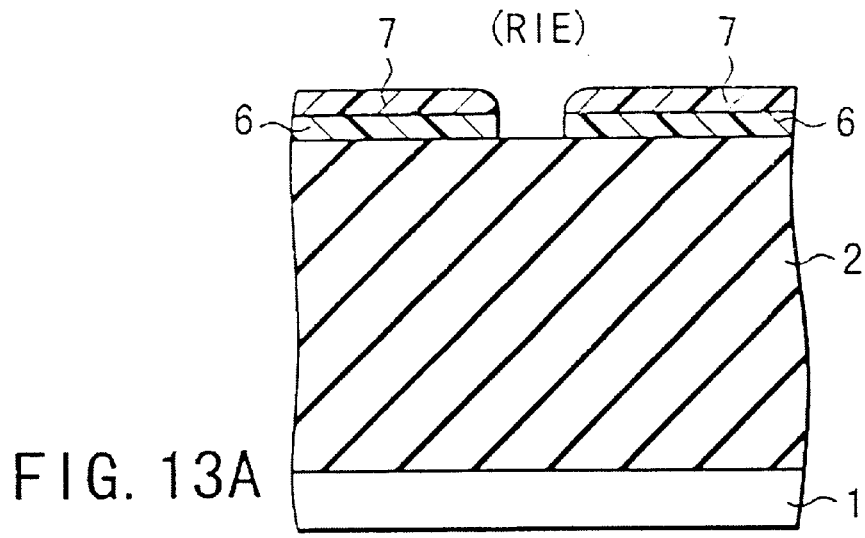
FIGS. 13A to 13C are cross sectional views showing steps of a manufacturing method of semiconductor devices according to an eleventh embodiment.
Figure 13B:
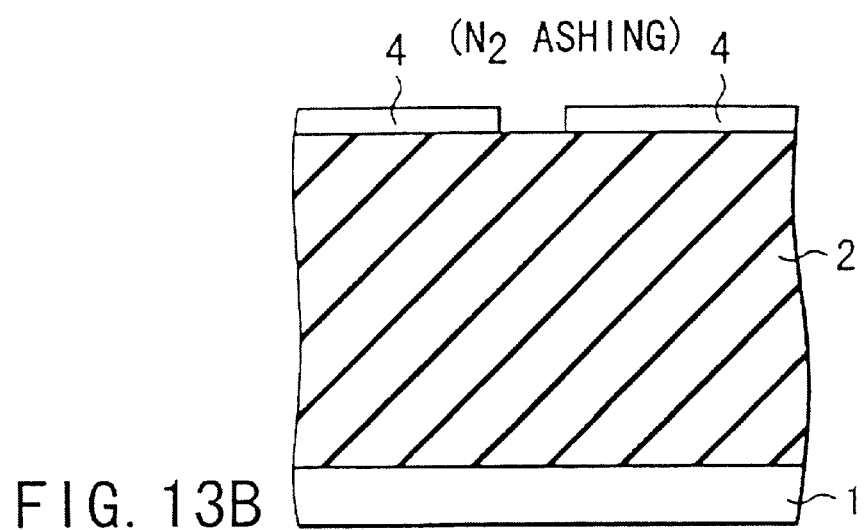
Figure 13C:
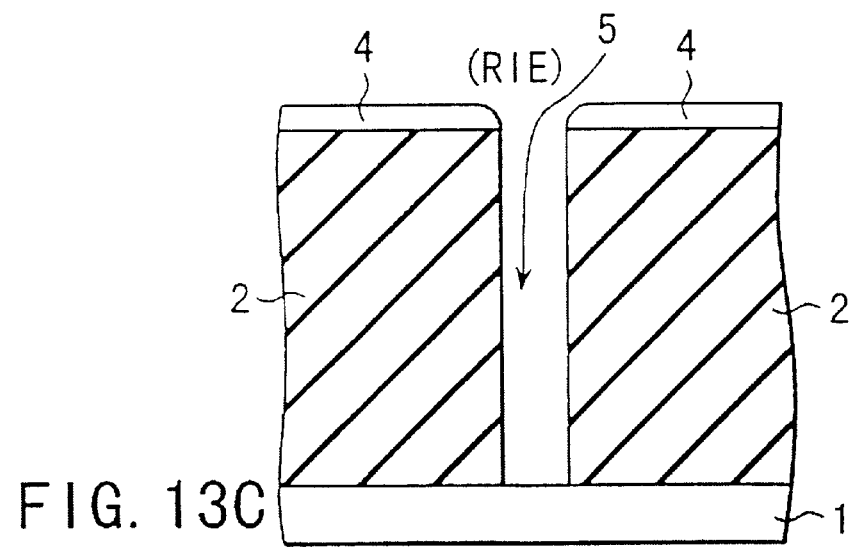

Referring to FIGS. 13A to 13C, an eleventh embodiment of the present invention will now be described. As shown in FIG. 13A, the thick insulating film 2 is formed on the silicon substrate 1. Then, an anti-reflective film constituted by the polysilane 6 is applied. Then, the pattern of the resist 7 having the opening portion of the contact hole is formed. Then, the resist 7 is used as a mask when the anisotropic RIE is performed to open the polysilane 6. Then, as shown in FIG. 13B, $N_2$ ashing is performed to remove the resist 7. Simultaneously, the polysilane 6 is changed to the silicon nitride film.

Then, as shown in FIG. 13C, the silicon nitride film 4 is used as the mask when the anisotropic RIE is performed to form the contact hole having a high aspect ratio which reaches the silicon substrate 1.

When a resist mask is directly used to form the contact hole having the high aspect ratio by the anisotropic RIE, the film thinning of the resist mask occurs. On the other hand, the eleventh embodiment in which the silicon nitride film 4 is used as the mask when anisotropic RIE is performed enables a high etching selective ratio to be realized with respect to the insulating film 2 constituted by $SiO_2$ or the like. Therefore, the problem of the film thinning can be prevented.

The silicon nitride film 4 on the insulating film 2 shown in FIG. 13C may be removed by the hot phosphoric acid.

Alternatively, the insulating film 2 may be integrated with a portion of the insulating film 2 as a silicon nitride film changed from polysilane. The rounded portion formed adjacent to the opening portion of the silicon nitride film 4 enables the wiring metal to be smoothly buried in the contact hole 5.

Figure 14A:
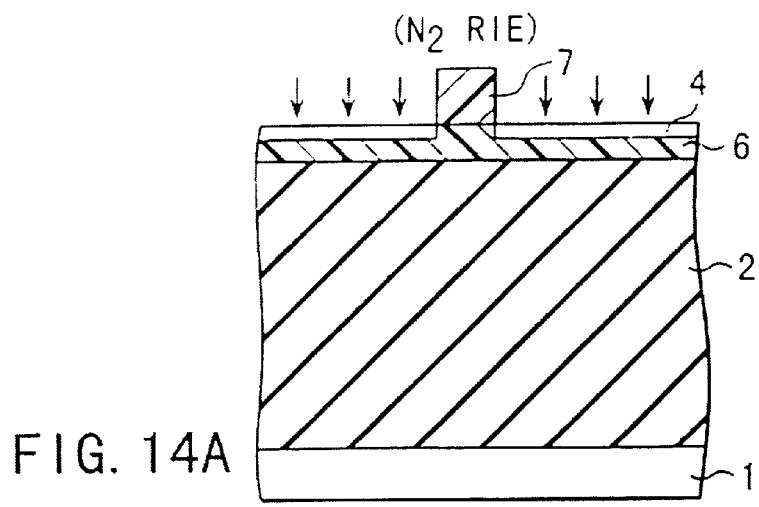
FIGS. 14A to 14C are cross sectional views showing steps of a manufacturing method of semiconductor devices according to a twelfth embodiment.
Figure 14B:
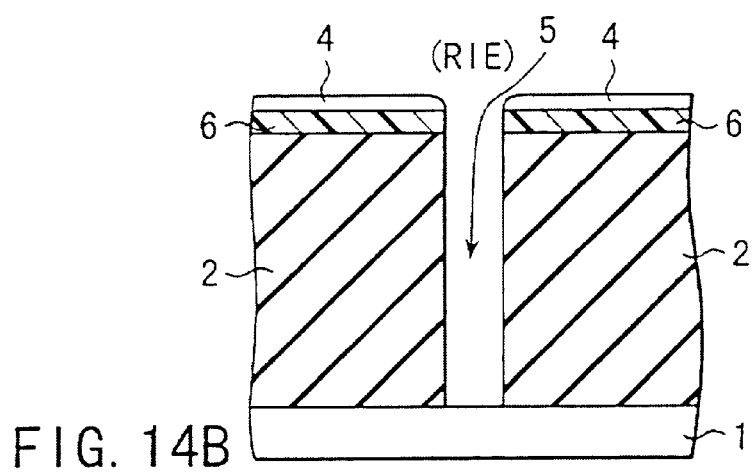
Figure 14C:
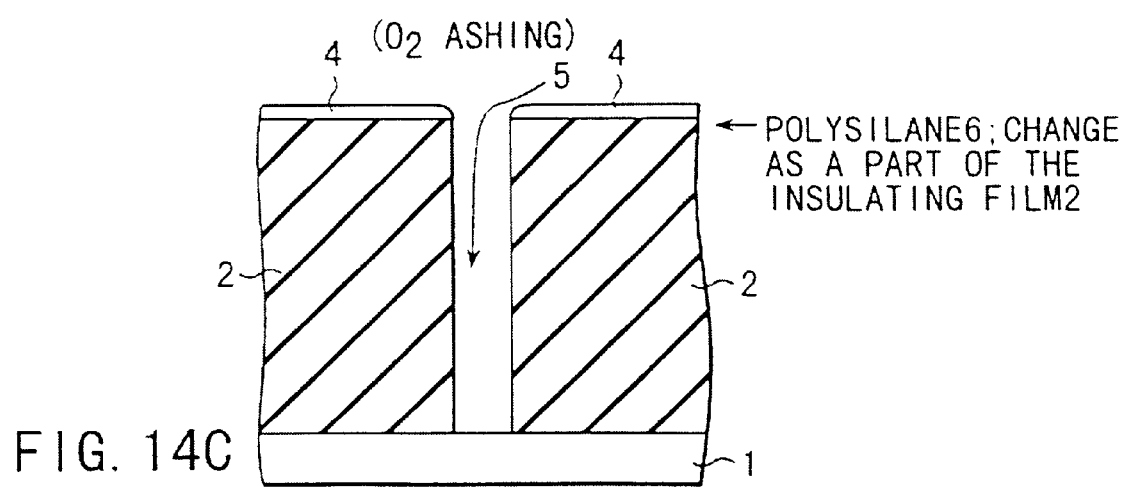

Referring to FIGS. 14A to 14C, a twelfth embodiment of the present invention will now be described. As shown in FIG. 14A, the insulating film 2 constituted by the thick silicon oxide film is formed on the silicon substrate 1. Then, the anti-reflective film constituted by the polysilane 6 is applied to the surface of the insulating film 2. The resist 7 is used to form a reversed pattern of the resist 7 such that the opening portion of the contact hole is covered. Then, RIE using $N_2$ is performed to change the exposed surface of the silicon nitride film 4, and then the resist 7 is removed.

Then, as shown in FIG. 14B, the silicon nitride film 4 is used as a mask to perform the anisotropic RIE to open the contact hole, which reaches the silicon substrate 1, in the insulating film 2 constituted by the polysilane 6 and the silicon oxide film.

Then, a treatment similar to the $O_2$ ashing step is performed to change the polysilane 6 to the silicon oxide film. Thus, the polysilane 6 is integrated as a portion of the insulating film 2, as shown in FIG. 14C.

Then, hot phosphoric acid is used to remove the silicon nitride film 4 employed as the mask so that a contact hole having a high aspect ratio which reaches the silicon substrate 1 is formed in the insulating film 2 constituted by the silicon oxide film. Also the twelfth embodiment employs the silicon nitride film as the etching mask for forming the contact hole having the high aspect ratio. Therefore, the problem of the film thinning can be prevented.

Figure 15A:
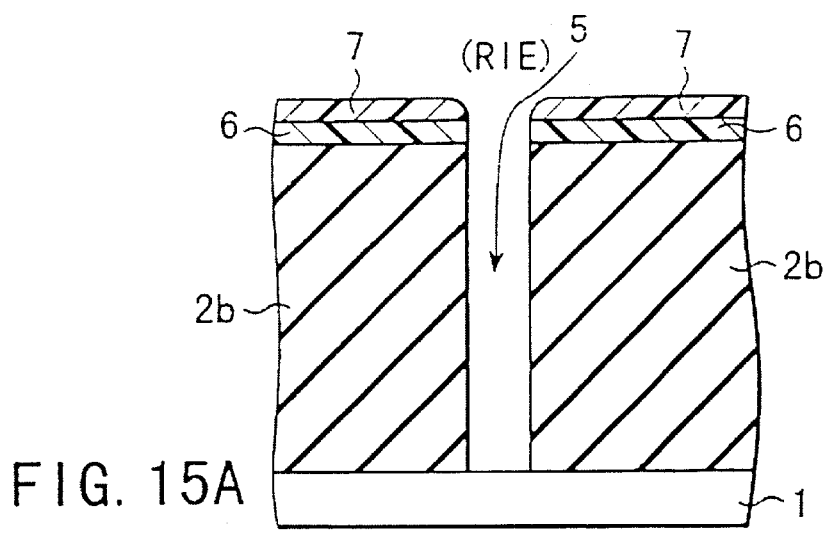
FIGS. 15A to 15C are cross sectional views showing steps of a manufacturing method of semiconductor devices according to a thirteenth embodiment.
Figure 15B:
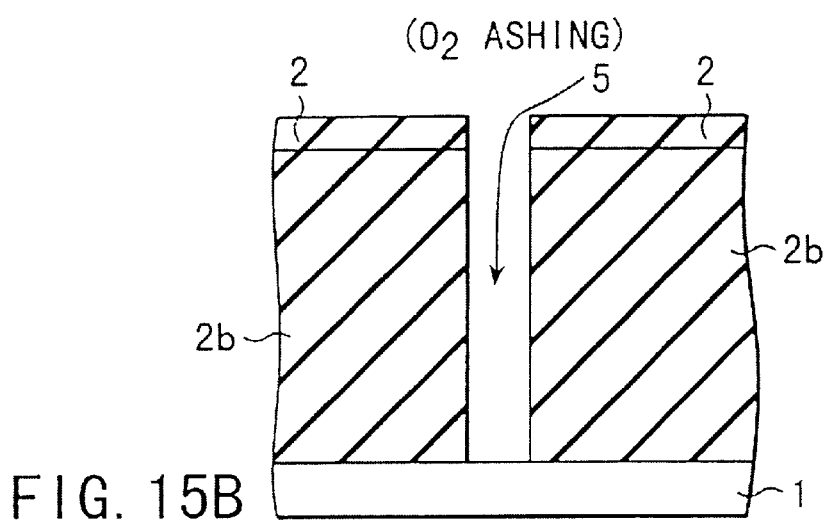
Figure 15C:
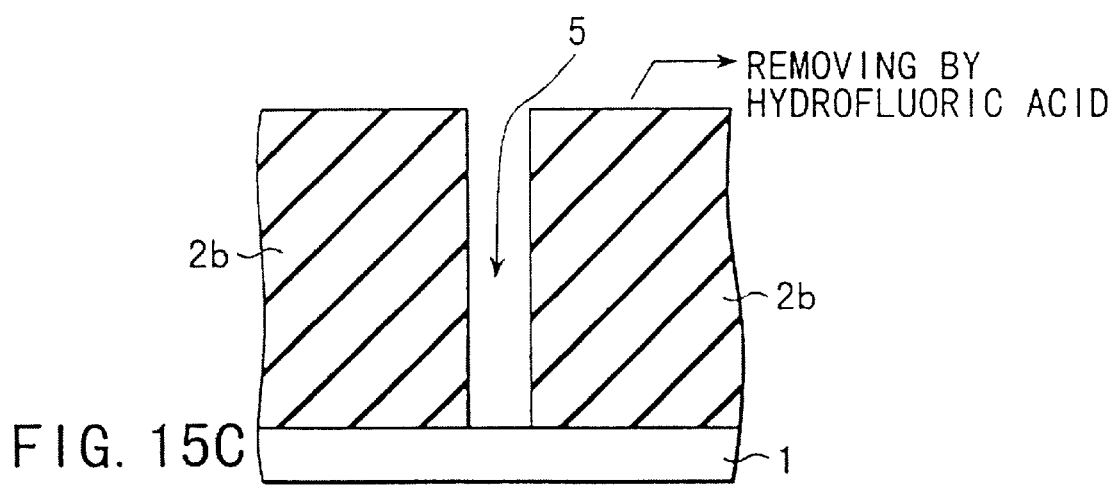

Referring to FIGS. 15A to 15C, a thirteenth embodiment of the present invention will now be described. As shown in FIG. 15A, a thick organic silicon oxide film 2b is formed on the silicon substrate 1. Then, the anti-reflective film constituted by the polysilane 6 and the resist 7 having an opened portion for forming the contact hole 5 are provided. Then, the resist 7 is used as the mask when the anisotropic RIE is performed to form the contact hole which reaches the silicon substrate 1. Then, as shown in FIG. 15B, $O_2$ ashing is performed to remove the resist 7.

In the $O_2$ ashing step, the polysilane 6 is changed to the insulating film 2 constituted by the silicon oxide film. At this time, only the insulating film 2 constituted by the silicon oxide film changed from the polysilane 6 can easily be removed by using dilute hydrofluoric acid as shown in FIG. 15C because the portion between the organic silicon oxide film 2b and the insulating film 2 constituted by the silicon oxide film has etching selectivity with respect to dilute hydrofluoric acid.

In the eleventh to thirteenth embodiments, the contact hole that reaches the silicon substrate 1 is formed. As a matter of course, the contact hole for the trench metallization in the first layer can similarly be formed.

In the first to thirteenth embodiment, the method has mainly been described in which the organic silicon film is employed in the interlayer insulating film having the dual-damascene structure and the fabricated portion of the contact hole. The present invention is not limited to this. The organic silicon film such as polysilane, can widely be applied to a manufacturing method of semiconductor devices by using dry etching technology. The foregoing face will now be described as the following embodiments.

Referring to FIGS. 16A to 16E, a fourteenth embodiment will now be described. The fourteenth embodiment is structured such that the device isolation region and the device region are smoothed by using polysilane.

Figure 16A:
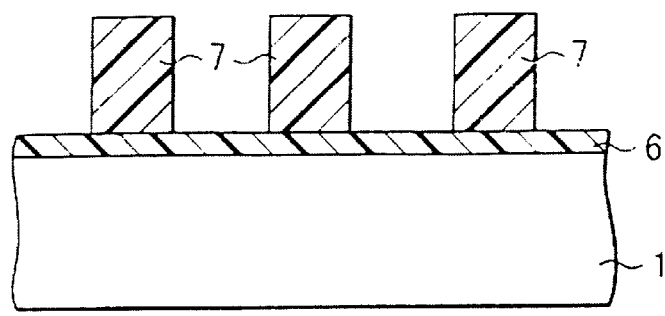
FIGS. 16A to 16E are cross sectional views showing steps of a manufacturing method of semiconductor devices according to a fourteenth embodiment.
Figure 16B:
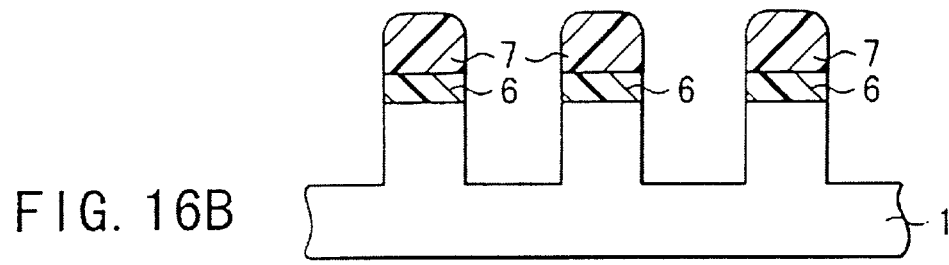

As shown in FIG. 16A, the silicon substrate 1 is coated with the polysilane 6 to form the pattern of the resist 7 such that the device region for forming a MOS (Metal-Oxide-Semiconductor) transistor is covered. Then, a mixed gas of $Cl_2$, the flow rate of which is 75 sccm, and $O_2$, the flow rate of which is 10 sccm is used to perform anisotropic RIE by using the resist 7 as a mask as shown in FIG. 16B under conditions that the pressure is 75 mTorr and the high frequency electric power is 300 W. Thus, the polysilane 6 and the silicon substrate 1 are etched.

Figure 16C:
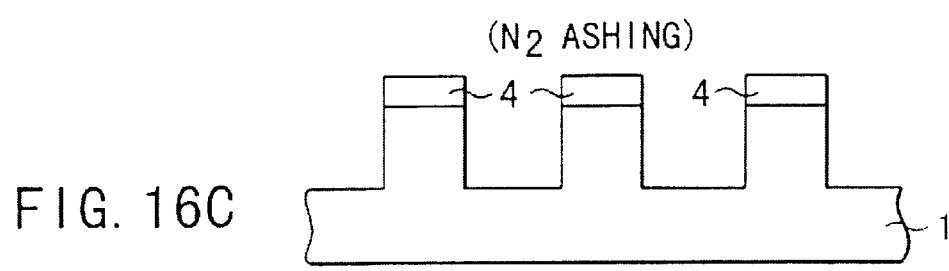
Figure 16D:
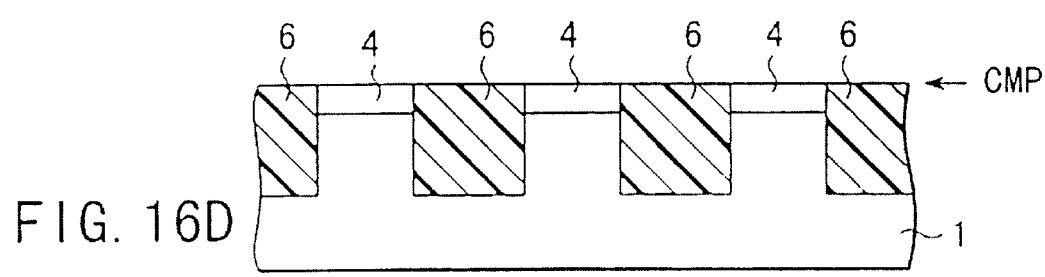

Then, as shown in FIG. 16C, $N_2$ ashing is performed to remove the resist 7. Simultaneously, the polysilane 6 is changed to the silicon nitride film 4. Then, as shown in FIG. 16D, the overall surface is coated with the polysilane 6 such that the isolation trench for isolating devices formed in the silicon substrate 1 is buried.

Since the polysilane 6 flows, the surface of the polysilane 6 is smoothed owing to the coating. Moreover, CMP is performed to remove the excess polysilane 6 on the silicon nitride film 4 by using the silicon nitride film 4 as the stopper. Thus, the opening portion of the isolation trench is filled with the polysilane 6 so as to be smoothed.

Figure 16E:
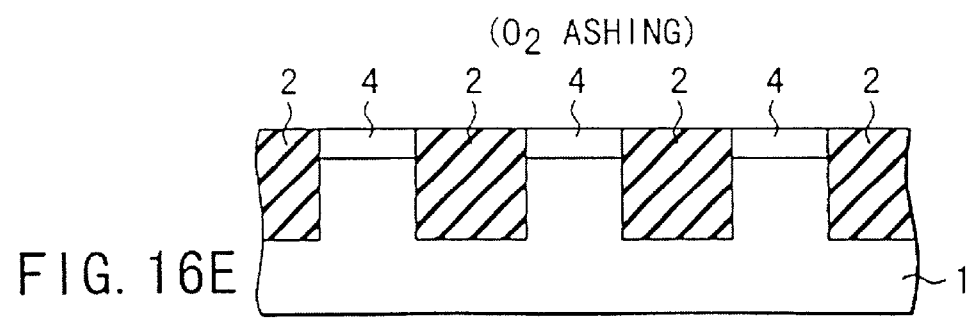

Then, as shown in FIG. 16E, a treatment similar to $O_2$ ashing is performed so that the polysilane 6 with which the isolation trench is filled is changed to the insulating film 2 constituted by the silicon oxide film. Although the foregoing embodiment has the structure that the polysilane is employed to bury the isolation trench, the present invention is not limited to this. Also an organic silicon oxide film or an inorganic silicon oxide film which can be formed by coating can be used to bury the isolation trench.

As described before, the conventional step of forming the isolation trench has been performed by thick deposition of the insulating film constituted by $SiO_2$ which cannot easily be processed as compared with polysilane. Then, the surface of the insulating film having a great uneven surface along the isolation trench is smoothed by CMP by using the silicon nitride film constituted by $Si_3N_4$ as the stopper. Therefore, a problem arises according to the distribution of density of the device regions covered with the stoppers. That is, polishing proceeds excessively in a field region where stoppers are distributed at a low density and thus the surface is formed into a concave shape.

On the other hand, the fourteenth embodiment has the structure that polysilane which can easily be polished is applied as a substitute for $SiO_2$. Therefore, the surface can be smoothed from the initial stage. Since only polysilane in the form of a thin film left on the silicon nitride film in a small quantity is required to be removed by CMP, the surface smoothness realized after CMP has been completed can be considerably improved as compared with the conventional method.

Referring to FIGS. 17A to 17D, a fifteenth embodiment of the present invention will now be described. The fifteenth embodiment has the structure that the polysilane according to the present invention is employed in a portion which is formed between gate electrodes of a MOS transistor formed on the silicon substrate 1 and in which dry etching of SAC is performed to form the contact hole which reaches the source/drain diffusion layer 9 in a self-alignment manner.

Figure 17A:
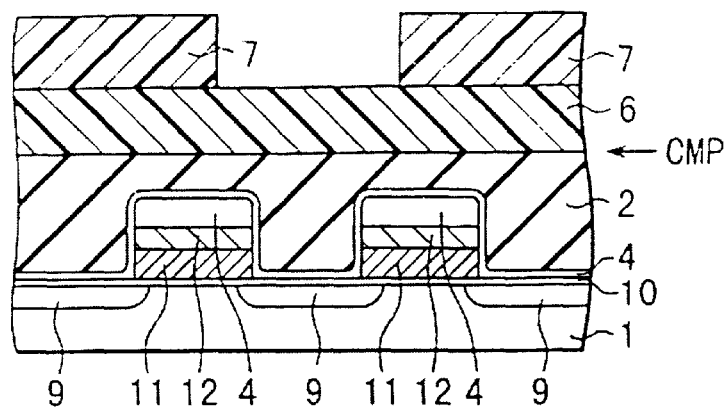
FIGS. 17A to 17D are cross sectional views showing steps of a manufacturing method of semiconductor devices according to a fifteenth embodiment.

As shown in FIG. 17A, a gate oxide film 10 is formed on the silicon substrate 1 on which the source/drain diffusion layer 9 of the MOS transistor is formed. Then, polysilicon 11, tungsten 12 and the silicon nitride film 4 are stacked on the gate oxide film 10. Then, a pattern is formed so that the gate electrode of the MOS transistor is formed such that the portion around the gate electrode is covered with the silicon nitride film 4.

Then, the insulating film 2 made of, for example, $SiO_2$ is deposited on the overall surface of the silicon substrate 1 on which the gate electrode has been formed. Then, CMP is performed to smooth the surface of the insulating film 2. Then, polysilane 6 is further applied to the smoothed insulating film 2, and then the pattern of resist 7 is formed, having an opening portion in which a self-aligned contact hole will be formed.

Figure 17B:
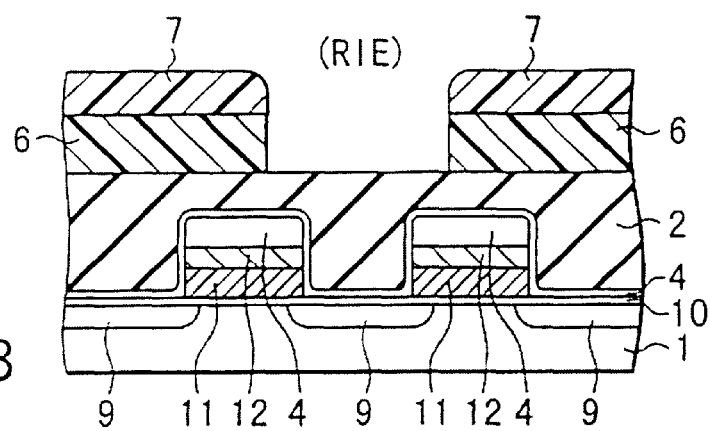
Figure 17C:
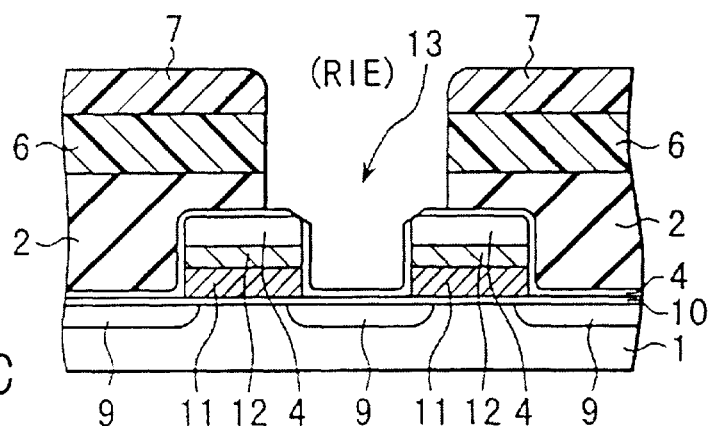

Then, as shown in FIG. 17B, polysilane 6 serving as a mask is opened by anisotropic RIE. Then, as shown in FIG. 17C, the self-aligned contact hole 13 is formed by anisotropic RIE to reach the etching stopper constituted by the silicon nitride film 4 which covers the portion around the gate electrode.

At this time, the etching selective ratio of the silicon nitride film 4 covering the portion around the gate electrode with respect to the insulating film 2 is lowered in the edge line portion of the gate electrode exposed to the inside portion of the self-aligned contact hole 13. Therefore, the corner of the edge line portion of the silicon nitride film 4 is, as shown in FIG. 17C, cut owing to the anisotropic RIE of the self-aligned contact hole 13.

Since cutting of the corners of the gate electrode is protected by the silicon nitride film 4 in the uppermost layer of the gate electrode, there arises no problem when the depth of etching of the insulating film 2, which cannot easily be fabricated as compared with the polysilane 6, is small.

That is, the fifteenth embodiment has the structure that the thickness of the insulating film 2 is reduced to stack the polysilane 6 on the insulating film 2. Thus, the depth of etching of the insulating film 2 can be minimized until the edge line portion of the gate electrode is exposed.

Figure 17D:
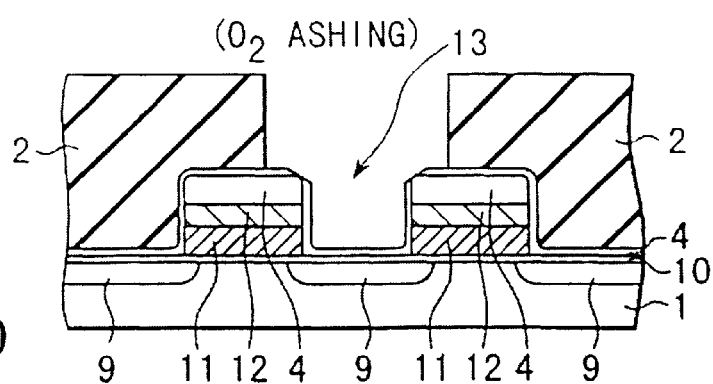

In the fifteenth embodiment, as shown in FIG. 17D, $O_2$ ashing is performed to remove the resist 7. Simultaneously, the polysilane 6 is changed to be the silicon oxide film which forms a portion of the insulating film 2. Then, the silicon nitride film 4 and the gate oxide film 10 covering the source/drain diffusion layer 9 are removed. Then, wiring metal is buried in the self-aligned contact hole 13. Thus, a SAC connected to the source/drain diffusion layer 9 is formed.

When the thickness of the insulating film 2 shown in FIG. 17A is enlarged to the total thickness of the insulating film 2 and the polysilane 6 as employed by the conventional technology, further intense anisotropic RIE is required to etch the insulating film 2 as compared with the anisotropic RIE required to etch the polysilane 6. Therefore, the amount of cutting of the edge line portion of the gate electrode is enlarged. If tungsten 12 of the gate electrode is exposed, the gate electrode and the source/drain diffusion layer 9 are short-circuited in the step of burying the wiring metal in the self-aligned contact hole 13.

That is, the fifteenth embodiment is characterized in that the insulating film 2 and the polysilane 6 are stacked; and the polysilane 6 is changed to be a portion of the insulating film 2 to substantially reduce the amount of fabrication of the insulating film 2 by the anisotropic RIE so as to prevent short circuit between the gate electrode and the source/drain diffusion layer 9 so that the manufacturing yield of the semiconductor devices is improved.

Figure 18A:
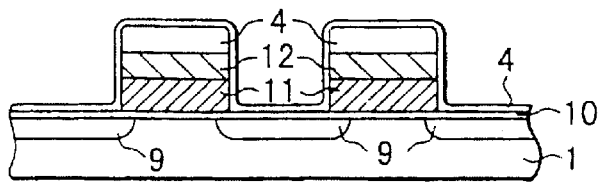
FIGS. 18A to 18E are cross sectional views showing steps of a manufacturing method of semiconductor devices according to a sixteenth embodiment.

Referring to FIGS. 18A to 18E, a sixteenth embodiment of the present invention will now be described. As shown in FIG. 18A, a gate oxide film 10 is formed on the silicon substrate 1 having the source/drain diffusion layer 9. The pattern of a gate electrode having the laminated polysilicon 11, tungsten 12 and the silicon nitride film 4 is formed. Then, the portion around the gate electrode is coated with the silicon nitride film 4. The foregoing steps are the same as those shown in FIG. 17A.

Figure 18B:
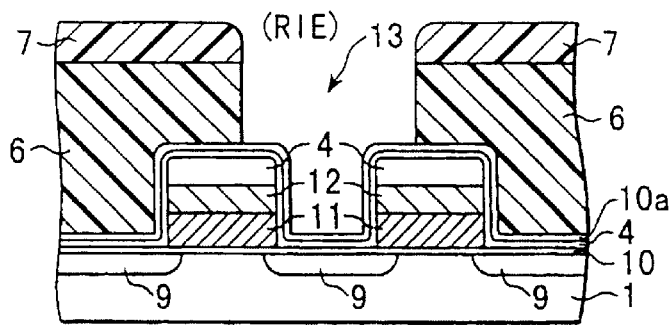

Then, as shown in FIG. 18B, the surface of the silicon nitride film 4 covering the gate electrode is covered with a silicon oxide film 10a. Then, the polysilane 6 is applied thickly to the overall upper surface of the silicon substrate 1 subjected to the foregoing step. The sixteen embodiment is characterized in that the insulating film in which the gate electrode is buried is substantially constituted by the polysilane 6.

The pattern of the opening portion in the resist 7 is formed at the position at which the self-aligned contact hole 13 will be formed. The resist 7 is used as a mask to open the self-aligned contact hole 13 in the thick polysilane film 6. Since the polysilane 6 can easily be removed by anisotropic RIE, the silicon oxide film 10a covering the gate electrode serves as a stopper to completely prevent.erosion of the edge line portion of the gate electrode and improve the manufacturing yield of the semiconductor devices.

Figure 18C:
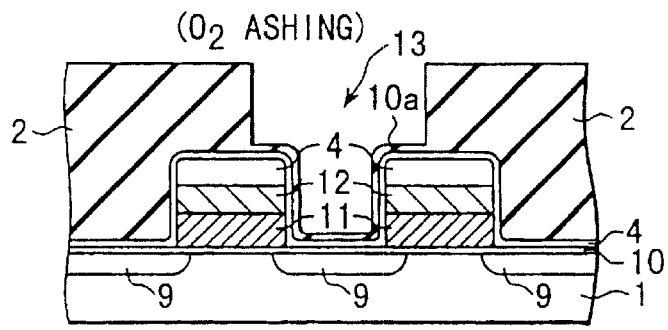

Then, as shown in FIG. 18C, the polysilane 6 is changed to the silicon oxide film simultaneously with removal of the resist 7 by performing $O_2$ ashing.

Figure 18D:
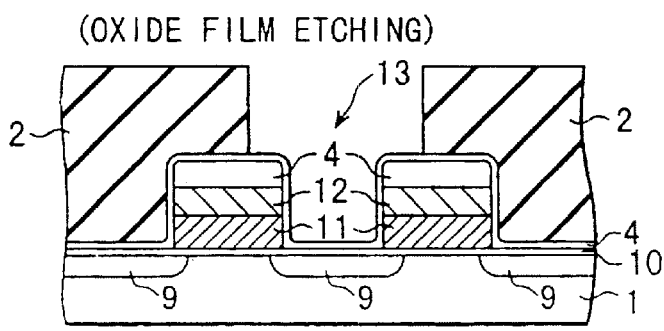

Then, as shown in FIG. 18D, the silicon oxide film 10a covering the gate electrode is removed by etching. For maximum prevention of erosion of the edge line portion of the silicon nitride film 4 covering the gate electrode, the silicon oxide film is etched under RIE conditions where the selective ratio with respect to the silicon nitride film can be raised. Since a satisfactory high etching selective ratio can be realized between the insulating film 2 changed from the polysilane 6 and the silicon oxide film 10a covering the gate electrode, only the silicon oxide film 10a can be removed by etching.

Figure 18E:
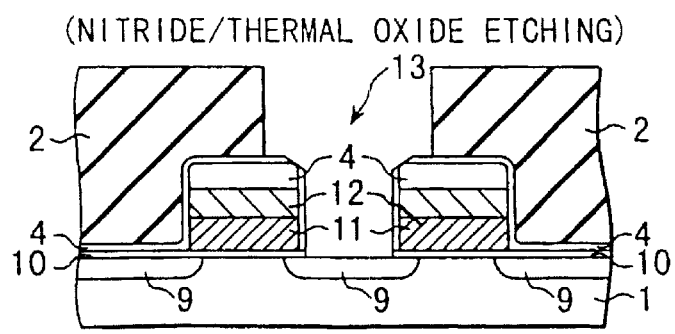

Then, as shown in FIG. 18E, anisotropic RIE is performed to remove the silicon nitride film 4 covering the source/drain diffusion layer 9 and the gate oxide film 10. At this time, the silicon nitride film 4 covering the edge line portion of the gate electrode is somewhat eroded. Since the amount of dry etching is very small, there is no apprehension that a short circuit will occur between the gate electrode and the source/drain diffusion layer 9.

Figure 19A:
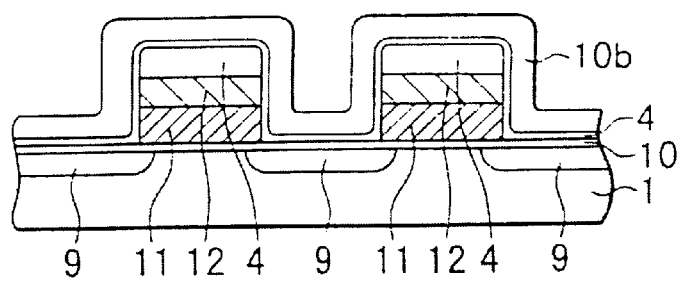
FIGS. 19A to 19D are cross sectional views showing steps of a manufacturing method of semiconductor devices according to a seventeenth embodiment.
Figure 19B:
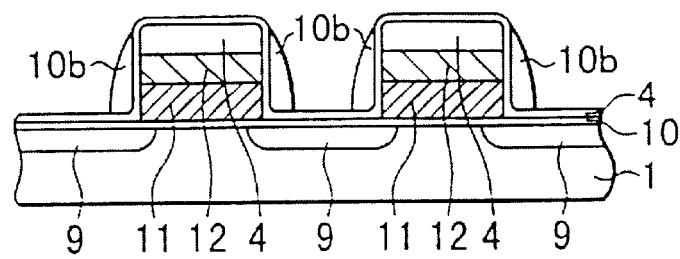

Referring to FIGS. 19A to 19D, a seventeenth embodiment of the present invention will now be described. The seventeenth embodiment is a modification of the sixteenth embodiment. As shown in FIG. 19A, the gate electrode on the silicon substrate 1 subjected to the step shown in FIG. 18A is covered with a thicker oxide film 10b. As shown in FIG. 19B, anisotropic RIE is performed to carry out etching back so that an oxide film 10b of the gate sidewall is formed.

Figure 19C:
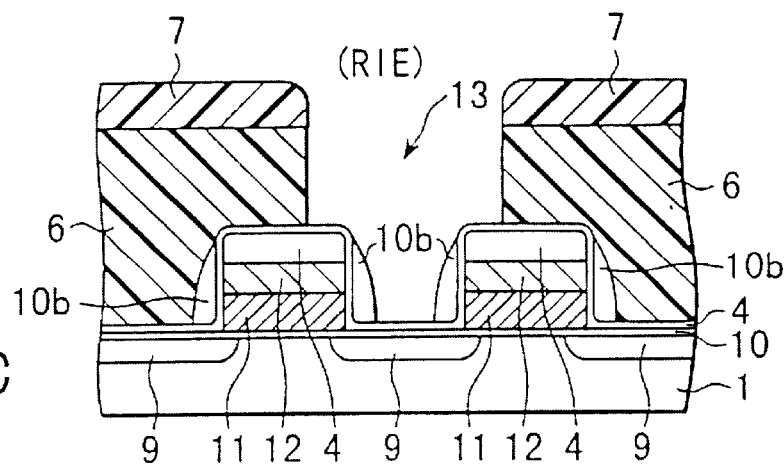
Figure 19D:
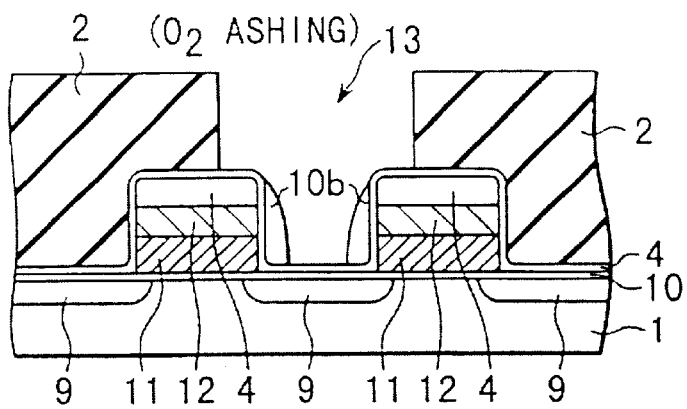

Then, as shown in FIG. 19C, a thick polysilane 6 is applied to form the pattern of the resist 7 having an opening corresponding to the self-aligned contact that will be established. The resist 7 is used as a mask when the anisotropic RIE is performed to form the self-aligned contact hole 13 in the polysilane 6. Since the oxide film 10b of the gate sidewall serves as an etching stopper in the anisotropic RIE step of the polysilane, erosion of the edge line portion of the gate electrode can be prevented.

Then, $O_2$ ashing is performed to remove the resist 7. Simultaneously, the polysilane 6 is changed to the insulating film 2 constituted by the silicon oxide film. The following steps similar to the steps following the step shown in FIG. 18C are performed so that a SAC connected to the source/drain diffusion layer 9 is formed.

A step has been described with which the thick oxide film 10b covering the gate is etched back to be the oxide film 10b of the gate sidewall shown in FIG. 19B. The etching back is not always required. If the etching conditions are optimized, a similar effect can be obtained when the thick oxide film 10b is employed as it is.

Figure 20A:
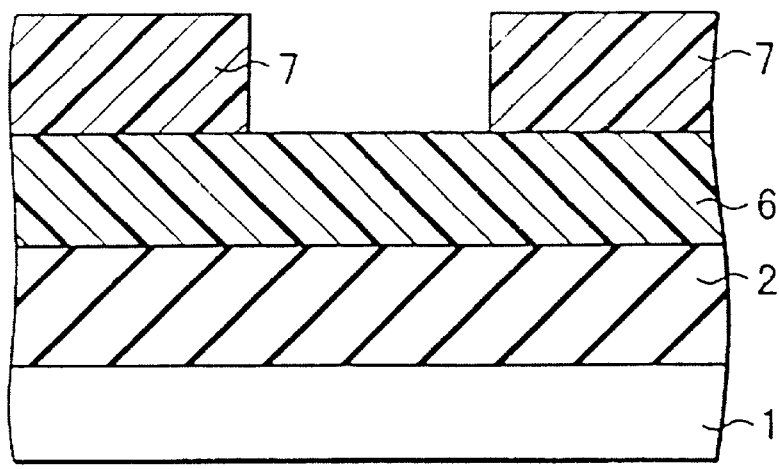
FIGS. 20A to 20C are cross sectional views showing steps of a manufacturing method of semiconductor devices according to an eighteenth embodiment.
Figure 20B:
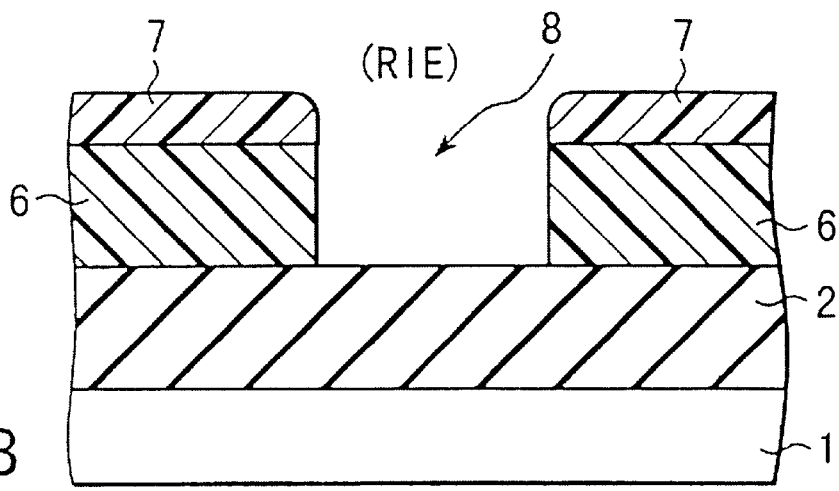
Figure 20C:
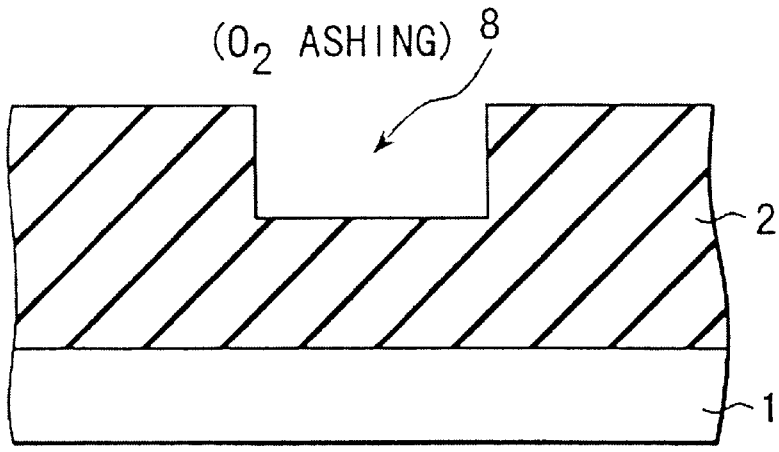

Referring to FIGS. 20A to 20C, an eighteenth embodiment of the present invention will now be described. In the eighteenth embodiment, polysilane is used to form the trench. As shown in FIG. 20A, the insulating film 2 constituted by the silicon oxide film is formed on the silicon substrate 1. Then, the surface of the insulating film 2 is coated with the polysilane 6.

The resist 7 is opened at the position on the polysilane 6 at which the metallization trench will be formed. The resist 7 is used as a mask to form the trench 8 by performing anisotropic RIE, as shown in FIG. 20B. Since the etching selective ratio of the polysilane 6 with respect to the insulating film 2 constituted by the silicon oxide film is very high, the insulating film 2 serves as the stopper in the anisotropic RIE step. As a result, the depth of the second trench 8 can be uniformed.

Then, as shown in FIG. 20C, $O_2$ ashing is performed to remove the resist 7. Simultaneously, the polysilane 6 is changed to a portion of the insulating film 2 constituted by the silicon oxide film. As described above, the polysilane 6 can be smoothed by coating. If the anisotropic RIE conditions are controlled, the etching stopper constituted by the insulating film 2 is not always required to form the trench 8 in the polysilane 6.

In general, a furthermore precise trench metallization in the first layer is required. If an aspect ratio (the ratio of the width of the metallization and the height of the same) higher than a predetermined value is required, a satisfactory result can be realized when the insulating film 2 is employed as the etching stopper as described in the eighteenth embodiment.

Although the eighteenth embodiment has the structure that the silicon oxide film is employed as the etching stopper, a similar effect can be obtained when an organic silicon oxide film or an inorganic silicon oxide film is employed. When the type of the polysilane 6 is selected to correspond to the base material, a furthermore satisfactory result can be obtained.

Referring to FIGS. 21A to 21E, a nineteenth embodiment of the present invention will now be described. In the nineteenth embodiment, a method of forming an opening portion in the insulating film mask having a high aspect ratio for use to form a deep silicon trench in the silicon substrate will now be described.

Figure 21A:
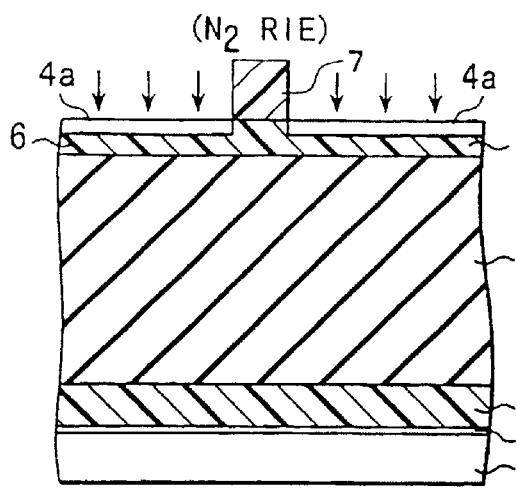
FIGS. 21A to 21E are cross sectional views showing steps of a manufacturing method of semiconductor devices according to a nineteenth embodiment.

As shown in FIG. 21A, a thermal oxide film 10 serving as an etching stopper is formed on the silicon substrate 1. Then, the polysilane 6 which is a lower layer is formed on the thermal oxide film 10. Then, an insulating film 2 constituted by, for example, a silicon oxide film, is deposited on the polysilane 6 which is the lower layer. Then, the polysilane 6a which is an upper layer and which serves as an etching stopper is again applied. Thus, a reversed pattern of the resist 7 is formed to cover the position at which the deep trench will be formed. The resist 7 is used as a mask when $N_2$ RIE or implantation of $N_2$ ions is performed so that the exposed surface of the polysilane 6a, which is the upper layer, is changed to the silicon nitride film 4a.

After the resist 7 has been removed, the silicon nitride film 4a is used as a mask when anisotropic RIE is performed under conditions that the flow rate ratio of $Cl_2/O_2$ is 75/10 sccm, the pressure is 75 mTorr and the applied high frequency electric power is 300 W with which the etching selective ratio of the polysilane is high with respect to the silicon nitride film. Thus, the polysilane 6a, which is the upper layer and which serves as the anti-reflective film, is opened.

Then, anisotropic RIE of the silicon nitride film 4a is performed under conditions that the flow rate ratio of $C_4F_8/CO/Ar$ is 10/50/200 sccm, the pressure is 40 mTorr and the applied high frequency electric power is 1400 W with which a high etching selective ratio of the insulating film 2 constituted by the silicon oxide film with respect to the silicon nitride film 4a can be realized. Thus, a trench 14a that reaches the lower polysilane 6 is formed, as shown in FIG. 21B.

Since a required etching selective ratio with respect to the polysilane 6 can be realized, the lower polysilane 6 serves as the etching stopper. Thus, the trench 14a can be formed with a satisfactory controllability.

Then, conditions under which a high etching selective ratio of the lower polysilane 6 with respect to the silicon nitride film 4a and the thermal oxide film 10 can be realized are employed to form the trench 14b such that the thermal oxide film 10 is used as an etching stopper, as shown in FIG. 21 C.

Figure 21D:
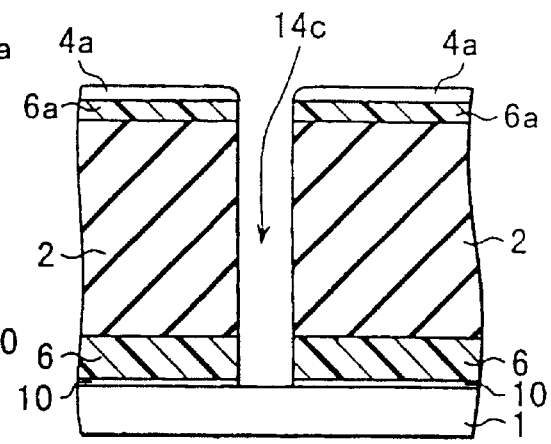
Figure 21B:
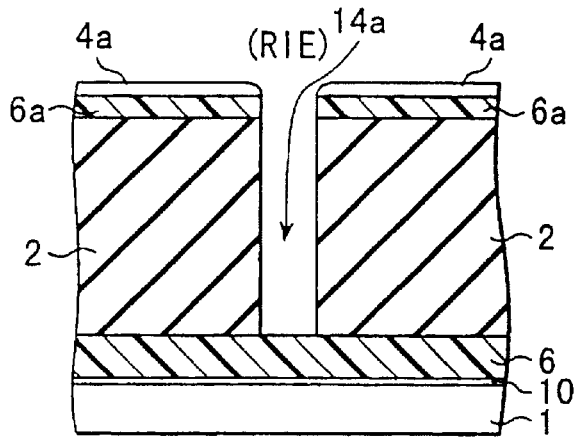

Then, conditions under which a high etching selective ratio of the thermal oxide film 10 with respect to the silicon nitride film can be realized are employed to remove the thermal oxide film 10, as shown in FIG. 21D. At this time, the surface of the silicon substrate 1 serves as a stopper to form the trench 14c which reaches the surface of the silicon with a satisfactory controllability.

Figure 21E:
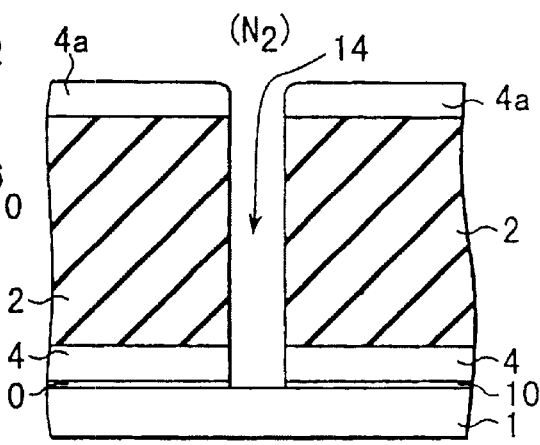
Figure 21C:
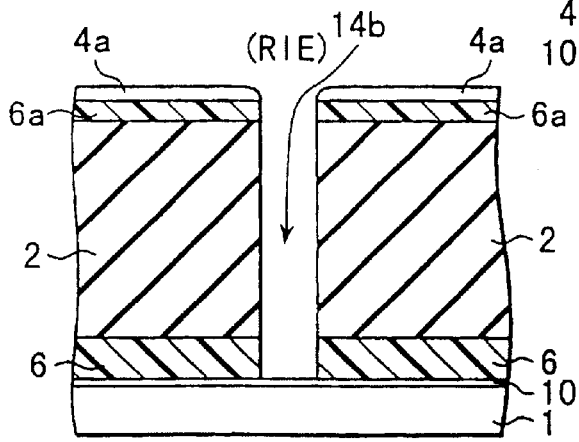

Finally, as shown in FIG. 21E, heat treatment is performed in a $N_2$ atmosphere to change the upper and lower polysilane portions 6a and 6 into silicon nitride films 4a and 4. Thus, a deep trench mask 14 can be formed in which a trench having a high aspect ratio is formed in the insulating film 2 vertically sandwiched by the silicon nitride films 4a and 4 through the silicon thermal oxide film 10. Note that the final process may be performed before the thermal oxide film 10 is removed. The upper silicon nitride film 4a may be removed.

The method of forming the deep trench mask according to the nineteenth embodiment is characterized in that the process is controlled several times by the etching stopper during the anisotropic RIE step. The method enables the trench process of the etching mask to a depth that has been impossible to be performed with a satisfactory accuracy using conventional technology.

As an alternative to the heat treatment that is performed finally in the $N_2$ atmosphere, the continuous process is performed under a condition in which $N_2$ radicals are increased by changing the anisotropic RIE conditions to conditions so that the flow rate of $N_2$ is 100 sccm, the pressure is 150 mTorr, and the applied high frequency electric power is 100 W. Thus, the polysilane portions 6a and 6 are changed to the silicon nitride films. In the foregoing case, the number of processing steps can be reduced.

Figure 22A:
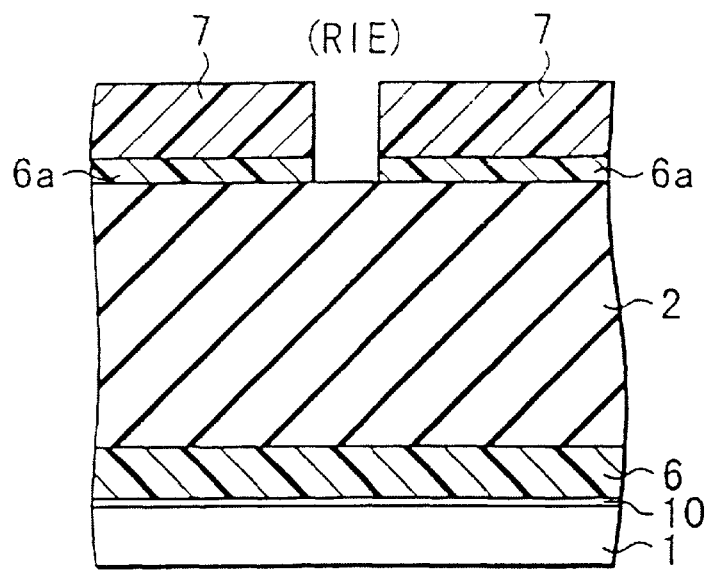
FIGS. 22A to 22C are cross sectional views showing steps of a manufacturing method of semiconductor devices according to a twentieth embodiment.
Figure 22B:
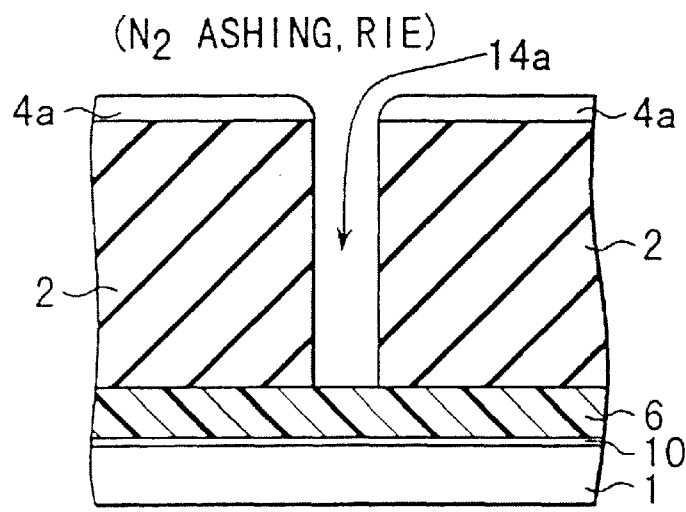
Figure 22C:
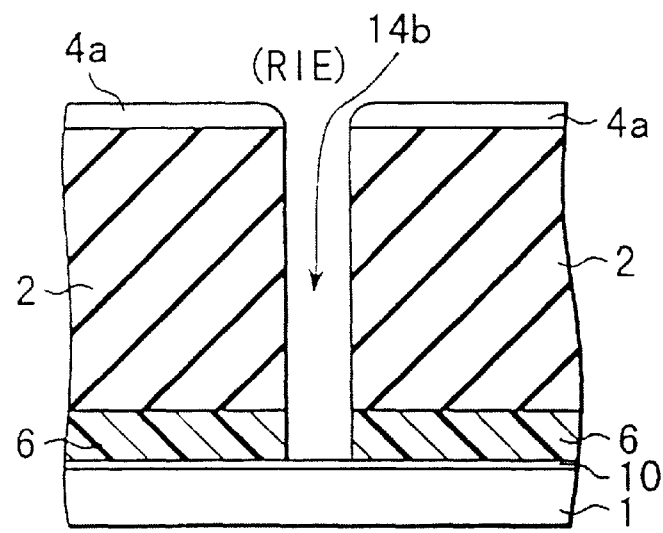

Referring to FIGS. 22A to 22C, a twentieth embodiment of the present invention will now be described. As shown in FIG. 22A, the thermal oxide film 10 serving as the etching stopper is formed on the silicon substrate 1. Then, the lower polysilane 6 is applied, and the insulating film 2 constituted by the silicon oxide film is deposited. Then, the upper polysilane 6a serving as the anti-reflective film is applied so that the pattern of the resist 7 having an opening corresponding to the portion in which the trench will be formed is formed. Then, the resist 7 is used as the etching mask so that the upper polysilane 6a which serves as the anti-reflective film is opened.

Then, as shown in FIG. 22B, $N_2$ ashing is performed to remove the resist 7. Simultaneously, the upper polysilane 6a is changed to the silicon nitride film 4a. The silicon nitride film 4a is used as a mask when the anisotropic RIE step is performed to form the trench 14a which reaches the lower polysilane 6.

Then, as shown in FIG. 22C, the conditions under which the anisotropic RIE is performed are changed to form the trench 14b in the lower polysilane 6 such that the thermal oxide film 10 is used as the etching stopper. Then, a process similar to the $N_2$ ashing is performed to change the lower polysilane 6 into the silicon nitride film. Finally, the thermal oxide film 10 is removed so that the deep trench mask which reaches the surface of the silicon substrate 1 is formed. Note that the $N_2$ ashing step may be performed after the thermal oxide film 10 has been removed.

The step of changing the dry etching conditions according to the twentieth embodiment may be performed by the method according to the nineteenth embodiment. Since each layer serves as the etching stopper, an etching mask exhibiting a satisfactory controllability and having a high aspect ratio can be formed similarly to the nineteenth embodiment.

Figure 23A:
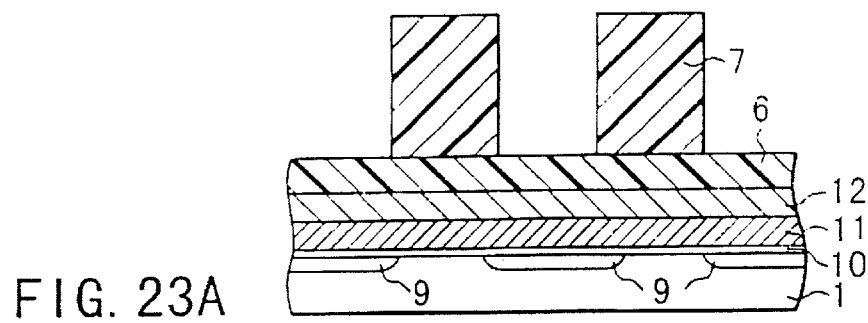
FIGS. 23A to 23C are cross sectional views showing steps of a manufacturing method of semiconductor devices according to a twenty-first embodiment.
Figure 23B:
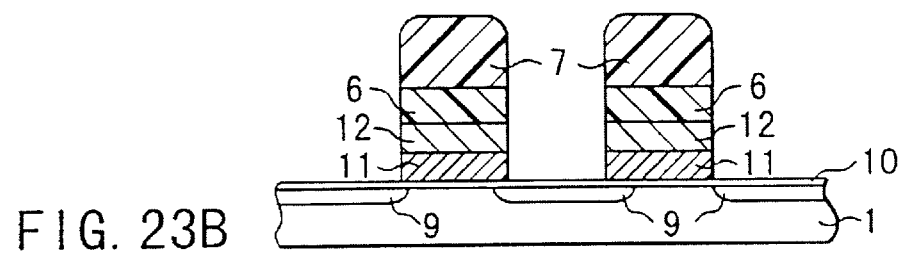
Figure 23C:
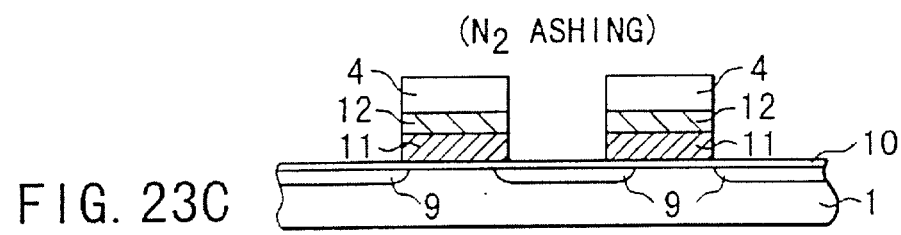

Referring to FIGS. 23A to 23C, a twenty-first embodiment will now be described. The twenty-first embodiment is structured such that the pattern of the gate electrode of the MOS transistor is formed on the silicon substrate 1 by using the polysilane 6.

As shown in FIG. 23A, a gate insulating film constituted by the thermal oxide film 10 is formed on the surface of the silicon substrate 1. Then, a film composed of the polysilicon 11 and tungsten 12 is, as the material of the gate electrode, formed on the gate insulating film. Then, the overall surface of the film is coated with the polysilane 6. Then, the pattern of the resist 7 is formed to cover the portion in which the gate electrode will be formed.

Then, as shown in FIG. 23B, the resist 7 is used as the etching mask when the anisotropic RIE step is performed so that the pattern of a laminated film composed of the polysilicon 11, the tungsten 12 and the polysilane 6 is formed as the gate electrode.

Then, as shown in FIG. 23C, $N_2$ ashing is performed to remove the resist 7. Simultaneously, the polysilane 6, the pattern of which has been formed on the uppermost layer of the gate electrode, is changed to the silicon nitride film 4. The gate electrode having the silicon nitride film 4 is used as the mask of the gate electrode to form the source/drain diffusion layer 9 in a self-aligned manner by performing implantation of ions and hydrogen. As a result, a MOS transistor on the silicon substrate can be obtained. Note that the polysilicon 11 and the tungsten 12 of the gate electrode are converted to tungsten suicide because of the heat treatment.

The conventional technology requires two steps of processes with which the resist is used as a mask to form the pattern of the silicon nitride film and the patterns of tungsten and polysilicon are formed by using the silicon nitride film as the mask to form the pattern of a laminated film composed of polysilicon, tungsten and the silicon nitride film as the gate electrode.

In the twenty-first embodiment, the conditions under which the polysilane 6 is etched are such that the flow rate ratio of $Cl_2/O_2$ is 75 sccm/10 sccm, the pressure is 75 mTorr and the applied high frequency electric power is 300 W. Under the foregoing conditions, the patterns of the tungsten 12 and the polysilicon 11 can be simultaneously formed. As a result, the number of processing steps can be reduced and the gate electrode can be fabricated with satisfactory controllability; Note that the formation of the tungsten silicide may be performed first to simultaneously form the patterns of the polysilicon layer and the tungsten silicide.

Figure 24:
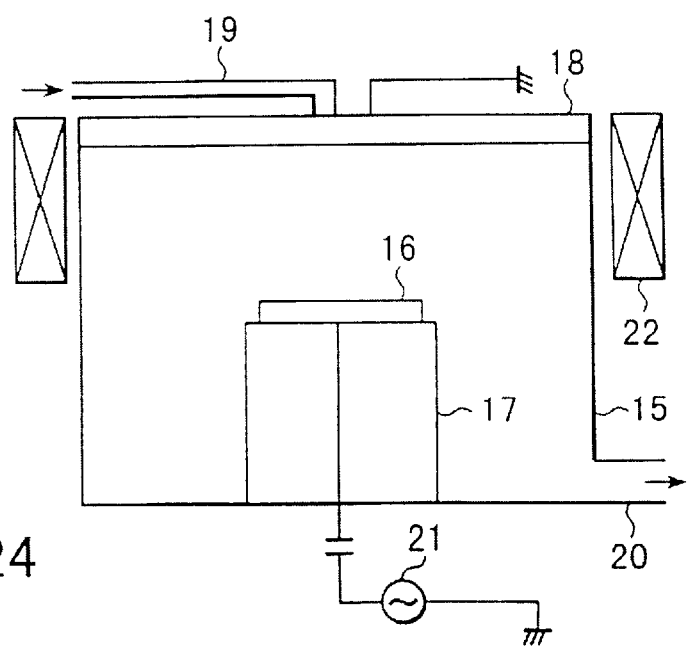
FIG. 24 is a diagram showing a dry etching apparatus for use in the manufacturing method of semiconductor devices according to the present invention.

The structure of a dry etching machine to perform the RIE and the ashing step in each embodiment is shown in FIG. 24. The dry etching machine incorporates a vacuum chamber 15, a subject 16 such as silicon wafer, which must be processed, a retaining frame 17 on which the subject 16 is placed, an opposite electrode 18, a gas introducing pipe 19, an exhaust opening 20, a high-frequency-wave source 21 and a magnet 22.

The retaining frame 17 has a regulating mechanism to be capable of controlling the temperature of the subject 16 which must be processed. The gas introducing pipe 19 is connected to the upper inner wall of the vacuum chamber 15 serving as the opposite electrode 18. Gas is introduced into the vacuum chamber 15 through the gas introducing pipe 19. The valve at the exhaust opening 20 is operated to adjust the pressure.

After the pressure has been stabilized, high frequency waves are applied from the high-frequency-wave source 21 under the retaining frame 17 so that plasma is generated in the vacuum chamber 15. The magnet 22 is joined to the vacuum chamber 15 to form a dense magnetic field in the vacuum. Simultaneously, an anisotropic characteristic is imparted to ions in the plasma to etch the subject 16 which must be processed.

The dry etching machine shown in FIG. 29 is a magnetron RIE machine. Alternatively, another dry etching machine may be employed which is exemplified by a machine using ECR (Electron Cyclotron Resonance), helicon or inductance-coupled-type plasma.

Finally, a method of forming an organic silicon film by performing a coating step using polysilane and the like will now be described. Initially, an organic silicon compound (generally called "organic silicon" in the claims) having the main chains, which are bondings of silicon and silicon, is dissolved in organic solvent so that material of the solution is prepared.

The organic silicon compound, having the main chains which are bondings of silicon, and silicon are exemplified by polysilane expressed by a general formula $(SiR_{11}R_{12})$, where R11 and R12 are each a hydrogen atom or substituted or non-substituted aliphatic hydrocarbon or aromatic hydrocarbon or the like having 1 to 20 carbon atoms.

Polysilane may be in the form of a single polymer resist a copolymer. Alternatively, polysilane may have a structure that two or more types of polysilane materials are bonded to one another through an oxygen atom, a nitrogen atom, a fatty acid group or an aromatic group. The organic silicon compound is exemplified by the following chemical formulas [1—1] to [1–114]:

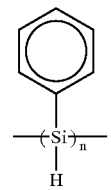 [1-1]

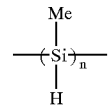 [1-2]

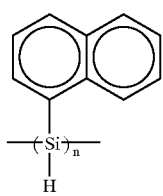 [1-3]

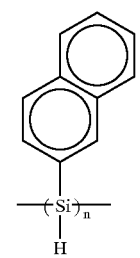 [1-4]

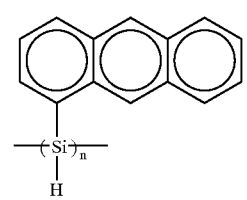 [1-5]

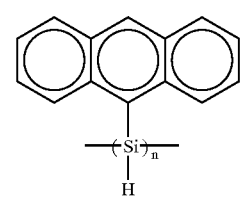 [1-6]

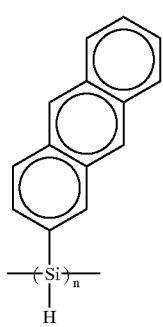 [1-7]

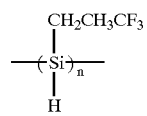 [1-8]

[1-9]
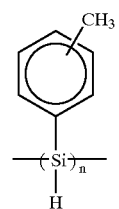
[1-10]
[1-11]
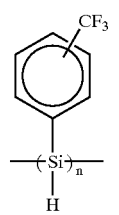
[1-12]
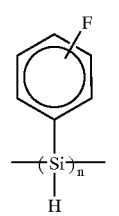
[1-13]
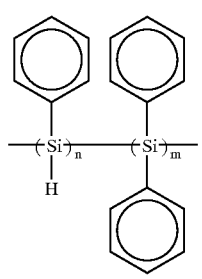
[1-14]
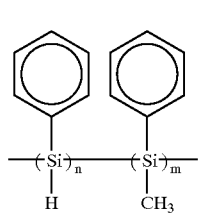
[1-15]
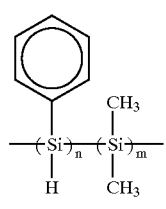
[1-16]
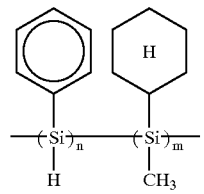
[1-17]
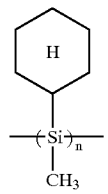
[1-18]
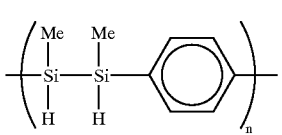
[1-19]
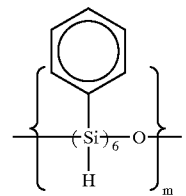
[1-20]
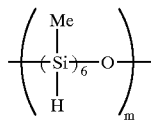
[1-21]
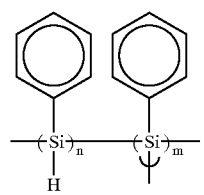
[1-22]
[1-23]
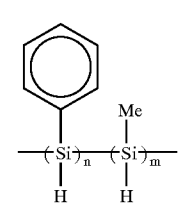

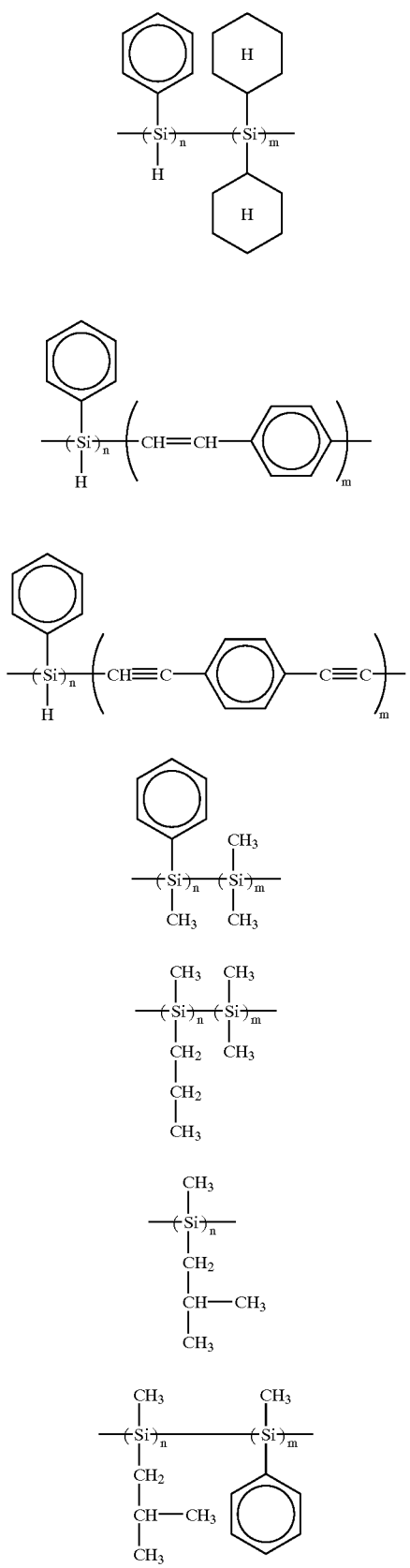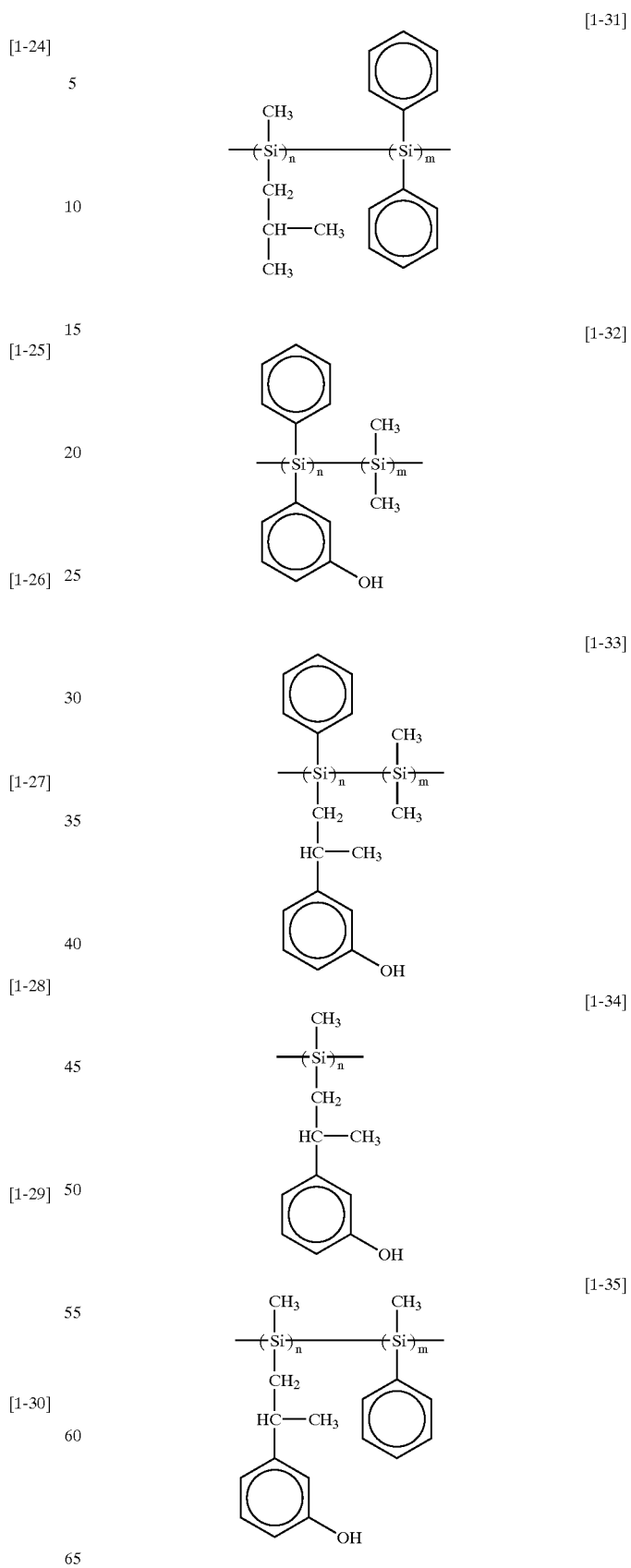

[1-36] 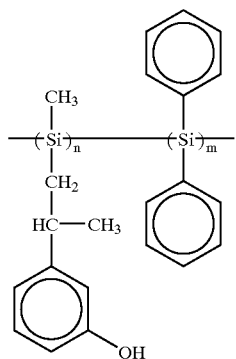
[1-37] 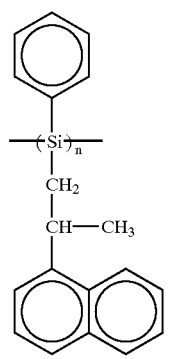
[1-38] 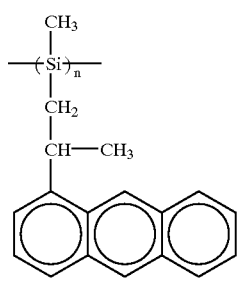
[1-39] 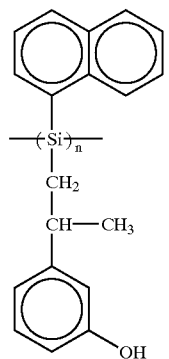
[1-40] 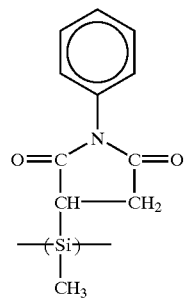
[1-41] 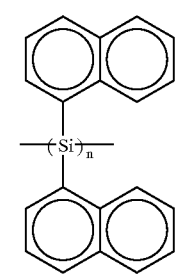
[1-42] 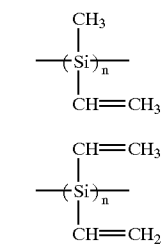
[1-43] 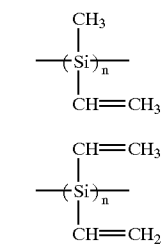
[1-44] 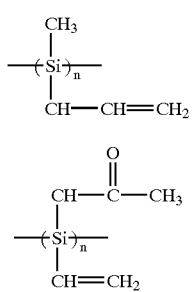
[1-45] 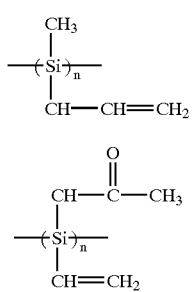
[1-46] 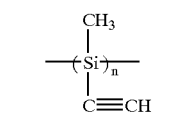
[1-47] 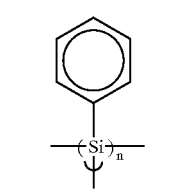
[1-48] 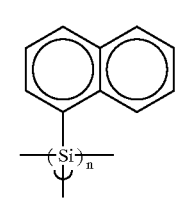

[1-49]
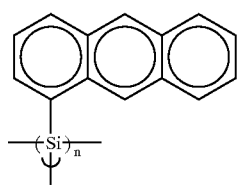
[1-50]
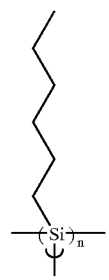
[1-51]
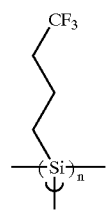
[1-52]
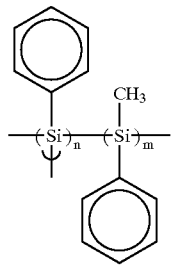
[1-53]
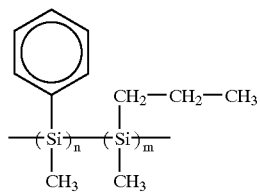
[1-54]
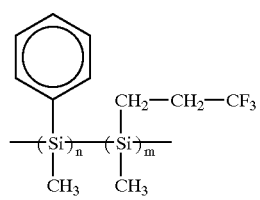
[1-55]
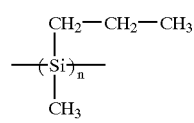
[1-56]
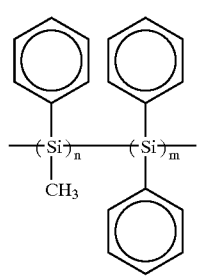
[1-57]
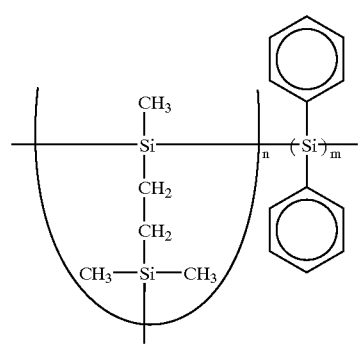
[1-58]
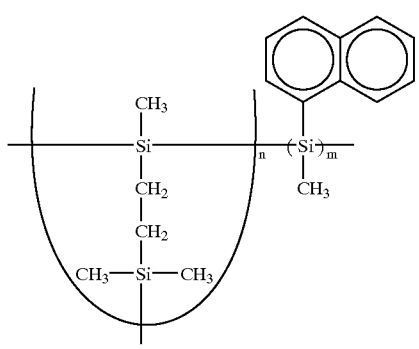
[1-59]
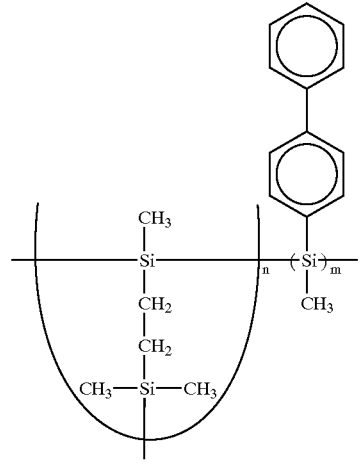

[1-60]
[1-61]
[1-62]
[1-63]
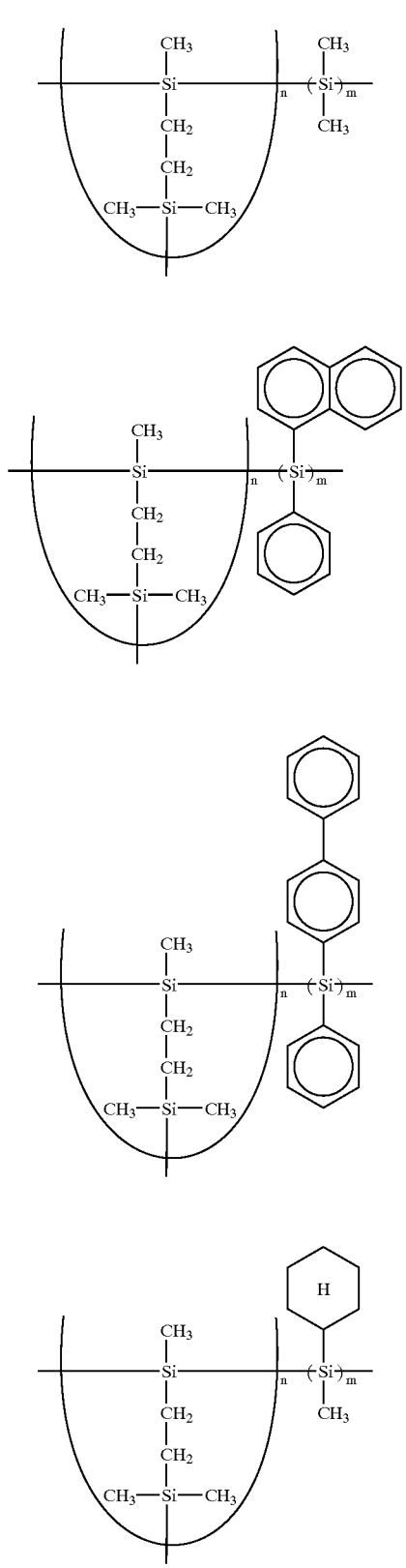
[1-64]
[1-65]
[1-66]
[1-67]
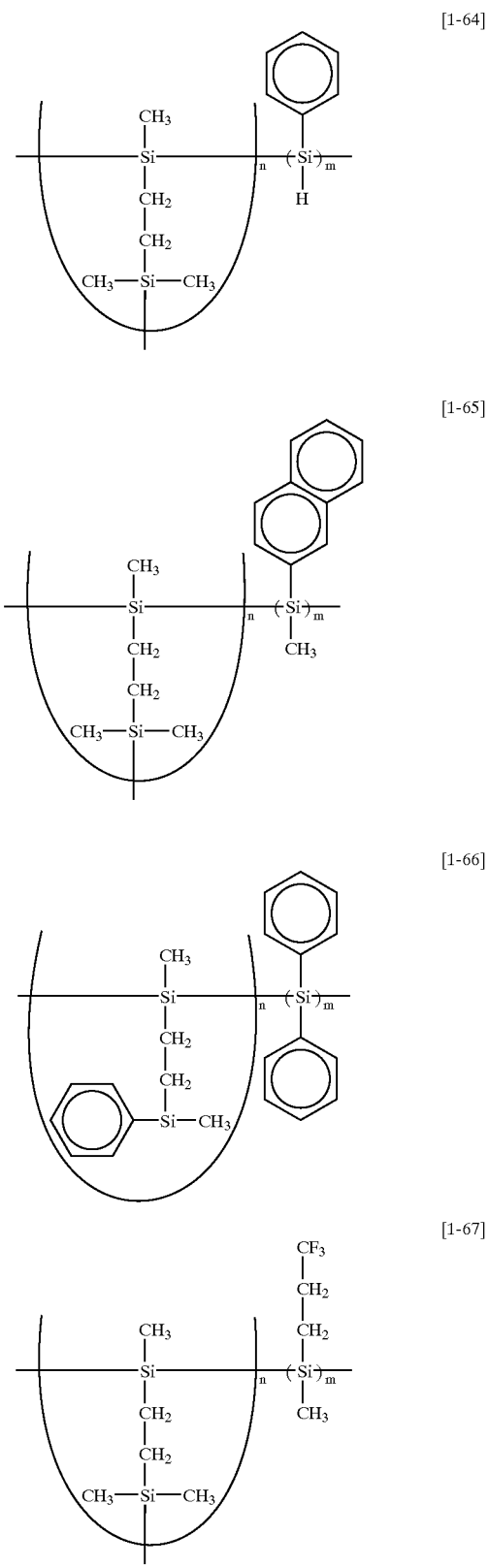

[1-68]
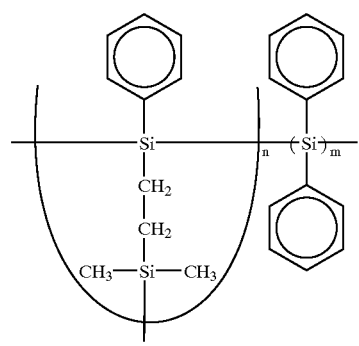
[1-69]
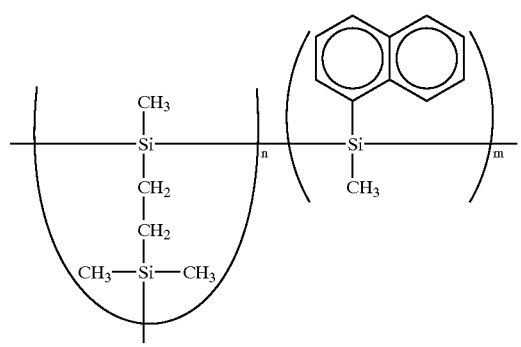
[1-70]
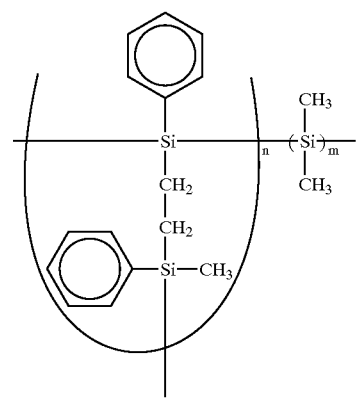
[1-71]
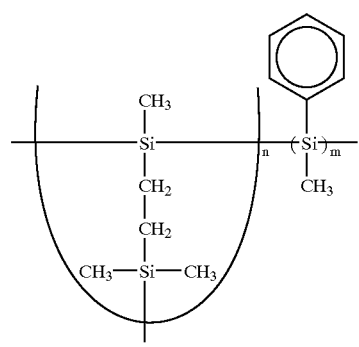
[1-72]
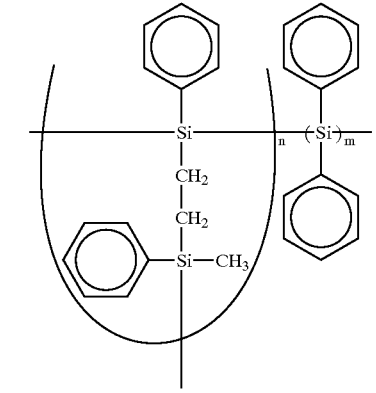
[1-73]
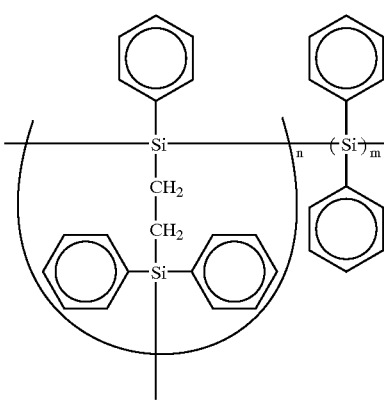
[1-74]
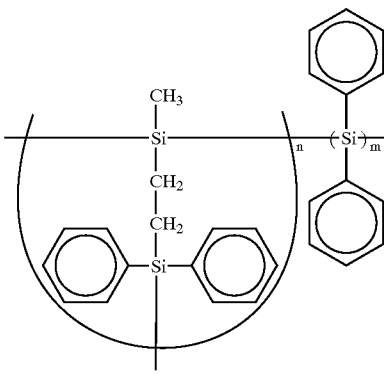
[1-75]
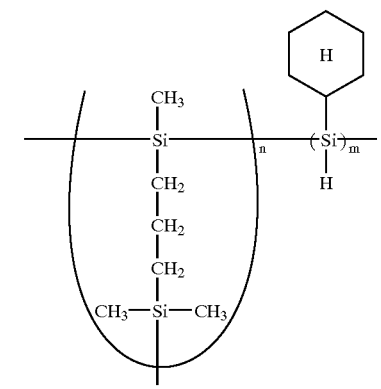

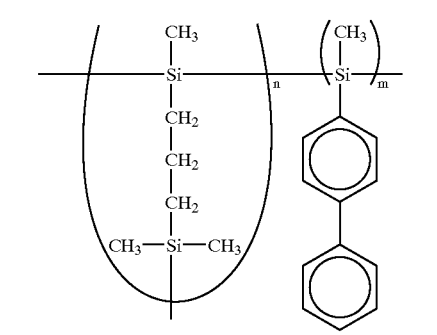 [1-76]
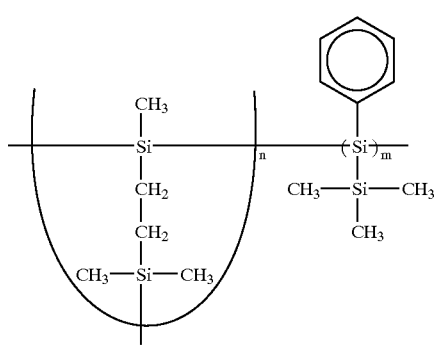 [1-77]
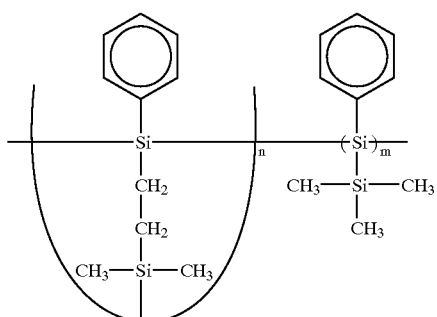 [1-78]
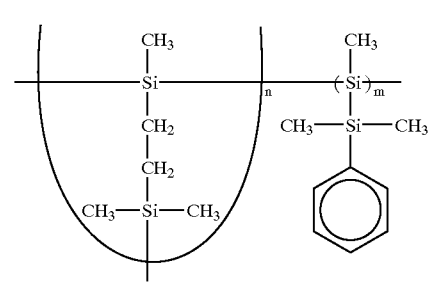 [1-79]
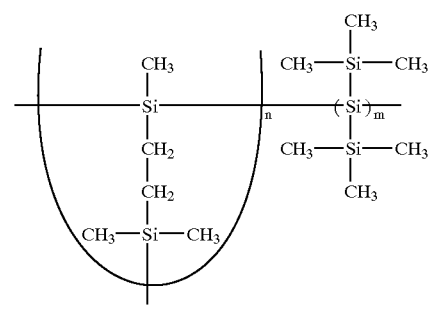 [1-80]
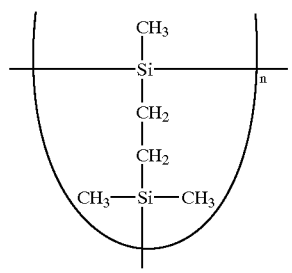 [1-81]
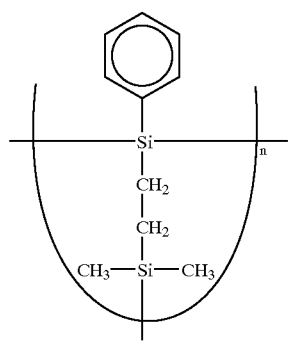 [1-82]
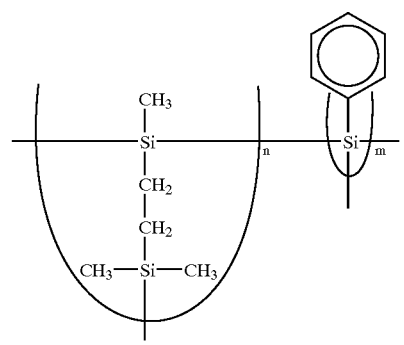 [1-83]
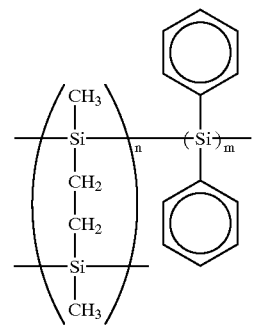 [1-84]
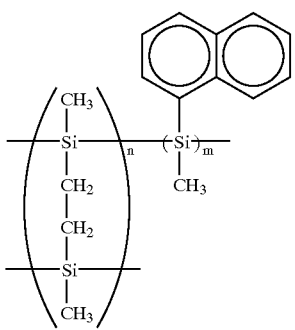 [1-85]

[1-86] 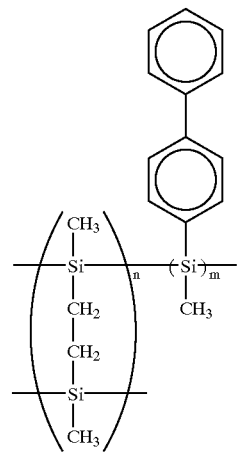
[1-87] 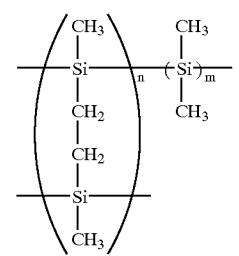
[1-88] 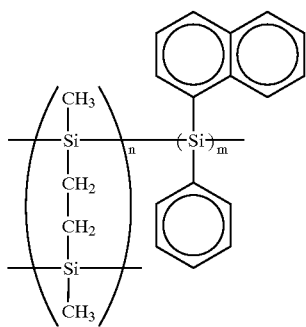
[1-89] 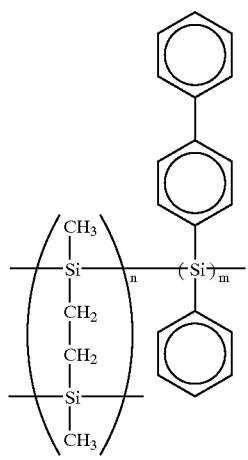
[1-90] 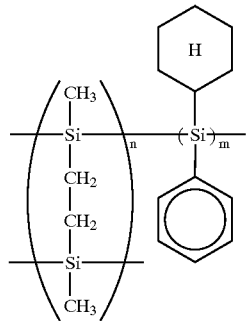
[1-91] 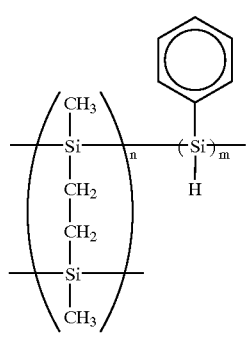
[1-92] 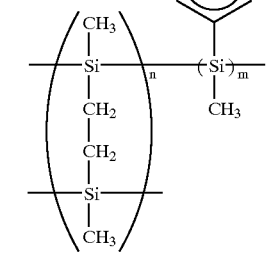
[1-93] 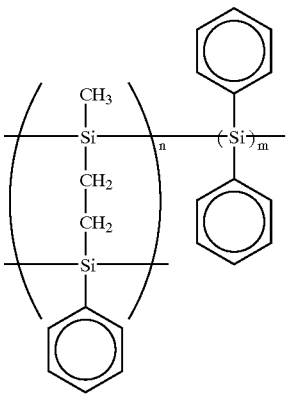

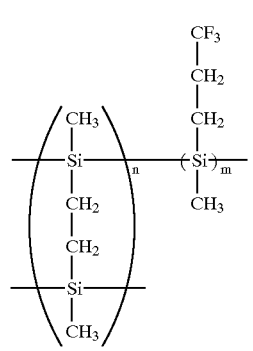 [1-94]
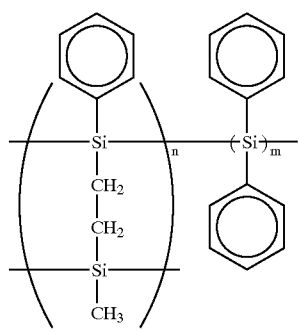 [1-95]
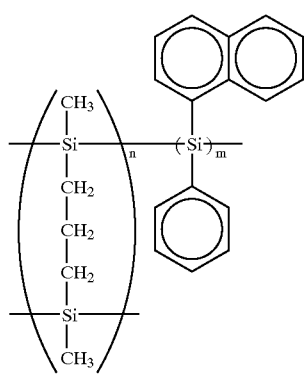 [1-96]
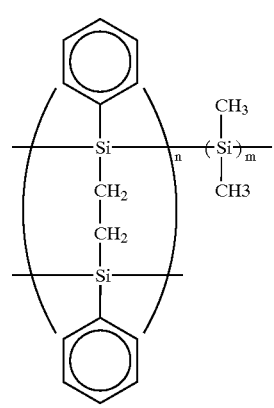 [1-97]
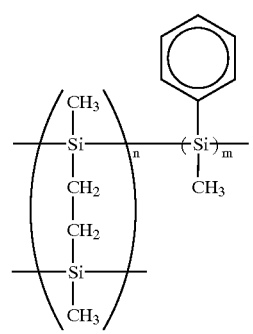 [1-98]
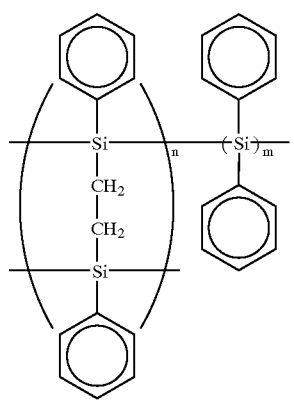 [1-99]
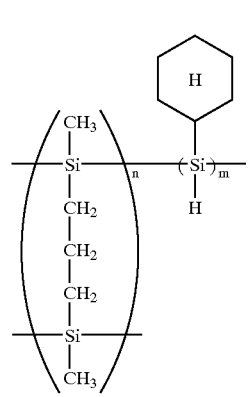 [1-100]
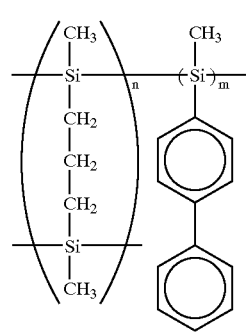 [1-101]

[1-102]
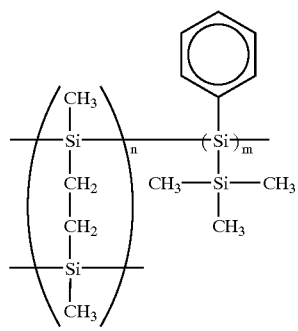
[1-103]
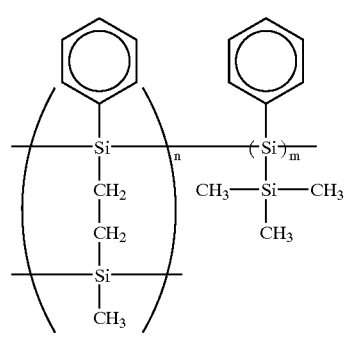
[1-104]
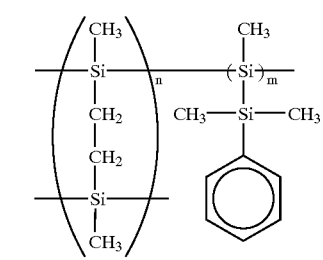
[1-105]
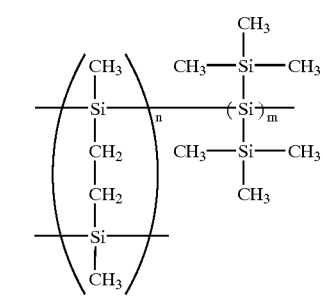
[1-106]
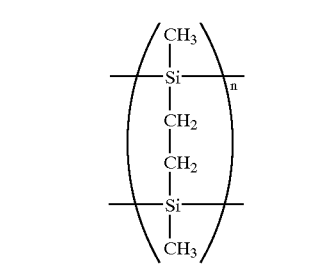
[1-107]
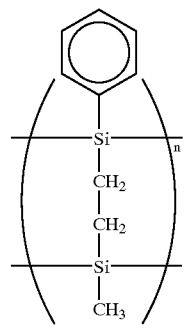
[1-108]
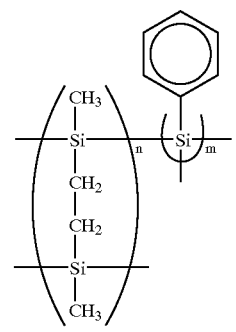
[1-109]
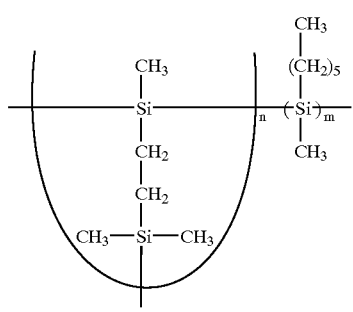
[1-110]
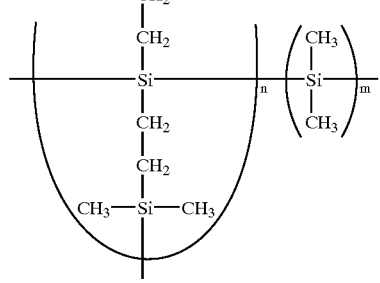

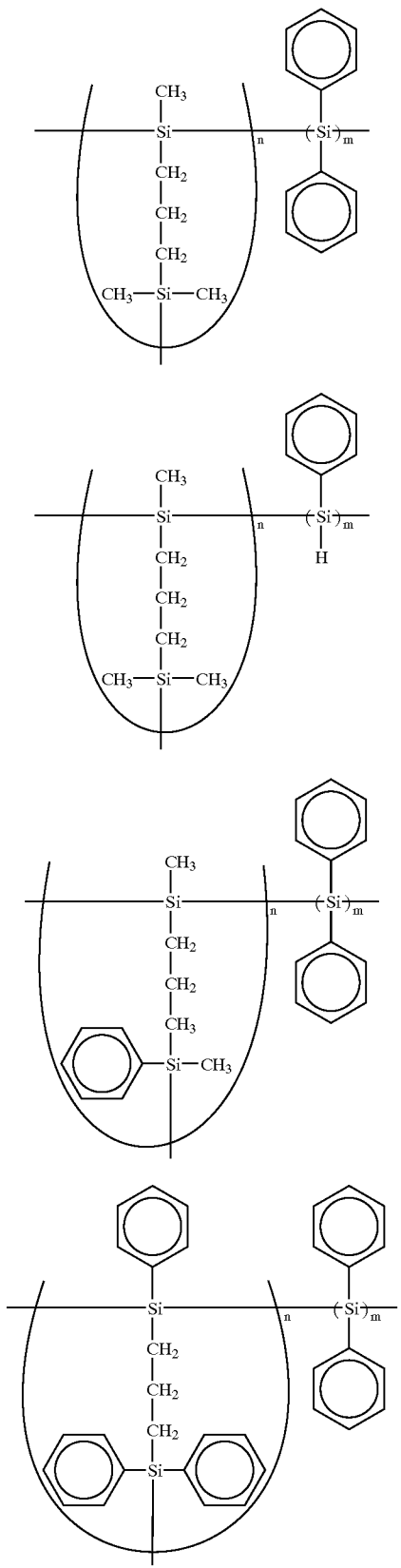

where m and n are positive integers.

Although the weight average molecular weight of each compound is not limited, it is preferable that a range from 200 to 100,000 is satisfied. The reason for this will now be described. If the molecular weight is smaller than 200, the organic silicon film is dissolved by the solvent for the resist. If the molecular weight is larger than 100,000, dissolution in organic selective cannot be satisfactorily performed. Thus, formation of the material of the solution cannot easily be performed.

The organic silicon compound is not limited to one type. A plurality of types of compounds may be mixed. To improve preservation stability if necessary, addition of the following materials is permitted: a thermal polarization inhibitor, an adhesion enhancing agent for improving adhesion to the silicon insulating film, ultraviolet absorbing dye that is effective to prevent reflected light from the silicon insulating film into the resist film, a polymer such as polysulfon or polybenzimidazole for absorbing ultraviolet rays, a substance showing conductivity owing to a conductive substance, light or heat or a crosslinking material for crosslinking the organic silicon compound.

The conductive substance is exemplified by organic sulfonic acid, organic carboxylic acid, polyalcohol, polythiol (for example, iodine or bromine), $SbF_5$, $PF_5$, $BF_5$ and $SnF_5$.

The substance showing conductivity owing to the energy of light or heat is exemplified by carbon cluster ($C_{60}$ or $C_{70}$), cyanoanthracene, dicyanoanthracene, triphenylpyryum, tetrafluoroborate, tetracyanoquinodimethane, tetracyanoethylene, futhalimidotriphrate, perchloropentacyclododecane, dicyanobenzen, benzotrynyl, trichloromethyltriazine, benzoilperoxide, benzophenon tetra carboxylic acid and t-butylperoxide. The substance is exemplified by the following compounds:

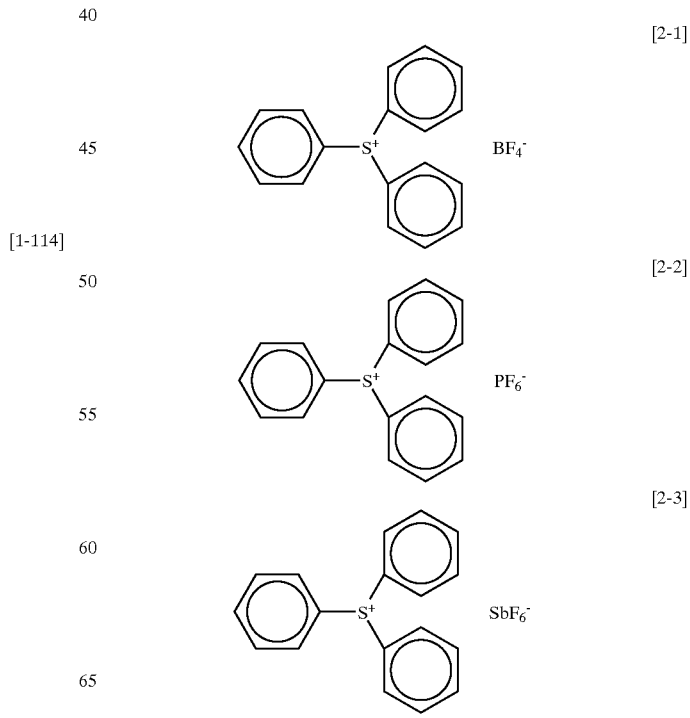

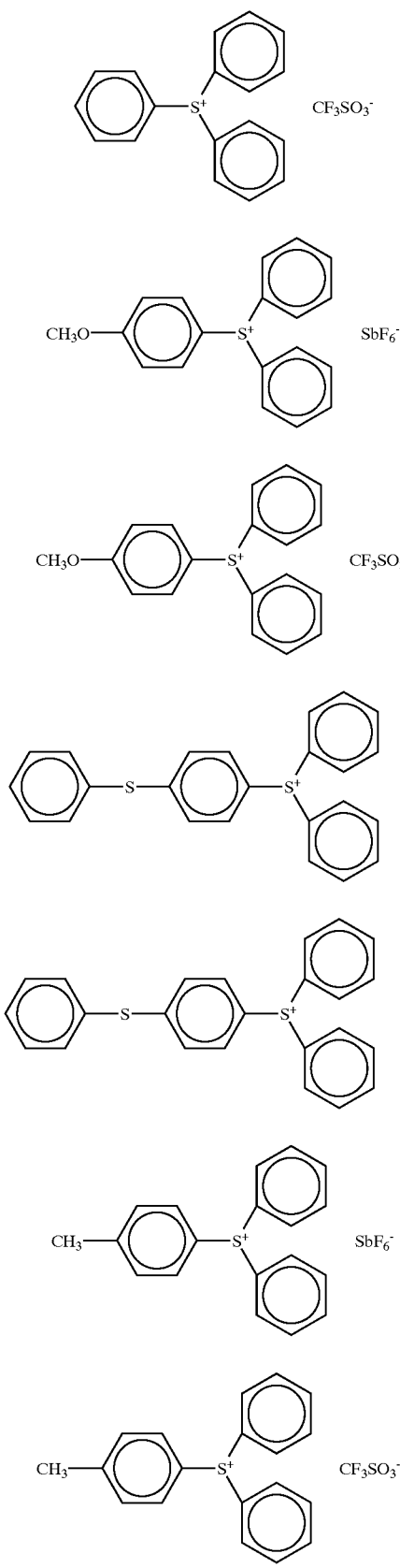
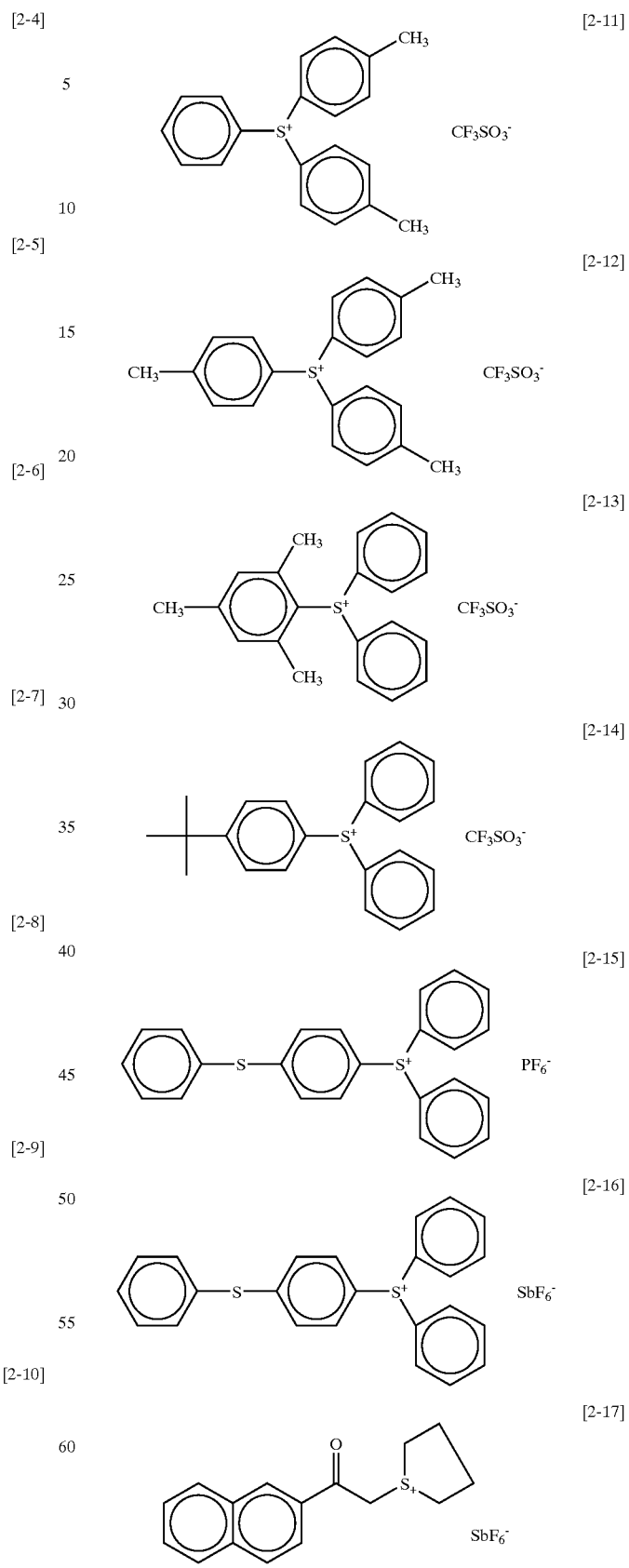

-continued
[2-18] 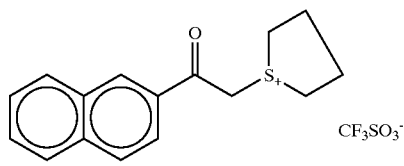 CF₃SO₃⁻
[2-19] 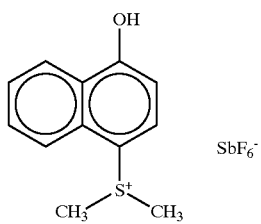 SbF₆⁻
[2-20] 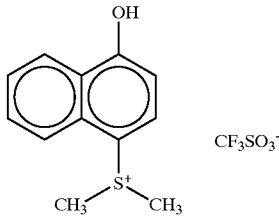 CF₃SO₃⁻
[2-21] 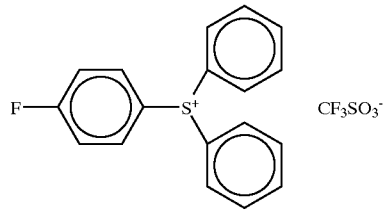 CF₃SO₃⁻
[2-22] 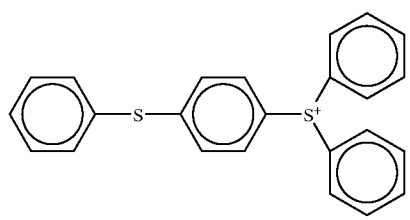 PF₆⁻
[2-23] 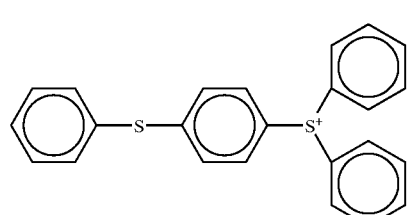 SbF₆⁻
[2-24] 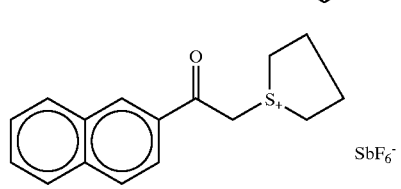 SbF₆⁻
[2-25] 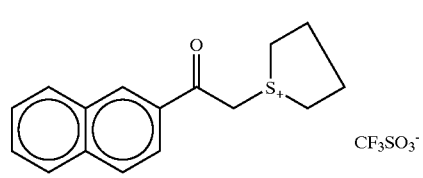 CF₃SO₃⁻
-continued
[2-26] 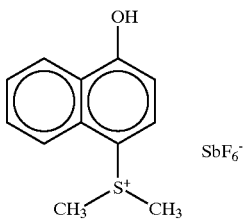 SbF₆⁻
[2-27] 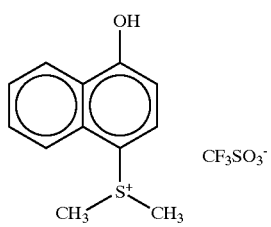 CF₃SO₃⁻
[2-28] 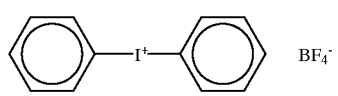 BF₄⁻
[2-29] 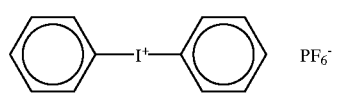 PF₆⁻
[2-30] 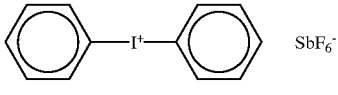 SbF₆⁻
[2-31] 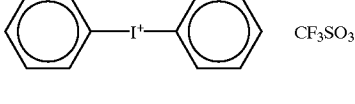 CF₃SO₃⁻
[2-32] 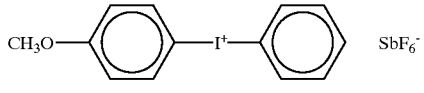 SbF₆⁻
[2-33] 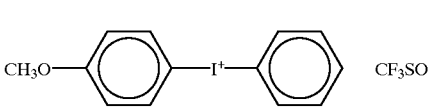 CF₃SO₃⁻
[2-34]  BF₄⁻
[2-35]  PF₆⁻
[2-36] 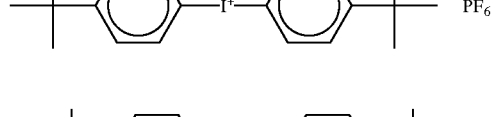 SbF₆⁻
[2-37] 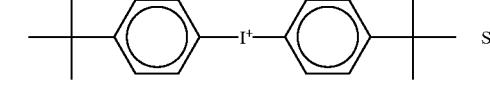 CF₃SO₃⁻

-continued

[2-38]

[2-39]

[2-40]

[2-41]

[2-42]

[2-43]

-continued

[2-44]

[2-45]

[2-46]

[2-47]

[2-48]

[2-49]

[2-50]

[2-51]

-continued
[2-52] 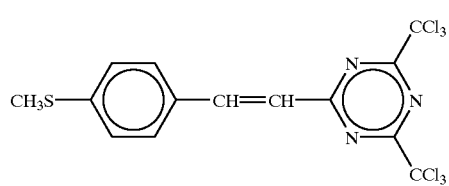
[2-53] 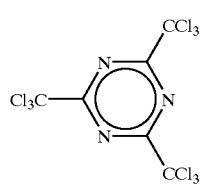
[2-54] 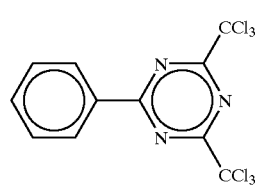
[2-55] 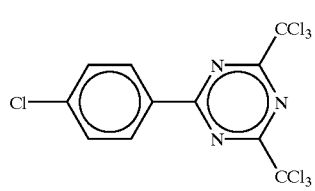
[2-56] 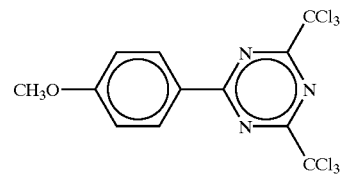
[2-57] 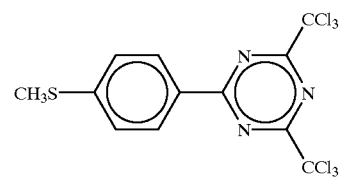
[2-58] 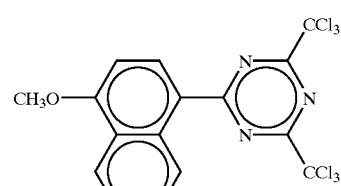
[2-59] 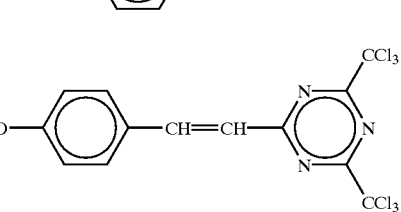
-continued
[2-60] 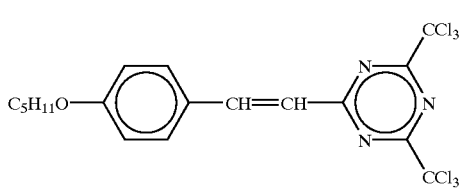
[2-61] 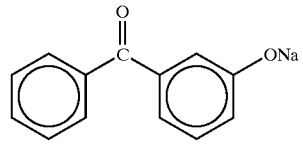
[2-62] 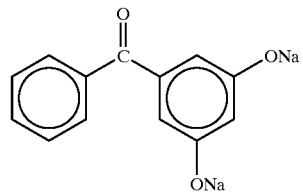
[2-63] 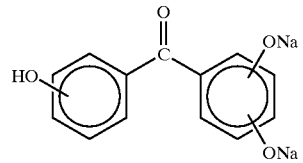
[2-64] 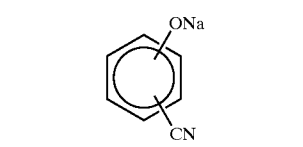
[2-65] 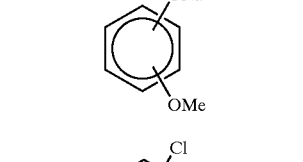
[2-66] 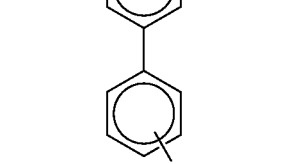
[2-67] C$_2$H$_5$ONa
[2-68] 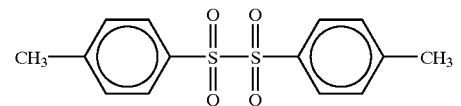
[2-69] 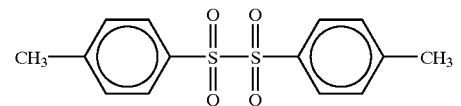

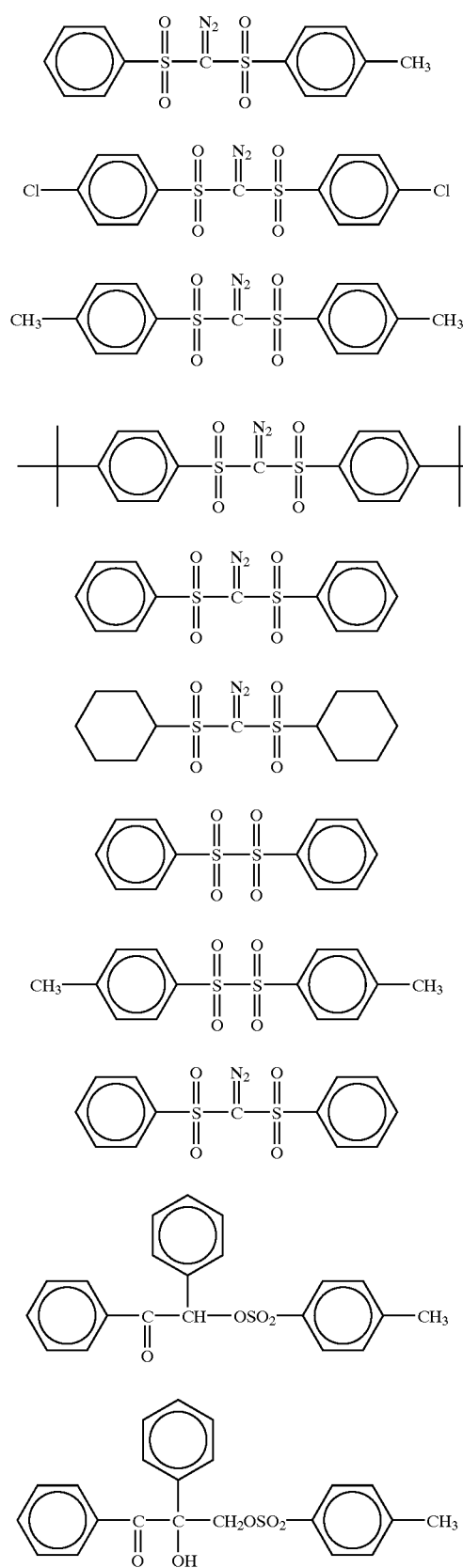
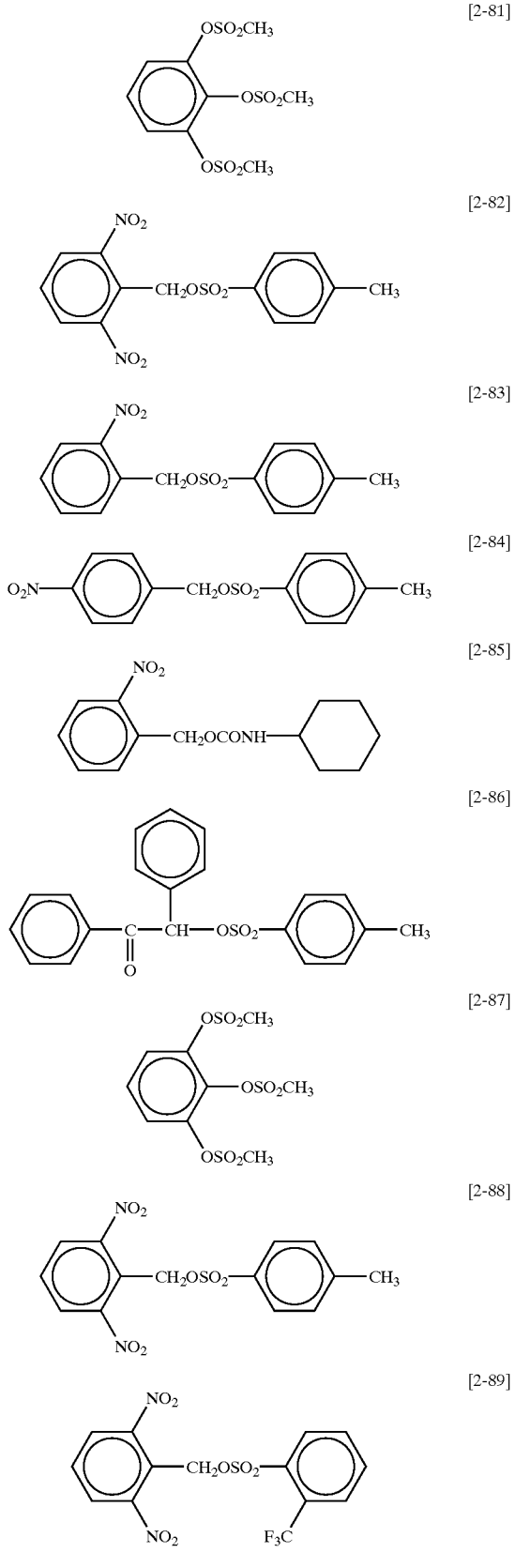

-continued
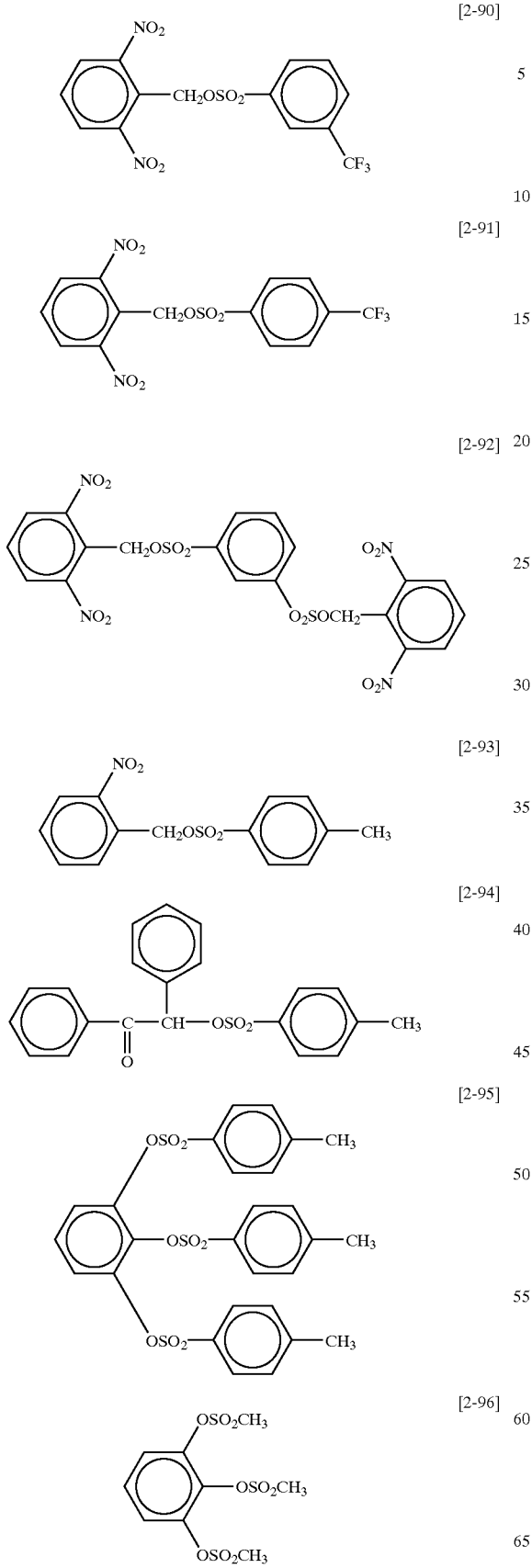
[2-90]
[2-91]
[2-92]
[2-93]
[2-94]
[2-95]
[2-96]
-continued
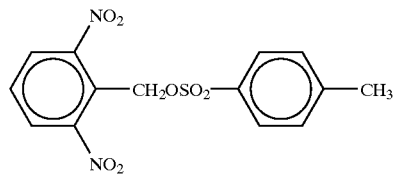
[2-97]
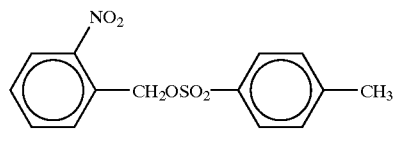
[2-98]
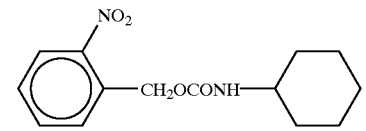
[2-99]
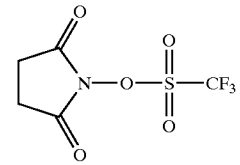
[2-100]
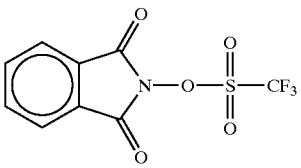
[2-101]
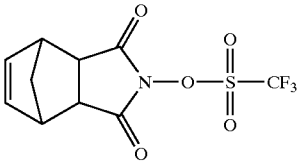
[2-102]
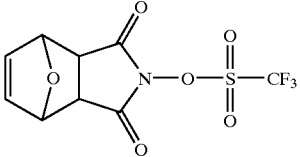
[2-103]
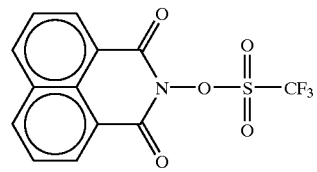
[2-104]
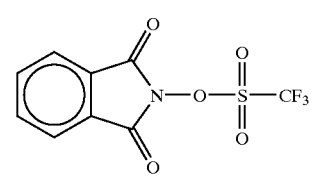
[2-105]

-continued

[2-106]

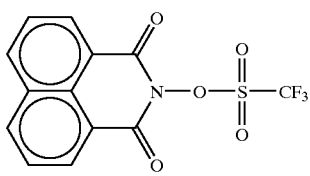

The crosslinking material is exemplified by an organic silicon compound having a multiple bond and an acrylic unsaturated compound. The solvent may be a polar organic solvent or a non-polar organic solvent. Specifically, the solvent is exemplified by ethyl lactate (EL), ethyl-3-ethoxy propionate (EEP), propylene glycol monomethylether acetate (PGMEA), propylene glycol monomethylether (PGME), ketone such as cyclohexane, 2-heptane, 3-heptane, acetylacetone or cyclopentanone, ester such as propylene glycol monoethyl ether acetate, ethylcellosolve acetate, methylcellosolve acetate, methyl-3-methoxypropionate, ethyl-3-methoxypropionate, methyl-3-ethoxypropionate, methyl pyruvate or ethyl pyruvate, ether such as diethylene glycol dimethylether or propyleneglycol dimethylether, glycol ester derivative such as methyl lactate or ethyl glycolate. Note that the solvent is not limited to the foregoing materials.

The coating material is prepared by the foregoing method. Then, the surface of the silicon insulating film is coated with the material of the solution by a spin coating method or the like. Then, the temperature is raised to vaporize the solvent so that the organic silicon film is formed. A glass transition temperature with which a satisfactory etching selective ratio with respect to the resist can be realized is required in the foregoing state. If the satisfactory etching selective ratio with respect to the resist cannot be realized, the coated film is furthermore heated or irradiated with energy beams to crosslink the coated film.

The energy beam is exemplified by ultraviolet rays, X-rays, electron beams and ion beams. When heating and irradiation with the energy beam are simultaneously performed, the crosslinking reaction is quickened. Thus, the glass transition temperature can be significantly raised in a practical range of process duration.

Note that heating or irradiation with the energy beam sometimes causes bondings between silicon and the silicon that constitutes the main chains in the organic silicon compound to be broken. Thus, bonding with oxygen causes oxidation to easily occur, resulting in reduction in the etching selective ratio between the resist and the organic silicon film. In the foregoing case, it is preferable that heating and irradiation with the energy beam are performed in an atmosphere in which the concentration of oxygen is lower than that in the air.

The present invention is not limited to the description about the embodiments. In the foregoing description, the structure has been formed such that the insulating film mainly constituted by the silicon oxide film and polysilane are stacked to change the polysilane to the silicon oxide film or the silicon nitride film. If similar methods are combined with each other, the insulating film constituted by the silicon nitride film and polysilane are stacked to change polysilane to the silicon oxide film or the silicon nitride film so as to be a portion of the insulating film constituted by the silicon nitride film. Alternatively, polysilane may be changed to the silicon oxide film so as to be removed from the insulating film constituted by the silicon nitride film.

In the first to sixth embodiments, the dry etching processing method is employed where the interlayer film having the dual-damascene structure is formed by using polysilane. The present invention is not limited to the interlayer film having the dual-damascene structure. As a matter of course, the foregoing method may be applied to a common multiple trench metallization. Moreover, a variety of modifications may be permitted within the scope of the present invention.

In the device manufacturing process, the organic silicon film of the polysilicon group and the insulating film are stacked with each other and oxygen, nitrogen, or hydrogen are introduced into the organic silicon film to be changed as a portion of the insulating film as stated above.

In this case, a thin interlayer film containing the constituent organic silicon sometimes remains at the interface between the organic silicon film and the insulating film.

Relating to the present invention, however, no problem occurs concerning the manufactured device operation caused by the existence of such a thin remaining interface film.

As described above, the manufacturing method of semiconductor devices by using dry etching technology according to the present invention has the structure that the organic silicon film constituted by polysilane and the like is used to form the insulating film of the semiconductor device or a portion of the same by dry etching. The portion constituted by the organic silicon film is changed to an oxide or a nitride so that the portion constituted by the organic silicon film is integrated with the insulating film of the semiconductor device or a portion of the same. If a similar method is employed, removal of the anti-reflective film which has been difficult for the conventional technology can easily be performed.

The surface region of the organic silicon film is selectively changed to an oxide or a nitride, and then dry etching is performed by using the oxide or the nitride. Then, the process is performed such that the organic silicon film is made to be a portion of the insulating film. A contact hole or the like having a higher aspect ratio as compared with that of the conventional resist mask can be formed.

When the dry etching method structured by combining the foregoing organic silicon films is applied, formation of the contact hole in the interlayer insulating film having the dual-damascene structure, the metallization trench and the dual-damascene structure metallization, which has been difficult, can be facilitated. Moreover, the etching mask incorporating the insulating film, having a high aspect ratio and required to form a deep trench in the silicon substrate can be formed.

Moreover, the present invention may widely be applied to the smoothing process of a device region and the device isolation region, formation of a SAC, and patterning of a precise gate electrode which are important factors in the manufacture of dense semiconductor integrated circuits at a satisfactorily high yield.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method of semiconductor devices, comprising:
   forming a contact hole in a first insulating film on a semiconductor substrate on which a first trench metallization has been formed;

coating an overall upper surface of said first insulating film with an organic silicon film such that said contract hole is buried;

removing a portion of said organic silicon film for forming a trench of a second trench metallization including an opening portion of said contact hole; and changing said organic silicon into a second insulating film constituted by any one of an organic silicon oxide film, an inorganic silicon oxide film, a silicon oxide film, a silicon nitride film and a silicon oxynitride film.

2. A manufacturing method of semiconductor devices according to claim 1, wherein said organic silicon film has bondings of silicon and silicon as main chains thereof.

3. A manufacturing method of semiconductor devices according to claim 1, wherein any one of oxygen, nitrogen, hydrogen and carbon elements is introduced into said organic silicon film following dry etching of said organic silicon film so that said organic silicon film is changed to any one of said organic silicon oxide film, said inorganic silicon oxide film, said silicon oxide film, said silicon nitride film and said silicon oxynitride film.

4. A manufacturing method of semiconductor devices according to claim 3, wherein said step of introducing any one of oxygen, nitrogen, hydrogen and carbon elements into said organic silicon film is performed by using any one of a reactive ion etching method, an ashing method and an ion implanting method using ions of said elements or a mixture of said elements.

5. A manufacturing method of semiconductor devices according to claim 3, wherein said step of introducing any one of oxygen, nitrogen, hydrogen and carbon elements into said organic silicon film is performed by performing a heat treatment in a gas atmosphere composed of said elements or a mixture of said elements.

6. A manufacturing method of semiconductor devices according to claim 3, wherein said step of introducing any one of oxygen, nitrogen, hydrogen and carbon elements into said organic silicon film is performed by using any one of a reactive ion etching method, an ashing method, an ion implanting method using ions of said elements or a mixture of said elements and a heat treatment method in a gas atmosphere composed of said elements or a mixture of said elements from exposed surfaces of said organic silicon film, so that said organic silicon film is changed to any one of said organic silicon oxide film, said inorganic silicon oxide film, said silicon oxide film, said silicon nitride film and said silicon oxynitride film.

7. A manufacturing method of semiconductor devices according to claim 6, wherein said step of introducing any one of oxygen, nitrogen, hydrogen and carbon elements into the organic silicon film is performed so that at least said exposed surface regions of said organic silicon film are changed to any one of said organic silicon oxide film, said inorganic silicon oxide film, said silicon oxide film, said silicon nitride film and said silicon oxynitride film.

8. A manufacturing method of semiconductor devices according to claim 1, wherein said step of removing said organic silicon film is performed such that said upper surface of said first insulating film on said first trench metallization controls said dry etching step of forming said trench for forming said second trench metallization.

9. A manufacturing method of semiconductor devices according to claim 1, wherein said organic silicon film has oxygen as a constituent element thereof.

10. A manufacturing method of semiconductor devices by using dry etching technology, comprising:

coating an overall upper surface of a first insulating film on a semiconductor substrate on which a first trench metallization has been formed with an organic silicon film;

a first selective dry etching step of forming a contact hole which reaches said upper surface of the first trench metallization;

changing said organic silicon film having said contact hole into a second insulating film constituted by any one of an organic silicon oxide film, an inorganic silicon oxide film, a silicon oxide film, a silicon nitride film and a silicon oxynitride film;

coating an overall upper surface of said second insulating film with said organic silicon film;

removing a portion of said organic silicon film for forming a trench of a second trench metallization including an opening portion of said contact hole and a portion of said organic silicon film in said contact hole by a second selective dry etching step of said organic silicon film; and changing said organic silicon film subjected to said removing step into a third insulating film constituted by any one of an organic silicon oxide film, an inorganic silicon oxide film, a silicon oxide film, a silicon nitride film and silicon oxynitride film.

11. A manufacturing method according to claim 10, wherein said first insulating film is constituted by any one of an organic silicon oxide film, an inorganic silicon oxide film, a silicon oxide film, a silicon nitride film and silicon oxynitride film changed from said organic silicon film.

12. A manufacturing method of semiconductor devices according to claim 10, wherein said first insulating film suppresses borderless etching occurring in a periphery of said first trench metallization in said first selective dry etching step, and said second insulating film controls said second selective dry etching step of forming step second trench.

13. A manufacturing method of semiconductor devices by using dry etching technology, comprising:

forming any one of a first organic silicon oxide film, an inorganic silicon oxide film, a silicon oxide film on a first insulating film on a semiconductor substrate on which a first trench metallization has been formed;

forming a stopper for dry etching constituted by an organic silicon film on any one of said first organic silicon oxide film, said inorganic silicon oxide film and said silicon oxide film, providing an opening portion to said stopper for forming a contact hole which reaches an upper surface of said first trench metallization;

forming any one of a second organic silicon oxide film, an inorganic silicon oxide film and a silicon oxide film such that said stopper having said opening portion is buried;

forming an etching mask for forming a second trench of said second trench metallization to correspond to said opening portion; and continuously and selectively dry etching any one of said first and second organic silicon oxide film, said inorganic silicon oxide film and said silicon oxide film by using said etching mask and said stopper having said opening portion.

14. A manufacturing method of semiconductor devices according to claim 13, wherein a step is included in which said stopper for dry etching constituted by said organic silicon film is changed into an organic silicon oxide film so as to be integrated as a portion of any one of said first and second organic silicon oxide film, said inorganic silicon oxide film and said silicon oxide film.

15. A manufacturing method of semiconductor devices by using dry etching technology, comprising:

forming a first insulating film on a semiconductor substrate;

forming a trench by selectively dry etching said first insulating film;

forming a trench metallization having a surface protection film and being embedded in said trench;

smoothing a surface of said first insulating film by using said surface protection film as a stopper;

coating on overall upper surface of said first insulating film subjected to forming said trench metallization with an organic silicon film;

forming a contact hole which reaches said upper surface of said trench metallization by selectively dry etching said organic silicon film and an upper portion of said protection film;

changing said organic silicon film into a second insulating film constituted by any one of an organic silicon oxide film, an inorganic silicon oxide film, a silicon oxide film, a silicon nitride film and a silicon oxynitride film.

16. A manufacturing method of semiconductor devices according to claim 15, wherein material for said trench metallization is any of aluminum copper alloy and copper, material for said protection film is silicon nitride and material for said first insulating film is silicon oxide.

17. A manufacturing method of semiconductor devices according to claim 15, wherein conditions for said dry etching are selected so as to realize etching selective ratio of said organic silicon film with respect to said first insulating film as high as 100, thereby to suppress borderless etching.

18. A manufacturing method of semiconductor devices according to claim 15, wherein selective dry etching of said organic silicon film for forming said contact hole comprises:

forming a reversed pattern of said contact hole on said organic silicon film by using a resist film;

changing an upper surface of said organic silicon film in an outer portion of said reversed pattern to said silicon oxide film by performing $O_2$ reactive ion etching or $O_2$ ion implantation; and dry etching said organic silicon film by using said silicon oxide film as a mask so as to open said contact hole.

19. A manufacturing method of semiconductor device by using dry etching technology, comprising:

forming a gate insulating film on a semiconductor substrate;

forming at least one metallic film on said gate insulating film and forming a pattern of a gate electrode constituted by a metallic film in a region of said semiconductor substrate which is covered with said metallic film and in which said gate electrode will be formed;

covering said gate electrode with a silicon nitride film;

covering a surface of said silicon nitride film with a first silicon oxide film;

etching back said first silicon oxide film by using anisotropic dry etching to expose an upper surface of said silicon nitride film so that a gate sidewall is formed;

coating an overall upper surface of said semiconductor substrate with an organic silicon film such that said gate electrode having said gate sidewall is buried;

forming a contact hole which reaches said silicon nitride film by selectively removing said organic silicon film which covers a region adjacent to said gate electrode having said gate sidewall in which a source of a drain will be formed by performing dry etching using a resist film as a mask, removing said resist film by performing $O_2$ ashing and simultaneously changing said organic silicon film into a second silicon oxide film;

removing said silicon nitride film exposed to a bottom surface of said contact hole by performing dry etching such that said sidewall as a mask; and in a self-aligned manner, exposing said surface of a region which has been formed on said semiconductor substrate and in which said source or said drain will be formed and using said contact hole for connecting metallizations by further removing said gate insulating film exposed owing to removal of said silicon nitride film.

20. A manufacturing method according to claim 15, wherein said first insulating film is constituted by any one of an organic silicon oxide film, an inorganic silicon oxide film, a silicon oxide film, a silicon nitride film and silicon oxynitride film changed from an organic silicon film.

21. A manufacturing method according to claim 20, wherein at least a part of said organic silicon film is changed to any one of an organic silicon oxide film, an inorganic silicon oxide film, a silicon oxide film, a silicon nitride film and silicon oxynitride film changed from said organic silicon film.

* * * * *